(12) United States Patent
Nagamine et al.

(10) Patent No.: US 11,067,888 B2
(45) Date of Patent: Jul. 20, 2021

(54) RESIST COMPOSITION AND METHOD OF FORMING RESIST PATTERN

(71) Applicant: TOKYO OHKA KOGYO CO., LTD., Kawasaki (JP)

(72) Inventors: Takashi Nagamine, Kawasaki (JP); Emi Uchida, Kawasaki (JP); Tsuyoshi Nakamura, Incheon (KR)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 117 days.

(21) Appl. No.: 16/225,332

(22) Filed: Dec. 19, 2018

(65) Prior Publication Data

US 2019/0196329 A1 Jun. 27, 2019

(30) Foreign Application Priority Data

Dec. 26, 2017 (JP) .............................. JP2017-250060

(51) Int. Cl.
| | | |
|---|---|---|
| *G03F 7/004* | (2006.01) | |
| *G03F 7/039* | (2006.01) | |
| *G03F 7/30* | (2006.01) | |
| *G03F 7/38* | (2006.01) | |
| *C08L 33/14* | (2006.01) | |
| *C09D 133/06* | (2006.01) | |
| *G03F 7/20* | (2006.01) | |

(52) U.S. Cl.
CPC ............ *G03F 7/0045* (2013.01); *C08L 33/14* (2013.01); *C09D 133/06* (2013.01); *G03F 7/0046* (2013.01); *G03F 7/039* (2013.01); *G03F 7/0397* (2013.01); *G03F 7/30* (2013.01); *G03F 7/2041* (2013.01); *G03F 7/38* (2013.01)

(58) Field of Classification Search
CPC .... G03F 7/0045; G03F 7/0397; G03F 7/2041; G03F 7/38; G03F 7/40
See application file for complete search history.

(56) References Cited

U.S. PATENT DOCUMENTS

| | | | |
|---|---|---|---|
| 2004/0110085 A1 | 6/2004 | Iwai et al. | |
| 2008/0187860 A1 | 8/2008 | Tsubaki et al. | |
| 2009/0186297 A1 | 7/2009 | Ohsawa et al. | |
| 2011/0250537 A1* | 10/2011 | Aqad | G03F 7/0045 430/270.1 |
| 2013/0209941 A1* | 8/2013 | Motoike | G03F 7/0045 430/324 |
| 2016/0187782 A1* | 6/2016 | Hustad | G03F 7/0392 438/703 |

FOREIGN PATENT DOCUMENTS

| | | |
|---|---|---|
| JP | 2003-241385 A | 8/2003 |
| JP | 2005-037888 A | 2/2005 |
| JP | 2008-292975 A | 12/2008 |
| JP | 2009-169228 A | 7/2009 |

* cited by examiner

*Primary Examiner* — John S Chu
(74) *Attorney, Agent, or Firm* — Knobbe Martens Olson & Bear LLP

(57) ABSTRACT

A resist composition containing a polymer compound which has a constitutional unit (a0) represented by Formula (a0-1); and an acid generator which is formed of a compound represented by Formula (b1) (in the formulae, $Ra^{00}$ represents an acid dissociable group represented by Formula (a0-r1-1); $Ra^{01}$, $Ra^{02}$, $Ra^{031}$, $Ra^{032}$, and $Ra^{033}$ represent a hydrocarbon group; $Ya^{0}$ represents a quaternary carbon atom; $R^{b1}$ represents a hydrocarbon group which has a steroid skeleton containing at least one hydroxyl group; $Y^{b1}$ represents a divalent linking group having a single bond or a hetero atom; $V^{b1}$ represents a single bond, an alkylene group, or a fluorinated alkylene group; and $R^{f1}$ represents a hydrogen atom, a fluorine atom, or a fluorinated alkyl group).

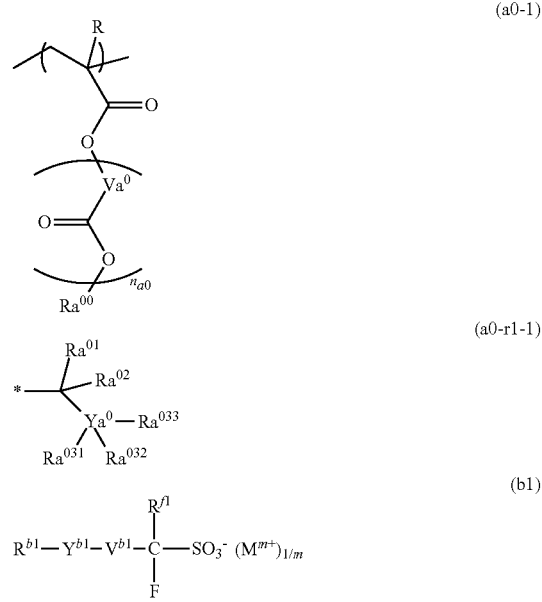

4 Claims, No Drawings

RESIST COMPOSITION AND METHOD OF FORMING RESIST PATTERN

Priority is claimed on Japanese Patent Application No. 2017-250060, filed on Dec. 26, 2017, the content of which is incorporated herein by reference.

BACKGROUND OF THE INVENTION

Field of the Invention

The present invention relates to a resist composition and a method of forming a resist pattern.

Description of Related Art

In lithography techniques, for example, a resist film formed of a resist material is formed on a substrate, and the resist film is subjected to selective exposure, followed by a development treatment, thereby forming a resist pattern having a predetermined shape on the resist film. A resist material in which the exposed portions of the resist film become soluble in a developing solution is called a positive type, and a resist material in which the exposed portions thereof become insoluble in a developing solution is called a negative type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source.

Conventionally, ultraviolet radiation typified by g-line and i-line radiation has been used, but nowadays KrF excimer lasers and ArF excimer lasers are used in mass production. Furthermore, research is also being conducted into lithography techniques that use an exposure light source having a shorter wavelength (higher energy) than these excimer lasers, such as electron beams (EB), extreme ultraviolet radiation (EUV), and X rays.

Resist materials for use with these types of exposure light sources require lithography characteristics such as a high resolution capable of reproducing patterns of minute dimensions, and a high level of sensitivity to these types of exposure light sources.

As a resist material that satisfies these requirements, in the related art, a chemically amplified composition which contains an acid generator component that generates an acid upon exposure and a base material component whose solubility in a developing solution is changed due to an action of an acid has been used.

As the base material component to be used in the chemically amplified resist composition, a resin (base resin) has been usually used.

For example, as a chemically amplified resist composition for forming a positive type resist pattern in an alkali developing process using an alkali developing solution as a developing solution, a composition which contains an acid generator component and a resin component whose solubility in an alkali developing solution is increased due to an action of an acid has been typically used. In a case where a resist film formed using such a resist composition is selectively exposed at the time of forming a resist pattern, in exposed portions, an acid is generated from the acid generator component so that the solubility in an alkali developing solution of the resin component is increased due to the action of the acid, and thus the exposed portions become soluble in the alkali developing solution. Accordingly, by conducting alkali development, a positive type pattern in which the unexposed portions remain as a pattern is formed.

A resin component whose polarity is increased due to the action of an acid has been typically used as the resin component. As the resin whose polarity is increased due to the action of an acid, for example, a resin that has a constitutional unit containing an acid decomposable group (hereinafter, also referred to as a protective group) whose polarity is increased due to the action of an acid has been used.

In a case where the polarity is increased, the solubility in an organic solvent is decreased while the solubility in an alkali developing solution is increased. Accordingly, in a case where a solvent developing process performed using a developing solution (organic developing solution) that contains an organic solvent is applied without performing an alkali developing process, since the solubility in an organic developing solution is relatively decreased in the exposed portions, the unexposed portions of the resist film are dissolved in an organic developing solution and removed during the solvent developing process, and a negative type resist pattern in which exposed portions remain as a pattern is formed. Such a solvent developing process for forming a negative type resist pattern is also referred to as "negative type developing process" (for example, see Japanese Unexamined Patent Application, First Publication No. 2008-292675).

Recently, as the base resin of the chemically amplified resist composition to be used in ArF excimer laser lithography or the like, a resin (acrylic resin) that has a constitutional unit derived from a (meth)acrylic acid ester in the main chain has been typically used due to the excellent transparency in the vicinity of 193 nm (for example, see Japanese Unexamined Patent Application, First Publication No. 2003-241385 and Japanese Unexamined Patent Application, First Publication No. 2009-169228).

Here, "(meth)acrylic acid ester" indicates one or both of an acrylic acid ester in which a hydrogen atom is bonded to the α-position and a methacrylic acid ester in which a methyl group is bonded to the α-position. "(Meth)acrylate" indicates one or both of acrylate in which a hydrogen atom is bonded to the α-position and methacrylate in which a methyl group is bonded to the α-position. "(Meth)acrylic acid" indicates one or both of acrylic acid in which a hydrogen atom is bonded to the α-position and methacrylic acid in which a methyl group is bonded to the α-position.

As the acid generator to be used in the chemically amplified resist composition, various acid generators have been suggested so far. For example, an onium salt-based acid generator, an oxime sulfonate-based acid generator, a diazomethane-based acid generator, a nitrobenzyl sulfonate-based acid generator, an iminosulfonate-based acid generator, and a disulfone-based acid generator are known.

Among these, as the onium salt-based acid generator, in the related art, an iodonium salt having an iodonium ion as a cation and a sulfonium salt having a sulfonium ion as a cation have been used. As anions that form these cations and salts, fluorinated alkyl sulfonic acid ions are typically used (for example, see Japanese Unexamined Patent Application, First Publication No. 2005-037888).

SUMMARY OF THE INVENTION

In the future, with the expectation of further progress in lithography technology and expansion of the application fields, and the like, there is a demand for new materials which can be used for lithography.

However, with the progress of miniaturization of patterns, there is room for improvement of lithography characteristics such as the sensitivity and CDU in the resist composition of the related art.

The present invention has been made in consideration of the above-described circumstances, and an object thereof is to provide a resist composition with excellent lithography characteristics and a method of forming a resist pattern.

According to a first aspect of the present invention, there is provided a resist composition which generates an acid upon exposure and whose solubility in a developing solution is changed due to an action of the acid, the resist composition including: a base material component (A) whose solubility in a developing solution is changed due to the action of an acid; and an acid generator component (B) which generates an acid upon exposure, in which the base material component (A) contains a polymer compound (A1) having a constitutional unit (a0) represented by Formula (a0-1), and the acid generator component (B) contains a compound (B1) represented by Formula (b1).

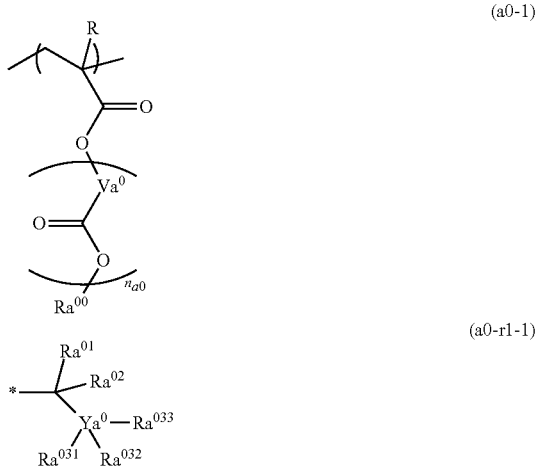

[In the formulae, R represents a hydrogen atom, an alkyl group having 1 to 5 carbon atoms, or a halogenated alkyl group having 1 to 5 carbon atoms, $Va^0$ represents a divalent hydrocarbon group which may have a substituent, $na^0$ represents an integer of 0 to 2, $Ra^{00}$ represents an acid dissociable group represented by Formula (a0-r1-1), $Ra^{01}$ and $Ra^{02}$ each independently represent a hydrocarbon group which may have a substituent, $Ra^{01}$ and $Ra^{02}$ may be bonded to each other to form a ring structure, $Ya^0$ represents a quaternary carbon atom, $Ra^{031}$, $Ra^{032}$, and $Ra^{033}$ each independently represent a hydrocarbon group which may have a substituent, and two or more of $Ra^{031}$, $Ra^{032}$, and $Ra^{033}$ may be bonded to one another to form a ring structure.]

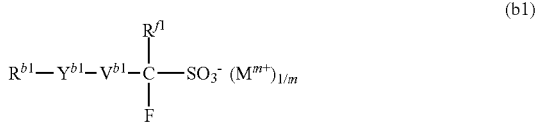

[In the formula, $R^{f1}$ represents a monovalent hydrocarbon group which has a steroid skeleton and 17 to 50 carbon atoms, where the steroid skeleton contains at least one hydroxyl group and may have a substituent other than the hydroxyl group, $Y^{b1}$ represents a divalent linking group having a hetero atom or a single bond, $V^{b1}$ represents an alkylene group, a fluorinated alkylene group, or a single bond, $R^{f1}$ represents a hydrogen atom, a fluorine atom, or a fluorinated alkyl group having 1 to 5 carbon atoms, m represents an integer of 1 or greater, and $M^{m+}$ represents an m-valent organic cation.]

According to a second aspect of the present invention, there is provided a method of forming a resist pattern, including: a step of forming a resist film on a support using the resist composition according to the first aspect; a step of exposing the resist film; and a step of developing the exposed resist film to form a resist pattern.

According to the present invention, it is possible to provide a resist composition with excellent lithography characteristics; and a method of forming a resist pattern.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes a linear, branched or cyclic, monovalent saturated hydrocarbon, unless otherwise specified. The same applies for the alkyl group in an alkoxy group.

The term "alkylene group" includes a linear, branched or cyclic, divalent saturated hydrocarbon, unless otherwise specified.

A "halogenated alkyl group" is a group in which some or all hydrogen atoms of an alkyl group are substituted with halogen atoms. Examples of the halogen atom include a fluorine atom, a chlorine atom, a bromine atom and an iodine atom.

A "fluorinated alkyl group" or a "fluorinated alkylene group" is a group in which some or all hydrogen atoms of an alkyl group or an alkylene group have been substituted with fluorine atoms.

The term "constitutional unit" indicates a monomer unit that contributes to the formation of a polymeric compound (a resin, a polymer, or a copolymer).

The expression "may have a substituent" refers to a case where a hydrogen atom (—H) is substituted with a monovalent group, or a case where a methylene (—CH$_2$—) group is substituted with a divalent group.

The term "exposure" is used as a general concept that includes irradiation with any form of radiation.

"Constitutional unit derived from an acrylic acid ester" indicates a constitutional unit that is formed by the cleavage of the ethylenic double bond of an acrylic acid ester.

"Acrylic acid ester" indicates a compound in which the terminal hydrogen atom of the carboxy group of acrylic acid (CH$_2$=CH—COOH) has been substituted with an organic group.

The acrylic acid ester may have the hydrogen atom bonded to the carbon atom at the α-position substituted with a substituent. The substituent ($R^{\alpha 0}$) that substitutes the hydrogen atom bonded to the carbon atom at the α-position is an atom other than hydrogen or a group, and examples thereof include an alkyl group having 1 to 5 carbon atoms and a halogenated alkyl group having 1 to 5 carbon atoms.

Further, the acrylic acid ester having the hydrogen atom bonded to the carbon atom at the α-position substituted with a substituent ($R^{\alpha 0}$) in which the substituent has been substituted with a substituent containing an ester bond (itaconic acid diester), or acrylic acid having the hydrogen atom bonded to the carbon atom at the α-position substituted with a substituent ($R^{\alpha 0}$) in which the substituent has been substituted with a hydroxyalkyl group or a group in which the hydroxyl group in a hydroxyalkyl group has been modified (α-hydroxyalkyl acrylic acid ester) can be exemplified as the acrylic acid ester having the hydrogen atom bonded to the carbon atom at the α-position substituted with a substituent. A carbon atom at the α-position of the acrylic acid ester indicates the carbon atom bonded to the carbonyl group, unless specified otherwise.

Hereinafter, an acrylic acid ester in which the hydrogen atom bonded to the carbon atom at the α-position is substituted with a substituent is also referred to as an "α-substituted acrylic acid ester". Further, an acrylic acid ester and an α-substituted acrylic acid ester are also collectively referred to as an "(α-substituted) acrylic acid ester".

"Constitutional unit derived from acrylamide" indicates a constitutional unit that is formed by the cleavage of the ethylenic double bond of acrylamide. The acrylamide may have the hydrogen atom bonded to the carbon atom at the α-position substituted with a substituent, and may have either or both terminal hydrogen atoms on the amino group of acrylamide substituted with a substituent. A carbon atom at the α-position of an acrylamide indicates the carbon atom bonded to the carbonyl group, unless specified otherwise.

As the substituent which substitutes the hydrogen atom bonded to the carbon atom at the α-position of acrylamide, the same substituents as those described above for the substituent ($R^{\alpha 0}$) at the α-position of the above-described α-position of the above-described α-substituted acrylic acid ester can be exemplified. "Constitutional unit derived from hydroxystyrene or a hydroxystyrene derivative" indicates a constitutional unit that is formed by the cleavage of an ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof.

Examples of the derivatives thereof include hydroxystyrene in which the hydrogen atom of the hydroxyl group has been substituted with an organic group and may have the hydrogen atom at the α-position substituted with a substituent; and hydroxystyrene which has a substituent other than a hydroxyl group bonded to the benzene ring and may have the hydrogen atom at the α-position substituted with a substituent. Here, the α-position (carbon atom at the α-position) indicates the carbon atom having the benzene ring bonded thereto, unless specified otherwise.

As the substituent which substitutes the hydrogen atom at the α-position of hydroxystyrene, the same substituents as those described above for the substituent at the α-position of the above-described α-substituted acrylic acid ester can be exemplified.

"Constitutional unit derived from vinylbenzoic acid or a vinylbenzoic acid derivative" indicates a constitutional unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include vinylbenzoic acid in which the hydrogen atom of the carboxy group has been substituted with an organic group and may have the hydrogen atom at the α-position substituted with a substituent; and vinylbenzoic acid which has a substituent other than a hydroxyl group and a carboxy group bonded to the benzene ring and may have the hydrogen atom at the α-position substituted with a substituent. Here, the α-position (carbon atom at the α-position) indicates the carbon atom having the benzene ring bonded thereto, unless specified otherwise.

The term "styrene" is a concept including those obtained by substitution of styrene and a hydrogen atom at the α-position of styrene with other substituents such as an alkyl group and a halogenated alkyl group.

The term "styrene derivative" is a concept including those obtained by substitution of a hydrogen atom at the α-position of styrene with other substituents such as an alkyl group and a halogenated alkyl group; and derivatives thereof. Examples of derivatives thereof include those obtained by bonding a substituent to a benzene ring of styrene in which a hydrogen atom at the α-position may be substituted with a substituent. In addition, the α-position (a carbon atom at the α-position) indicates a carbon atom to which a benzene ring is bonded unless otherwise specified.

The term "constitutional unit derived from styrene" or "constitutional unit derived from a styrene derivative" indicates a constitutional unit formed by cleavage of an ethylenic double bond of styrene or a styrene derivative.

As the alkyl group serving as a substituent at the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group serving as the substituent at the α-position include groups in which some or all hydrogen atoms of the above-described "alkyl group serving as the substituent at the α-position" are substituted with halogen atoms. Examples of the halogen atom include a fluorine atom, a chlorine atom, a bromine atom and an iodine atom, and a fluorine atom is particularly preferable.

Specific examples of the hydroxyalkyl group serving as the substituent at the α-position include groups in which some or all hydrogen atoms of the above-described "alkyl group serving as the substituent at the α-position" are substituted with a hydroxyl group. The number of hydroxyl groups in the hydroxyalkyl group is preferably 1 to 5, and most preferably 1.

In the present specification and the scope of the present patent claims, asymmetric carbons may be present or enantiomers or diastereomers may be present depending on the structures of the chemical formulae. In this case, these isomers are represented by one formula. These isomers may be used alone or in the form of a mixture.

(Resist Composition)

The resist composition according to the first aspect of the present embodiment is a resist composition which generates an acid upon exposure and whose solubility in a developing solution is changed due to an action of the acid. The resist composition contains a base material component (A) (hereinafter, also referred to as a "component (A)") whose solubility in a developing solution is changed due to the action of an acid; and an acid generator component (B) (hereinafter, also referred to as a "component (B)") which generates an acid upon exposure. Further, the base material component (A) contains a polymer compound (A1) having a constitutional unit (a0) represented by Formula (a0-1), and the acid generator component (B) contains a compound (B1) represented by Formula (b1).

In a case where a resist film is formed using the resist composition according to the present embodiment and the formed resist film is subjected to selective exposure, an acid is generated at exposed portions, and the generated acid acts on the component (A) to change the solubility of the component (A) in a developing solution, whereas the solubility of the component (A) in a developing solution is not changed at unexposed portions, thereby generating a difference in solubility in a developing solution between exposed portions and unexposed portions. Therefore, by subjecting the resist film to development, the exposed portions are dissolved and removed to form a positive type resist pattern in a case of a positive type resist, whereas the unexposed portions are dissolved and removed to form a negative type resist pattern in a case of a negative type resist.

In the present specification, a resist composition which forms a positive type resist pattern by dissolving and removing the exposed portions is called a positive type resist composition, and a resist composition which forms a negative type resist pattern by dissolving and removing the unexposed portions is called a negative type resist composition.

The resist composition of the present invention may be a positive type resist composition or a negative type resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment.

<Component (A)>

In the present invention, the term "base material component" indicates an organic compound capable of forming a film, and is preferably an organic compound having a molecular weight of 500 or greater. In a case where the organic compound has a molecular weight of 500 or greater, the film-forming ability is improved, and a photosensitive resin pattern at a nano level can be easily formed.

Organic compounds used as the base material component are broadly classified into non-polymers and polymers.

In general, as a non-polymer, any of those which have a molecular weight in the range of 500 to less than 4,000 is used. Hereinafter, "low molecular weight compound" indicates a non-polymer having a molecular weight in the range of 500 to less than 4,000.

As a polymer, any of those which have a molecular weight of 1,000 or greater is generally used. Hereinafter, "resin" indicates a polymer having a molecular weight of 1,000 or greater.

As the molecular weight of the polymer, the weight average molecular weight in terms of the polystyrene equivalent value determined by gel permeation chromatography (GPC) is used.

As the component (A), a resin or a low-molecular weight compound may be used or a combination of these may be used.

The component (A) may be a component whose solubility in a developing solution is increased due to the action of an acid or whose solubility in a developing solution is decreased due to the action of an acid.

Further, the component (A) in the present invention may generate an acid upon exposure.

«Component (A1)»

In the present invention, the component (A) contains a polymer compound (A1) (hereinafter, also referred to as a "component (A1)") having a constitutional unit (a0) represented by Formula (a0-1).

The component (A1) may have at least one constitutional unit selected from the group consisting of constitutional units (a1), (a2), (a3), and (a4) described below in addition to the constitutional unit (a0).

[Constitutional Unit (a0)]

The constitutional unit (a0) is represented by Formula (a0-1).

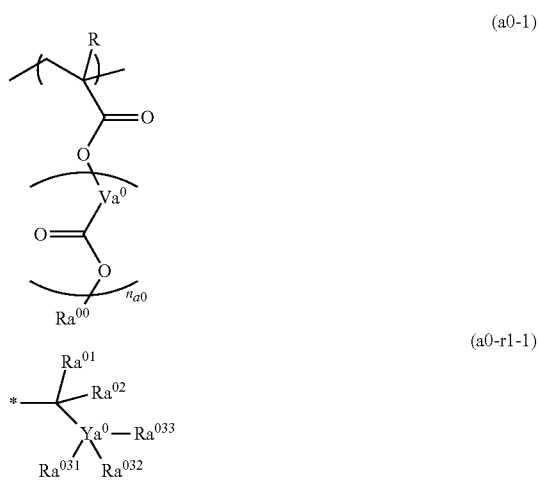

[In the formulae, R represents a hydrogen atom, an alkyl group having 1 to 5 carbon atoms, or a halogenated alkyl group having 1 to 5 carbon atoms. $Va^0$ represents a divalent hydrocarbon group which may have a substituent. $n_{a0}$ represents an integer of 0 to 2. $Ra^{00}$ represents an acid dissociable group represented by Formula (a0-r1-1). $Ra^{01}$ and $Ra^{02}$ each independently represent a hydrocarbon group which may have a substituent. $Ra^{01}$ and $Ra^{02}$ may be bonded to each other to form a ring structure. $Ya^0$ represents a quaternary carbon atom. $Ra^{031}$, $Ra^{032}$, and $Ra^{033}$ each independently represent a hydrocarbon group which may have a substituent. Two or more of $Ra^{031}$, $Ra^{032}$, and $Ra^{033}$ may be bonded to one another to form a ring structure.]

In Formula (a0-1), as R, the alkyl group having 1 to 5 carbon atoms, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all hydrogen atoms of the above-described alkyl group having 1 to 5 carbon atoms have been substituted with halogen atoms. Examples of the halogen atom include a fluorine atom, a chlorine atom, a bromine atom, and an iodine atom, and a fluorine atom is particularly preferable.

As R, a hydrogen atom, an alkyl group having 1 to 5 carbon atoms, or a fluorinated alkyl group having 1 to 5 carbon atoms is preferable, and a hydrogen atom or a methyl group is most preferable in terms of industrial availability.

In Formula (a0-1), $Va^0$ represents a divalent hydrocarbon group which may have a substituent.

The hydrocarbon group of Va⁰ may be an aliphatic hydrocarbon group or an aromatic hydrocarbon group. The aliphatic hydrocarbon group indicates a hydrocarbon group that does not have aromaticity. The aliphatic hydrocarbon group serving as a divalent hydrocarbon group represented by Va⁰ may be saturated or unsaturated. In general, it is preferable that the aliphatic hydrocarbon group be saturated.

More specific examples of the aliphatic hydrocarbon group of Va⁰ include a linear or branched aliphatic hydrocarbon group and an aliphatic hydrocarbon group having a ring in the structure.

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms. As the linear aliphatic hydrocarbon group, a linear alkylene group is preferable. Specific examples thereof include a methylene group [—CH₂—], an ethylene group [—(CH₂)₂—], a trimethylene group [—(CH₂)₃—], a tetramethylene group [—(CH₂)₄—] and a pentamethylene group [—(CH₂)₅—].

The branched aliphatic hydrocarbon group preferably has 2 to 10 carbon atoms, more preferably 3 to 6 carbon atoms, still more preferably 2 to 4 carbon atoms, and most preferably 2 or 3 carbon atoms.

As the branched aliphatic hydrocarbon group, a branched alkylene group is preferred, and specific examples include alkylalkylene groups, for example, alkylmethylene groups such as —CH(CH₃)—, —CH(CH₂CH₃)—, —C(CH₃)₂—, —C(CH₃)(CH₂CH₃)—, —C(CH₃)(CH₂CH₂CH₃)—, and —C(CH₂CH₃)₂—; alkylethylene groups such as —CH(CH₃)CH₂—, —CH(CH₃)CH(CH₃)—, —C(CH₃)₂CH₂—, —CH(CH₂CH₃)CH₂—, and —C(CH₂CH₃)₂—CH₂—; alkyltrimethylene groups such as —CH(CH₃)CH₂CH₂— and —CH₂CH(CH₃)CH₂—; and alkyltetramethylene groups such as —CH(CH₃)CH₂CH₂CH₂— and —CH₂CH (CH₃)CH₂CH₂—. As the alkyl group in the alkylalkylene group, a linear alkyl group having 1 to 5 carbon atoms is preferable.

Examples of the aliphatic hydrocarbon group containing a ring in the structure thereof include an alicyclic hydrocarbon group (a group in which two hydrogen atoms have been removed from an aliphatic hydrocarbon ring), a group in which the alicyclic hydrocarbon group is bonded to the terminal of the above-described linear or branched aliphatic hydrocarbon group, and a group in which the alicyclic hydrocarbon group is interposed in the above-described linear or branched aliphatic hydrocarbon group. The linear or branched aliphatic hydrocarbon group is the same as defined for the above-described linear aliphatic hydrocarbon group or the above-described branched aliphatic hydrocarbon group.

The alicyclic hydrocarbon group preferably has 3 to 20 carbon atoms and more preferably 3 to 12 carbon atoms.

The alicyclic hydrocarbon group may be a monocyclic group or a polycyclic group. As the monocyclic alicyclic hydrocarbon group, a group in which two hydrogen atoms have been removed from a monocycloalkane is preferable. The monocycloalkane preferably has 3 to 6 carbon atoms, and specific examples thereof include cyclopentane and cyclohexane.

As the polycyclic alicyclic hydrocarbon group, a group in which two hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The aromatic hydrocarbon group of Va⁰ is a hydrocarbon group having at least one aromatic ring. The aromatic ring is not particularly limited as long as it is a cyclic conjugated system having (4n+2)π electrons, and may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the above-described aromatic hydrocarbon ring or aromatic hetero ring (an aryl group or a heteroaryl group); a group in which two hydrogen atom has been removed from an aromatic compound having two or more aromatic rings (biphenyl, fluorene or the like); and a group in which one hydrogen atom of a group (an aryl group or a heteroaryl group) obtained by removing one hydrogen atom from of the above-described aromatic hydrocarbon ring or aromatic hetero ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aryl group or heteroaryl group preferably has 1 to 4 carbon atoms, more preferably 1 or 2 carbon atoms, and particularly preferably 1 carbon atom.

Among these, as the hydrocarbon group represented by Va⁰, an aliphatic hydrocarbon group is preferable, a linear or branched aliphatic hydrocarbon group is more preferable, a linear aliphatic hydrocarbon group is still more preferable, and a linear alkylene group is particularly preferable.

Va⁰ may have a substituent. As an example for a case where a methylene group (—CH₂—) in the hydrocarbon group of Va⁰ has been substituted with a divalent group, those having an ether bond (—O—) between carbon atoms of the divalent hydrocarbon group of Va⁰ are exemplified. In this case, one or two or more ether bonds may be preset in Va⁰. Further, as an example for a case where a hydrogen atom (—H) in the hydrocarbon group of Va⁰ has been substituted with a monovalent group, those in which a hydrogen atom (—H) in the hydrocarbon group of Va⁰ has been substituted with a fluorine atom or a fluorinated alkyl group having 1 to 5 carbon atoms are exemplified. As Va⁰ in this case, —CH₂CHF—, —CH(CH₂CH₃)CF₂—, —CH (CH₂CH₃)C(CF₃)F—, or —CH(CH₃)CF₂— is preferable.

In Formula (a0-1), na⁰ represents an integer of 0 to 2, preferably 0 or 1, and more preferably 0.

In Formula (a0-1), Ra⁰⁰ represents an acid dissociable group represented by Formula (a0-r1-1).

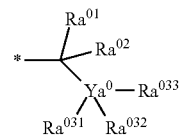

(a0-r1-1)

[In the formula, $Ra^{01}$ and $Ra^{02}$ each independently represent a hydrocarbon group which may have a substituent. $Ra^{01}$ and $Ra^{02}$ may be bonded to each other to form a ring structure. $Ya^0$ represents a quaternary carbon atom. $Ra^{031}$, $Ra^{032}$, and $Ra^{033}$ each independently represent a hydrocarbon group which may have a substituent. Two or more of $Ra^{031}$, $Ra^{032}$, and $Ra^{033}$ may be bonded to one another to form a ring structure.]

In Formula (a0-r1-1), $Ra^{01}$ and $Ra^{02}$ each independently represent a hydrocarbon group which may have a substituent.

The hydrocarbon group of $Ra^{01}$ and $Ra^{02}$ may be an aliphatic hydrocarbon group or an aromatic hydrocarbon group. The aliphatic hydrocarbon group of $Ra^{01}$ and $Ra^{02}$ indicates a hydrocarbon group that does not have aromaticity. The aliphatic hydrocarbon group serving as the hydrocarbon group of $Ra^{01}$ and $Ra^{02}$ may be saturated or unsaturated. In general, it is preferable that the aliphatic hydrocarbon group be saturated.

More specific examples of the aliphatic hydrocarbon group of $Ra^{01}$ and $Ra^{02}$ include a linear or branched alkyl group and a cyclic hydrocarbon group.

The linear alkyl group preferably has 1 to 5 carbon atoms, more preferably 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group preferably has 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra^{01}$ and $Ra^{02}$ represent a cyclic hydrocarbon group, the cyclic hydrocarbon group may be an aliphatic hydrocarbon group or an aromatic hydrocarbon group, and may be polycyclic or monocyclic. As the aliphatic hydrocarbon group which is a monocyclic group, a group formed by removing one hydrogen atom from a monocycloalkane is preferable. Examples of the monocycloalkane include cyclopropane, cyclobutane, cyclopentane, cyclohexane, cycloheptane, cyclooctane, cyclodecane, cyclopentene, cyclohexene, and cyclooctadiene.

A group formed by removing one hydrogen atom from a polycycloalkane is preferable as the aliphatic hydrocarbon group which is a polycyclic group and a group having 7 to 12 carbon atoms is preferable as the polycycloalkane. Specific examples thereof include adamantane, norbornane, isobornane, tricyclodecane, tetracyclododecane, bicycle [4.3.0]nonane, bornane, noradamantane, a 1,7,7-trimethyltricyclo[2.2.1.0$^{2,6}$]heptanyl group, and a 3,7,7-trimethylbicyclo[4.1.0]heptanyl group.

In a case where the cyclic hydrocarbon group of $Ra^{01}$ and $Ra^{02}$ becomes an aromatic hydrocarbon group, the aromatic hydrocarbon group is a hydrocarbon group having at least one aromatic ring.

The aromatic ring is not particularly limited as long as it is a cyclic conjugated system having $(4n+2)\pi$ electrons, and may be monocyclic or polycyclic. The aromatic ring preferably has 5 to 30 carbon atoms, more preferably 5 to 20 carbon atoms, still more preferably 6 to 15 carbon atoms, and most preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group of $Ra^{01}$ and $Ra^{02}$ include a group in which two hydrogen atoms have been removed from the above-described aromatic hydrocarbon ring or aromatic hetero ring (an arylene group or a heteroarylene group); a group in which two hydrogen atoms have been removed from an aromatic compound having two or more aromatic rings (biphenyl, fluorene or the like); and a group in which one hydrogen atom of the above-described aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aryl group or heteroaryl group preferably has 1 to 4 carbon atoms, more preferably 1 or 2 carbon atoms, and particularly preferably 1 carbon atom.

The cyclic hydrocarbon group of $Ra^{01}$ and $Ra^{02}$ may include a substituent. Examples of the substituent include $-R^{P1}$, $-R^{P2}-O-R^{P1}$, $-R^{P2}-CO-R^{P1}$, $-R^{P2}-CO-OR^{P1}$, $-R^{P2}-O-CO-R^{P1}$, $-R^{P2}-OH$, $-R^{P2}-CN$, and $-R^{P2}-COOH$ (hereinafter, these substituents are also collectively referred to as "$Ra^{05}$").

Here, $R^{P1}$ represents a chain-like monovalent saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, $R^{P2}$ represents a single bond, a chain-like divalent saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. Here, some or all hydrogen atoms in the chain-like saturated hydrocarbon group, the aliphatic cyclic saturated hydrocarbon group, and the aromatic hydrocarbon group of $R^{P1}$ and $R^{P2}$ may be substituted with fluorine atoms. The aliphatic cyclic hydrocarbon group may have one or more of one kind of substituent or one or more of each of plural kinds of substituents.

Examples of the chain-like monovalent saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicyclo[2.2.2]octanyl group, a tricyclo[5.2.1.02,6]decanyl group, a tricyclo[3.3.1.13,7]decanyl group, a tetracyclo [6.2.1.13,6.02,7]dodecanyl group, or an adamantyl group.

Examples of the monovalent aromatic hydrocarbon group having 6 to 30 carbon atoms include a group formed by removing one hydrogen atom from an aromatic hydrocarbon ring, such as benzene, biphenyl, fluorene, naphthalene, anthracene, or phenanthrene.

$Ra^{01}$ and $Ra^{02}$ may be bonded to each other to form a ring structure. Examples of the ring structure are the same as those exemplified as the cyclic hydrocarbon group of $Ra^{01}$ and $Ra^{02}$ in Formula (a0-r1-1). Among the examples, as the cyclic structure to be formed by $Ra^{01}$ and $Ra^{02}$ being bonded to each other, a cyclic aliphatic hydrocarbon group is preferable, and a group formed by removing one hydrogen atom from cyclopropane, cyclopentane, cyclohexane, cyclooctane, norbornane, adamantane, or noradamantane is more preferable.

In Formula (a0-r1-1), $Ya^0$ represents a quaternary carbon atom. $Ra^{031}$, $Ra^{032}$, and $Ra^{033}$ each independently represent a hydrocarbon group which may have a substituent.

Examples of the hydrocarbon group of $Ra^{031}$, $Ra^{032}$, and $Ra^{033}$ are the same as those exemplified as the hydrocarbon group represented by $Ra^{01}$ and $Ra^{02}$.

It is preferable that $Ra^{031}$, $Ra^{032}$, and $Ra^{033}$ represent a linear alkyl group. the number of carbon atoms of the linear alkyl group is preferably in a range of 1 to 5, more preferably in a range of 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

In Formula (a0-r1-1), two or more of $Ra^{031}$, $Ra^{032}$, and $Ra^{033}$ may be bonded to one another to form a ring structure. In this case, the quaternary carbon atom of $Ya^0$ forms a part of the ring skeleton of the ring structure.

Examples of the ring structure are the same as those exemplified as the cyclic hydrocarbon group of $Ra^{01}$ and $Ra^{02}$ in Formula (a0-r1-1).

As the acid dissociable group represented by Formula (a0-r1-1), a group represented by Formula (a0-r1-1-1) or (a0-r1-1-2) is preferable.

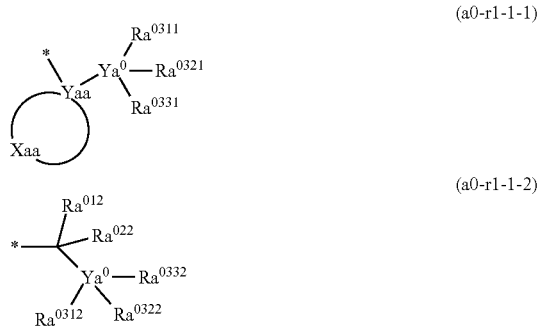

[In Formula (a0-r1-1-1), Yaa represents a carbon atom. Xaa represents a group that forms an aliphatic cyclic group together with Yaa. $Ya^0$ represents a quaternary carbon atom. $Ra^{0311}$, $Ra^{0321}$, and $Ra^{0331}$ each independently represent a chain-like alkyl group having 1 to 5 carbon atoms. In Formula (a0-r1-1-2), $Ra^{012}$ and $Ra^{022}$ each independently represent a chain-like alkyl group having 1 to 5 carbon atoms. $Ra^{0312}$, $Ra^{0322}$, and $Ra^{0332}$ each independently represent a hydrocarbon group which may have a substituent. Here, two or more of $Ra^{0312}$, $Ra^{0322}$, and $Ra^{0332}$ are bonded to each other to form a ring structure.]

In Formula (a0-r1-1), Yaa represents a carbon atom. Xaa represents a group that forms an aliphatic cyclic group together with Yaa. Examples of the aliphatic cyclic group that is formed by Xaa together with Yaa are the same as those exemplified as the cyclic aliphatic hydrocarbon group represented by $Ra^{01}$ and $Ra^{02}$ in Formula (a0-r1-1).

Among these, as the aliphatic cyclic group that is formed by Xaa together with Yaa, an aliphatic hydrocarbon group of a monocyclic group is more preferable, a group formed by removing one hydrogen atom from a monocycloalkane is still more preferable, and a group formed by removing one hydrogen atom from cyclopropane, cyclopentane, cyclohexane, or cyclooctane is particularly preferable.

In Formula (a0-r1-1), $Ya^0$ represents a quaternary carbon atom.

In Formula (a0-r1-1), $Ra^{0311}$, $Ra^{0321}$, and $Ra^{0331}$ each independently represent a chain-like alkyl group having 1 to 5 carbon atoms, and examples thereof include a methyl group, an ethyl group, an n-propyl group, an n-butyl group, and an n-pentyl group. Among these, $Ra^{0321}$ and $Ra^{0331}$ represent preferably a methyl group, an ethyl group, or an n-butyl group and more preferably a methyl group or an ethyl group.

In Formula (a0-r1-1-2), $Ra^{012}$, $Ra^{022}$ each independently represent a chain-like alkyl group having 1 to 5 carbon atoms, and examples thereof include a methyl group, an ethyl group, an n-propyl group, an n-butyl group, and an n-pentyl group. Among these, $Ra^{0321}$ and $Ra^{0331}$ preferably represent a methyl group, an ethyl group, or an n-butyl group and more preferably a methyl group or an ethyl group.

In Formula (a0-r1-1-2), $Ra^{0312}$, $Ra^{0322}$, and $Ra^{0332}$ each independently represent a hydrocarbon group which may have a substituent. Here, two or more of $Ra^{0312}$, $Ra^{0322}$, and $Ra^{0332}$ are bonded to one another to form a ring structure, and it is preferable that $Ra^{0312}$, $Ra^{0322}$, and $Ra^{0332}$ be bonded to one another to form a ring structure.

Examples of the ring structure to be formed by $Ra^{0312}$, $Ra^{0322}$, and $Ra^{0332}$ being bonded to one another are the same as those exemplified as the cyclic hydrocarbon group of $Ra^{01}$ and $Ra^{02}$ in Formula (a0-r1-1). Among the examples, as the ring structure to be formed by $Ra^{0312}$, $Ra^{0322}$, and $Ra^{0332}$ being bonded to one another, a cyclic aliphatic hydrocarbon group is preferable, a polycyclic aliphatic hydrocarbon group is more preferable, a group formed by removing one hydrogen atom from a polycycloalkane is still more preferable, and a group formed by removing one hydrogen atom from norbornane, adamantane, or noradamantane is particularly preferable.

Among the examples, as the acid dissociable group represented by Formula (a0-r1-1), a group represented by Formula (a0-r1-1-1) is preferable.

Specific examples of the constitutional unit (a0) are shown below. In each formula, $R\alpha$ represents a hydrogen atom, a methyl group, or a trifluoromethyl group.

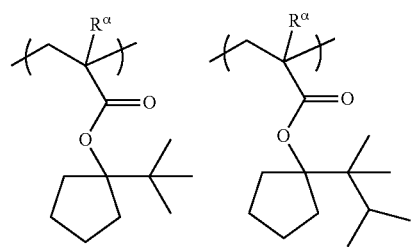

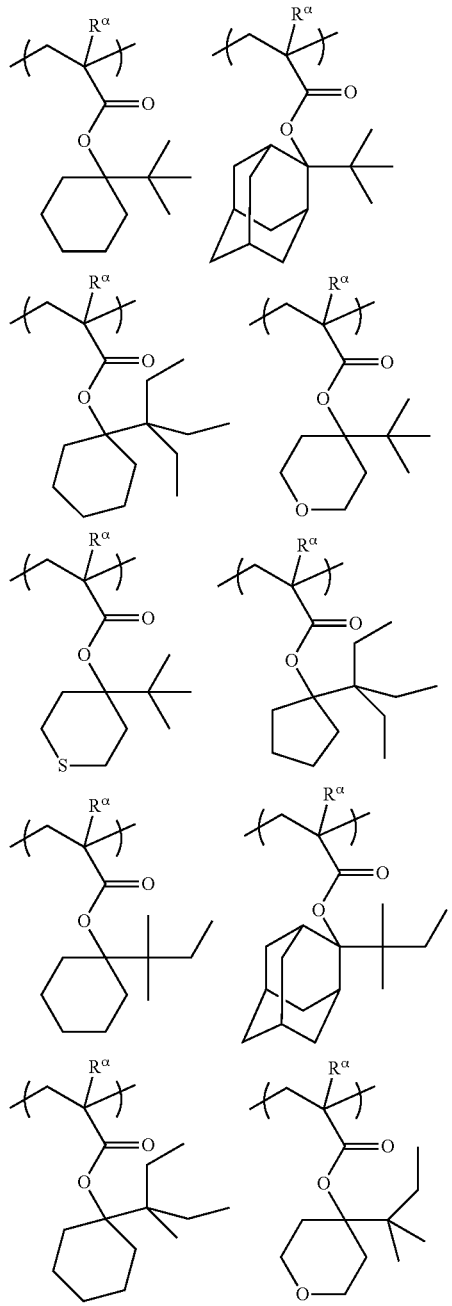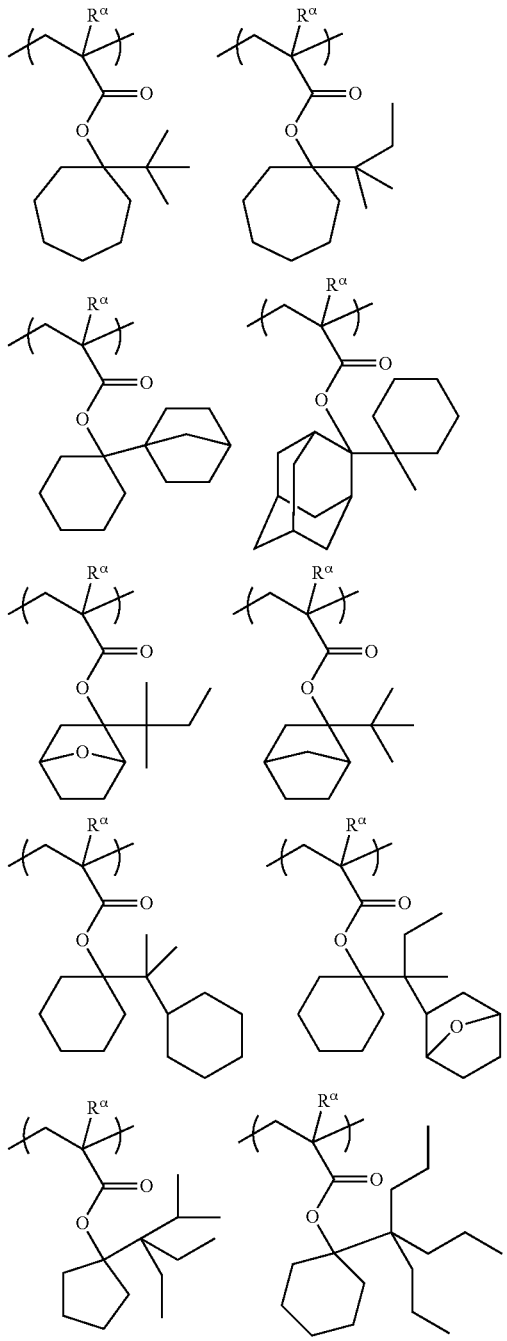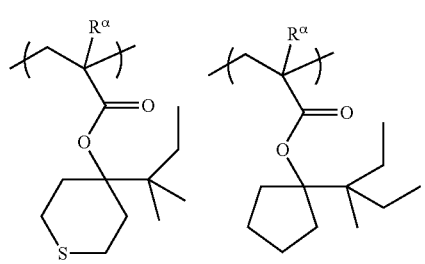

-continued

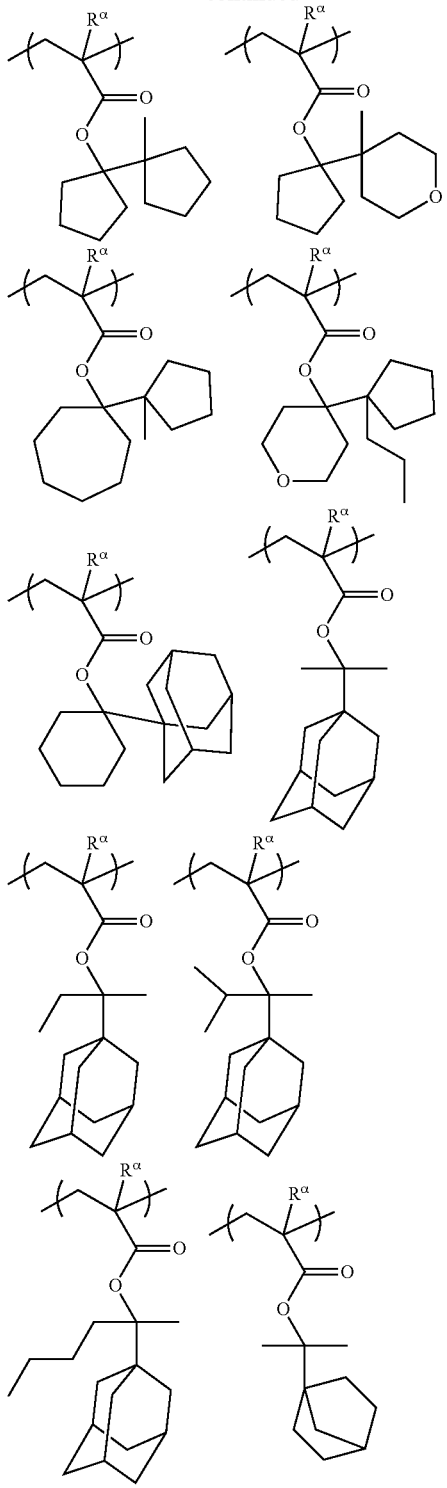

The constitutional unit (a0) in the component (A1) may be used alone or two or more kinds thereof may be used. It is preferable that the constitutional unit (a0) in the component (A1) contain one or more groups in which $Ra^{00}$ in Formula (a0-1) represents an acid dissociable group represented by Formula (a0-r1-1-1). The proportion of those containing the acid dissociable group represented by Formula (a0-r1-1-1) in the constitutional unit (a0) is preferably in a range of 40% to 100% by mole, more preferably in a range of 60% to 100% by mole, still more preferably in a range of 80% to 100% by mole, and particularly preferably in a range of 90% to 100% by mole with respect to the total amount (100% by mole) of the constitutional unit (a0) contained in the component (A1).

The proportion of the constitutional unit (a0) in the component (A1) is preferably in a range of 30% to 70% by mole, more preferably in a range of 40% to 60% by mole, and still more preferably in a range of 45% to 55% by mole with respect to the total amount (100% by mole) of all constitutional units constituting the component (A1).

By setting the proportion of the constitutional unit (a0) to be greater than or equal to the lower limit of the above-described preferable range, a resist pattern can be easily obtained, and lithography characteristics of enhancing the sensitivity, CDU, and the like are improved. Further, by setting the proportion of the constitutional unit (a0) to be lower than or equal to the upper limit of the above-described preferable range, the constitutional unit (a0) and other constitutional units can be balanced.

[Constitutional Unit (a1)]

The constitutional unit (a1) is a constitutional unit (here, a constitutional unit corresponding to the constitutional unit (a0) is excluded) containing an acid decomposable group whose polarity is increased due to the action of an acid.

The term "acid decomposable group" indicates a group in which at least a part of a bond in the structure of the acid decomposable group can be cleaved due to the action of an acid.

Examples of the acid decomposable group whose polarity is increased due to the action of an acid include groups which are decomposed due to the action of an acid to generate a polar group.

Examples of the polar group include a carboxy group, a hydroxyl group, an amino group, and a sulfo group ($—SO_3H$). Among these, a polar group containing —OH in the structure thereof (hereinafter, also referred to as an "OH-containing polar group") is preferable, a carboxy group or a hydroxyl group is more preferable, and a carboxy group is particularly preferable.

More specific examples of the acid decomposable group include a group in which the above-described polar group has been protected with an acid dissociable group (such as a group in which a hydrogen atom of the OH-containing polar group has been protected with an acid dissociable group).

Here, the "acid dissociable group" indicates both (i) a group in which a bond between the acid dissociable group and an atom adjacent to the acid dissociable group can be cleaved due to the action of an acid; and (ii) a group in which some bonds are cleaved due to the action of an acid, and then a decarboxylation reaction occurs, thereby cleaving the bond between the acid dissociable group and the atom adjacent to the acid dissociable group.

It is necessary for the acid dissociable group that constitutes the acid decomposable group to be a group which exhibits a lower polarity than the polar group generated by the dissociation of the acid dissociable group. Thus, in a case where the acid dissociable group is dissociated by the action of an acid, a polar group exhibiting a polarity higher than that of the acid dissociable group is generated, thereby increasing the polarity. As a result, the polarity of the entire component (A1) is increased. By the increase in the polarity, the relative solubility in a developing solution changes, and the solubility in an alkali developing solution is increased, whereas the relative solubility in an organic developing solution is decreased.

Examples of the acid dissociable group are the same as those which have been proposed as acid dissociable groups for the base resin for a chemically amplified resist composition.

Specific examples of acid dissociable groups of the base resin for a conventional chemically amplified resist composition include an "acetal type acid dissociable group", a "tertiary alkyl ester type acid dissociable group", and a "tertiary alkyloxycarbonyl acid dissociable group" described below.

Acetal Type Acid Dissociable Group:

Examples of the acid dissociable group for protecting a carboxy group or a hydroxyl group serving as a polar group include the acid dissociable group represented by Formula (a1-r-1) shown below (hereinafter, also referred to as "acetal type acid dissociable group").

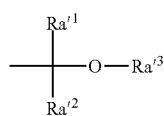
(a1-r-1)

[In the formula, $Ra'^1$ and $Ra'^2$ represent a hydrogen atom or an alkyl group, and $Ra'^3$ represents a hydrocarbon group, provided that $Ra'^3$ may be bonded to $Ra'^1$ or $Ra'^2$.]

In Formula (a1-r-1), it is preferable that at least one of $Ra'^1$ and $Ra'^2$ represent a hydrogen atom and more preferable that both of $Ra'^1$ and $Ra'^2$ represent a hydrogen atom.

In a case where $Ra'^1$ or $Ra'^2$ represents an alkyl group, examples of the alkyl group include the same alkyl groups exemplified as the substituent which may be bonded to the carbon atom at the α-position in the description of the α-substituted acrylic acid ester. Among these, an alkyl group having 1 to 5 carbon atoms is preferable. Specific examples thereof include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is particularly preferable.

In Formula (a1-r-1), examples of the hydrocarbon group of $Ra'^3$ include a linear or branched alkyl group and a cyclic hydrocarbon group.

The linear alkyl group preferably has 1 to 5 carbon atoms, more preferably 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group preferably has 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra'^3$ represents a cyclic hydrocarbon group, the cyclic hydrocarbon group may be an aliphatic hydrocarbon group or an aromatic hydrocarbon group, and may be polycyclic or monocyclic.

As the aliphatic hydrocarbon group which is a monocyclic group, a group in which one hydrogen atom has been removed from a monocycloalkane is preferable. The monocycloalkane preferably has 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable, and the polycyclic group preferably has 7 to 12 carbon atoms, and specific examples of the polycycloalkane include adamantane, norbornane, isobornane, tricyclodecane, and tetracyclododecane.

In a case where the cyclic hydrocarbon group of $Ra'^3$ becomes an aromatic hydrocarbon group, the aromatic hydrocarbon group is a hydrocarbon group having at least one aromatic ring.

The aromatic ring is not particularly limited as long as it is a cyclic conjugated system having $(4n+2)\pi$ electrons, and may be monocyclic or polycyclic. The aromatic ring preferably has 5 to 30 carbon atoms, more preferably 5 to 20 carbon atoms, still more preferably 6 to 15 carbon atoms, and most preferably 6 to 12 carbon atoms. Here, the number of carbon atoms in a substituent is not included in the number of carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group of $Ra'^3$ include a group in which one hydrogen atom has been removed from the above-described aromatic hydrocarbon ring or aromatic hetero ring (an aryl group or a heteroaryl group); a group in which one hydrogen atom has been removed from an aromatic compound having two or more aromatic rings (biphenyl, fluorene or the like); and a group in which one hydrogen atom of the above-described aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aromatic hydrocarbon ring or aromatic hetero ring preferably has 1 to 4 carbon atoms, more preferably 1 or 2 carbon atoms, and particularly preferably 1 carbon atom.

The cyclic hydrocarbon group of $Ra'^3$ may include a substituent. Examples of the substituent include $—R^{P1}$, $—R^{P2}—O—R^{P1}$, $—R^{P2}—CO—R^{P1}$, $—R^{P2}—CO—OR^{P1}$, $—R^{P2}—O—CO—R^{P1}$, $—R^{P2}—OH$, $—R^{P2}—CN$, and $—R^{P2}—COOH$ (hereinafter, these substituents are also collectively referred to as "$Ra^{05}$").

Here, $R^{P1}$ represents a chain-like monovalent saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, $R^{P2}$ represents a single bond, a chain-like divalent saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms.

Here, some or all hydrogen atoms in the chain-like saturated hydrocarbon group, the aliphatic cyclic saturated hydrocarbon group, and the aromatic hydrocarbon group of $R^{P1}$ and $R^{P2}$ may be substituted with fluorine atoms. The aliphatic cyclic hydrocarbon group may have one or more of one kind of substituent or one or more of each of plural kinds of substituents.

Examples of the chain-like monovalent saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicyclo[2.2.2]octanyl group, a tricyclo[5.2.1.02,6]decanyl group, a tricyclo[3.3.1.13,7]decanyl group, a tetracyclo [6.2.1.13,6.02,7]dodecanyl group, or an adamantyl group.

Examples of the monovalent aromatic hydrocarbon group having 6 to 30 carbon atoms include a group formed by removing one hydrogen atom from an aromatic hydrocarbon ring, such as benzene, biphenyl, fluorene, naphthalene, anthracene, or phenanthrene.

In a case where $Ra'^3$ is bonded to $Ra'^1$ or $Ra'^2$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary Alkyl Ester Type Acid Dissociable Group:

Examples of the acid dissociable group for protecting the carboxy group serving as a polar group include the acid dissociable group represented by Formula (a1-r-2) shown below. Among the acid dissociable groups represented by Formula (a1-r-2), for convenience, a group which is constituted of alkyl groups is referred to as "tertiary alkyl ester type acid dissociable group".

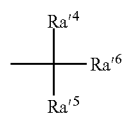

(a1-r-2)

[In the formula, $Ra'^4$ to $Ra'^6$ each independently represent a hydrocarbon group, provided that $Ra'^5$ and $Ra'^6$ may be mutually bonded to form a ring.]

Examples of the hydrocarbon group of $Ra'^4$ include a linear or branched alkyl group, a chain-like or cyclic alkenyl group, and a cyclic hydrocarbon group.

Examples of the linear or branched alkyl group and the cyclic hydrocarbon group (an aliphatic hydrocarbon group which is a monocyclic group, an aliphatic hydrocarbon group which is a polycyclic group, or an aromatic hydrocarbon group) of $Ra'^4$ are the same as those exemplified above as $Ra'^3$.

As the chain-like or cyclic alkenyl group of $Ra'^4$, an alkenyl group having 2 to 10 carbon atoms is preferable.

Examples of the hydrocarbon group of $Ra'^5$ or $Ra'^6$ are the same as those exemplified above as $Ra'^3$.

In a case where $Ra'^5$ and $Ra'^6$ are bonded to form a ring, suitable examples thereof include a group represented by Formula (a1-r2-1), a group represented by Formula (a1-r2-2), and a group represented by Formula (a1-r2-3).

Meanwhile, $Ra'^4$ to $Ra'^6$ are not bonded to one another and represent an independent hydrocarbon group, and suitable examples thereof include a group represented by Formula (a1-r2-4).

(a1-r2-1)

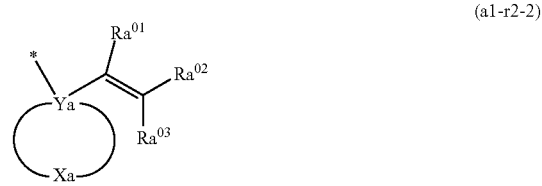

(a1-r2-2)

(a1-r2-3)

(a1-r2-4)

[In Formula (a1-r2-1), $Ra'^{10}$ represents an alkyl group having 1 to 10 carbon atoms, and $Ra'^{11}$ represents a group that forms an aliphatic cyclic group together with the carbon atom to which $Ra'^{10}$ is bonded. In Formula (a1-r2-2), Ya represents a carbon atom. Xa represents a group that forms a cyclic hydrocarbon group together with Ya. Some or all hydrogen atoms in this cyclic hydrocarbon group may be substituted.

$Ra^{01}$ to $Ra^{03}$ each independently represent a hydrogen atom, a chain-like monovalent saturated hydrocarbon group having 1 to 10 carbon atoms, or a monovalent aliphatic cyclic saturated hydrocarbon group having 3 to 20 carbon atoms. Some or all hydrogen atoms in this cyclic saturated hydrocarbon group and the aliphatic cyclic saturated hydrocarbon group may be substituted. Two or more of $Ra^{01}$ to $Ra^{03}$ may be bonded to one another to form a cyclic structure. The symbol "*" represents a bonding site. In Formula (a1-r2-3), Yaa represents a carbon atom. Xaa represents a group that forms an aliphatic cyclic group together with Yaa. $Ra^{04}$ represents an aromatic hydrocarbon group which may have a substituent. The symbol "*" represents a bonding site. In Formula (a1-r2-4), $Ra'^{12}$ and $Ra'^{13}$ each independently represent a monovalent saturated hydrocarbon having 1 to 10 carbon atoms or a hydrogen atom. Some or all hydrogen atoms in this cyclic saturated hydrocarbon group may be substituted. $Ra'^{14}$ represents an aromatic hydrocarbon group which may have a substituent. The symbol "*" represents a bonding site (the same applies hereinafter).]

In Formula (a1-r2-1), as the alkyl group having 1 to 10 carbon atoms of $Ra'^{10}$, a group exemplified as the linear or branched alkyl group represented by $Ra'^3$ in Formula (a1-r-1) is preferable.

It is preferable that $Ra'^{10}$ represent an alkyl group having 1 to 5 carbon atoms.

In Formula (a1-r2-1), as the aliphatic cyclic group that is formed by Ra'¹¹ together with the carbon atom to which Ra'¹⁰ is bonded, a group exemplified as the aliphatic hydrocarbon group which is a monocyclic group or a polycyclic group of Ra'³ in Formula (a1-r-1) is preferable.

In Formula (a1-r2-2), as the cyclic hydrocarbon group that is formed by Xa together with Ya, a group formed by further removing one or more hydrogen atoms from the cyclic monovalent hydrocarbon group (such as an aliphatic hydrocarbon group or an aromatic hydrocarbon group) of Ra'³ in Formula (a1-r-1) is exemplified.

The cyclic hydrocarbon group that is formed by Xa together with Ya may have a substituent. Examples of the substituent are the same as those exemplified as the substituents which may be included in the cyclic hydrocarbon group of Ra'³.

In Formula (a1-r2-2), examples of the cyclic monovalent hydrocarbon group having 1 to 10 carbon atoms of $Ra^{o1}$ to $Ra^{o3}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms of $Ra^{o1}$ to $Ra^{o3}$ include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicyclo[2.2.2]octanyl group, a tricyclo[5.2.1.0²,⁶]decanyl group, a tricyclo[3.3.1.1³,⁷]decanyl group, a tetracyclo[6.2.1.1³,⁶.0²,⁷]dodecanyl group, or an adamantyl group.

From the viewpoint of easily synthesizing a monomer compound from which the constitutional unit (a1) is derived, it is preferable that $Ra^{o1}$ to $Ra^{o3}$ represent a hydrogen atom or a chain-like monovalent saturated hydrocarbon group having 1 to 10 carbon atoms. Among these, a hydrogen atom, a methyl group, or an ethyl group is more preferable, and a hydrogen atom is particularly preferable.

Examples of the substituent included in the cyclic saturated hydrocarbon group or the aliphatic cyclic saturated hydrocarbon group represented by $Ra^{o1}$ to $Ra^{o3}$ are the same as those exemplified as $Ra^{o5}$.

Examples of the group having a carbon-carbon double bond generated by two or more of $Ra^{o1}$ to $Ra^{o3}$ being bonded to one another to form a cyclic structure include a cyclopentenyl group, a cyclohexenyl group, a methylcyclopentenyl group, a methylcyclohexenyl group, a cyclopentylidenethenyl group, and a cyclohexylidenethenyl group. Among these, from the viewpoint of easily synthesizing a monomer compound from which the constitutional unit (a1) is derived, a cyclopentenyl group, a cyclohexenyl group, or a cyclopentylidenethenyl group is preferable.

In Formula (a1-r2-3), as the aliphatic cyclic group that is formed by Xaa together with Yaa, a group exemplified as the aliphatic hydrocarbon group which is a monocyclic or polycyclic group of Ra'³ in Formula (a1-r-1) is preferable.

In Formula (a1-r2-3), examples of the aromatic hydrocarbon group of $Ra^{o4}$ include a group formed by removing one or more hydrogen atoms from an aromatic hydrocarbon group having 5 to 30 carbon atoms. Among the examples, $Ra^{o4}$ preferably represents a group formed by removing one or more hydrogen atoms from an aromatic hydrocarbon group having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from benzene or naphthalene, and most preferably a group formed by removing one or more hydrogen atoms from benzene.

Examples of the substituent which may be included in $Ra^{o4}$ in Formula (a1-r2-3) include a methyl group, an ethyl group, a propyl group, a hydroxyl group, a carboxyl group, a halogen atom (such as a fluorine atom, a chlorine atom, or a bromine atom), an alkoxy group (such as a methoxy group, an ethoxy group, a propoxy group, or a butoxy group), and an alkyloxycarbonyl group.

In Formula (a1-r2-4), Ra'¹² and Ra'¹³ each independently represent a chain-like monovalent saturated hydrocarbon group having 1 to 10 carbon atoms or a hydrogen atom. Examples of the chain-like monovalent saturated hydrocarbon group having 1 to 10 carbon atoms of Ra'¹² and Ra'¹³ are the same as those exemplified as the chain-like monovalent saturated hydrocarbon group having 1 to 10 carbon atoms of $Ra^{o1}$ to $Ra^{o3}$. Some or all hydrogen atoms in the chain-like saturated hydrocarbon group may be substituted.

Ra'¹² and Ra'¹³ preferably represent a hydrogen atom or an alkyl group having 1 to 5 carbon atoms, more preferably an alkyl group having 1 to 5 carbon atoms, still more preferably a methyl group or an ethyl group, and particularly preferably a methyl group.

In a case where the chain-like saturated hydrocarbon group represented by Ra'¹² and Ra'¹³ is substituted, examples of the substituent are the same as those exemplified as $Ra^{o5}$.

In Formula (a1-r2-4), Ra'¹⁴ represents an aromatic hydrocarbon group which may have a substituent. Examples of the aromatic hydrocarbon group of Ra'¹⁴ are the same as those exemplified as the aromatic hydrocarbon group of $Ra^{o4}$. Among these, Ra'¹⁴ preferably represents a group formed by removing one or more hydrogen atoms from an aromatic hydrocarbon group having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from naphthalene or anthracene, and most preferably a group formed by removing one or more hydrogen atoms from naphthalene.

Examples of the substituent which may be included in Ra'¹⁴ are the same as those exemplified as the substituent which may be included in $Ra^{o4}$.

In a case where Ra'¹⁴ in Formula (a1-r2-4) represents a naphthyl group, the position bonded to the tertiary carbon atom in Formula (a1-r2-4) may be the 1-position or the 2-position of the naphthyl group.

In a case where Ra'¹⁴ in Formula (a1-r2-4) represents an anthryl group, the position bonded to the tertiary carbon atom in Formula (a1-r2-4) may be the 1-position, the 2-position, or the 9-position of the anthryl group.

Specific examples of the group represented by Formula (a1-r2-1) are shown below.

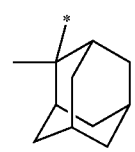

(r-pr-m1)

-continued
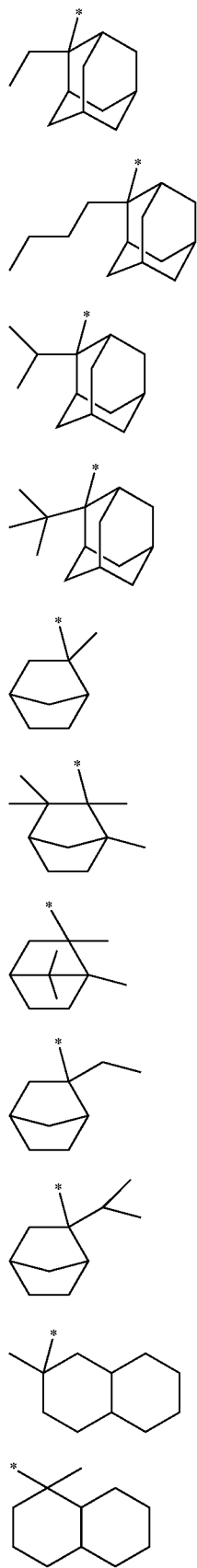
(r-pr-m2)
(r-pr-m3)
(r-pr-m4)
(r-pr-m5)
(r-pr-m6)
(r-pr-m7)
(r-pr-m8)
(r-pr-m9)
(r-pr-m10)
(r-pr-m11)
(r-pr-m12)
-continued
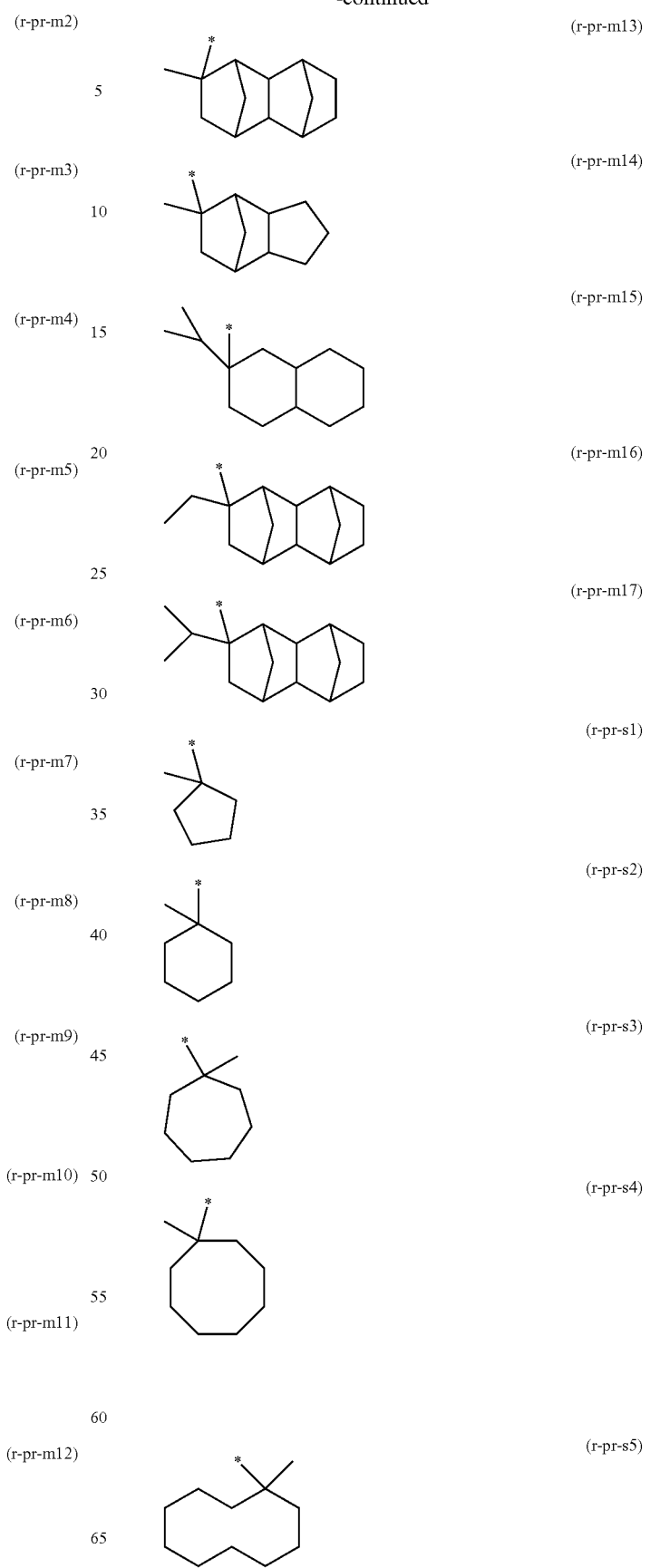
(r-pr-m13)
(r-pr-m14)
(r-pr-m15)
(r-pr-m16)
(r-pr-m17)
(r-pr-s1)
(r-pr-s2)
(r-pr-s3)
(r-pr-s4)
(r-pr-s5)

(r-pr-s6)
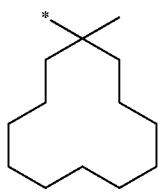
(r-pr-s7)
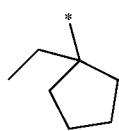
(r-pr-s8)
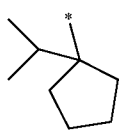
(r-ps-s9)
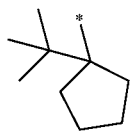
(r-pr-s10)
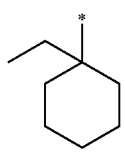
(r-pr-s11)
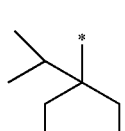
(r-pr-s12)
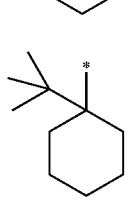
(r-pr-s13)
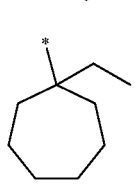
(r-pr-s14)
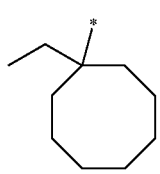
(r-pr-s15)
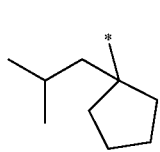
(r-pr-s16)
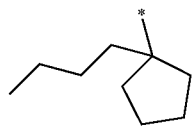
(r-pr-s17)
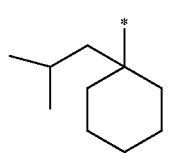
(r-pr-s18)
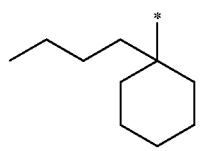
Specific examples of the group represented by Formula (a1-r2-2) are shown below.
(r-pr-sv1)
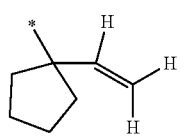
(r-pr-sv2)
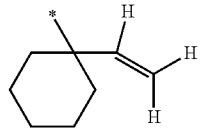
(r-pr-sv3)
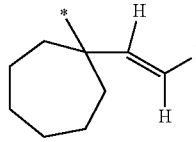
(r-pr-sv4)
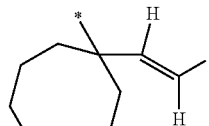
(r-pr-sv5)
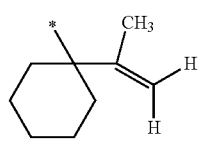
(r-ps-sv6)
(r-pr-sv7)
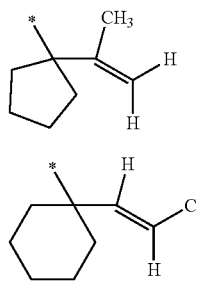

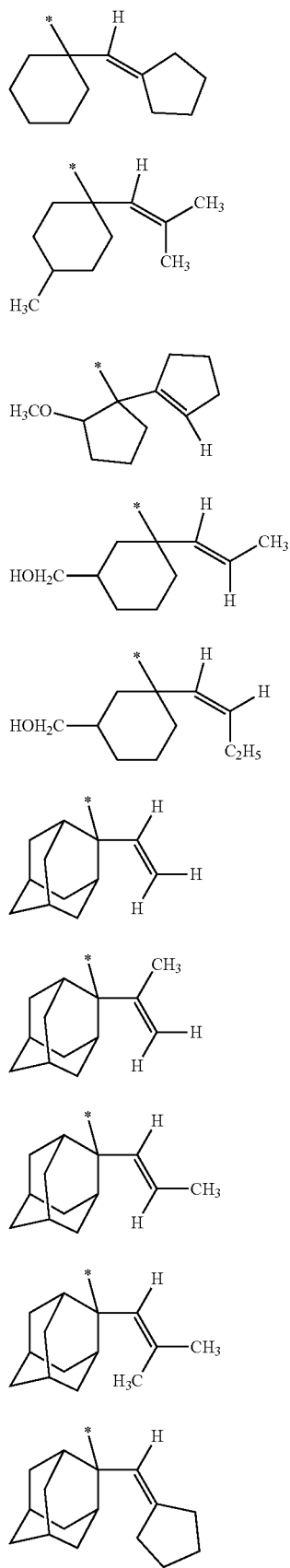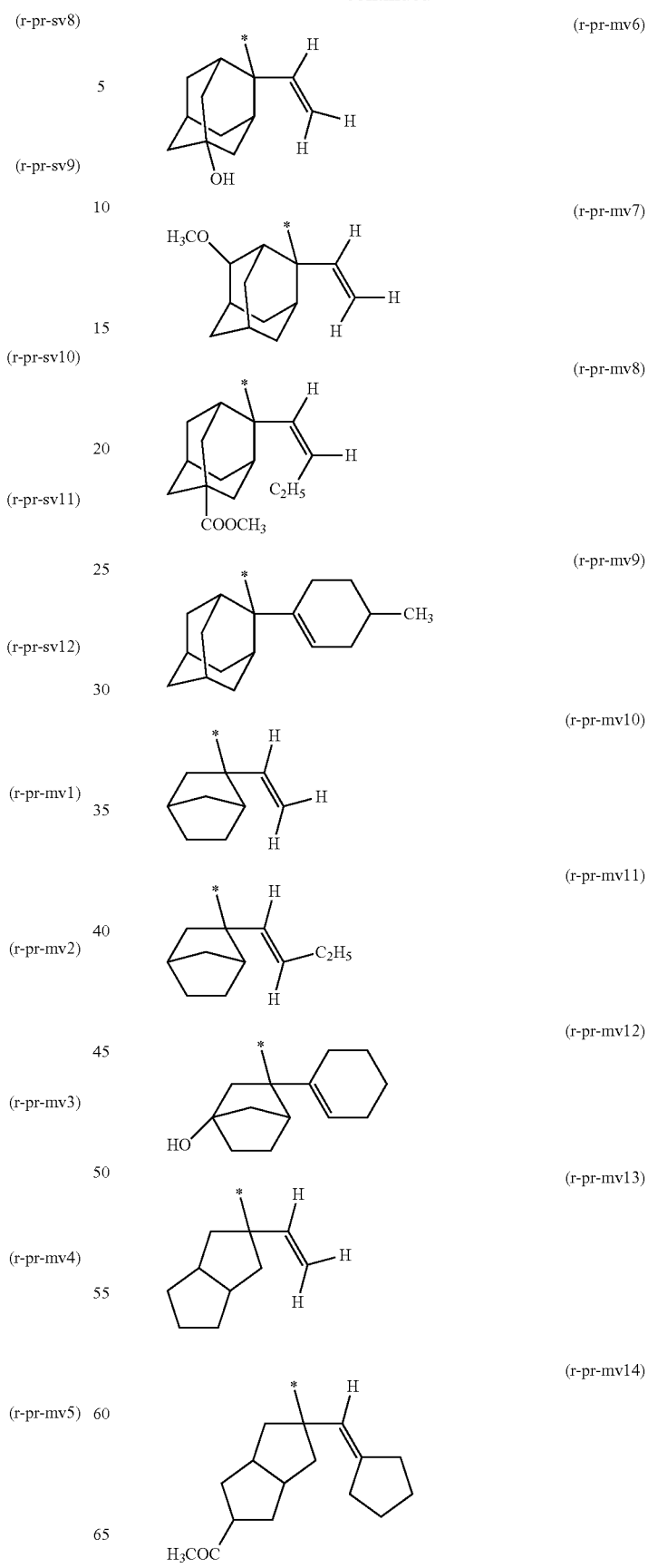

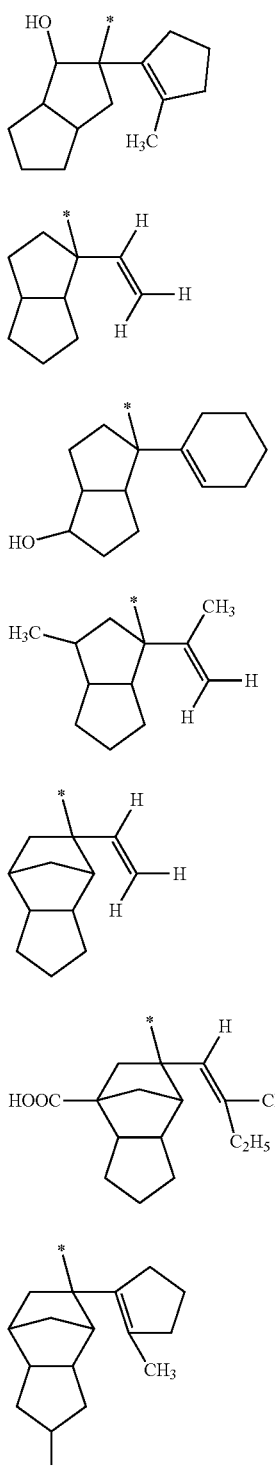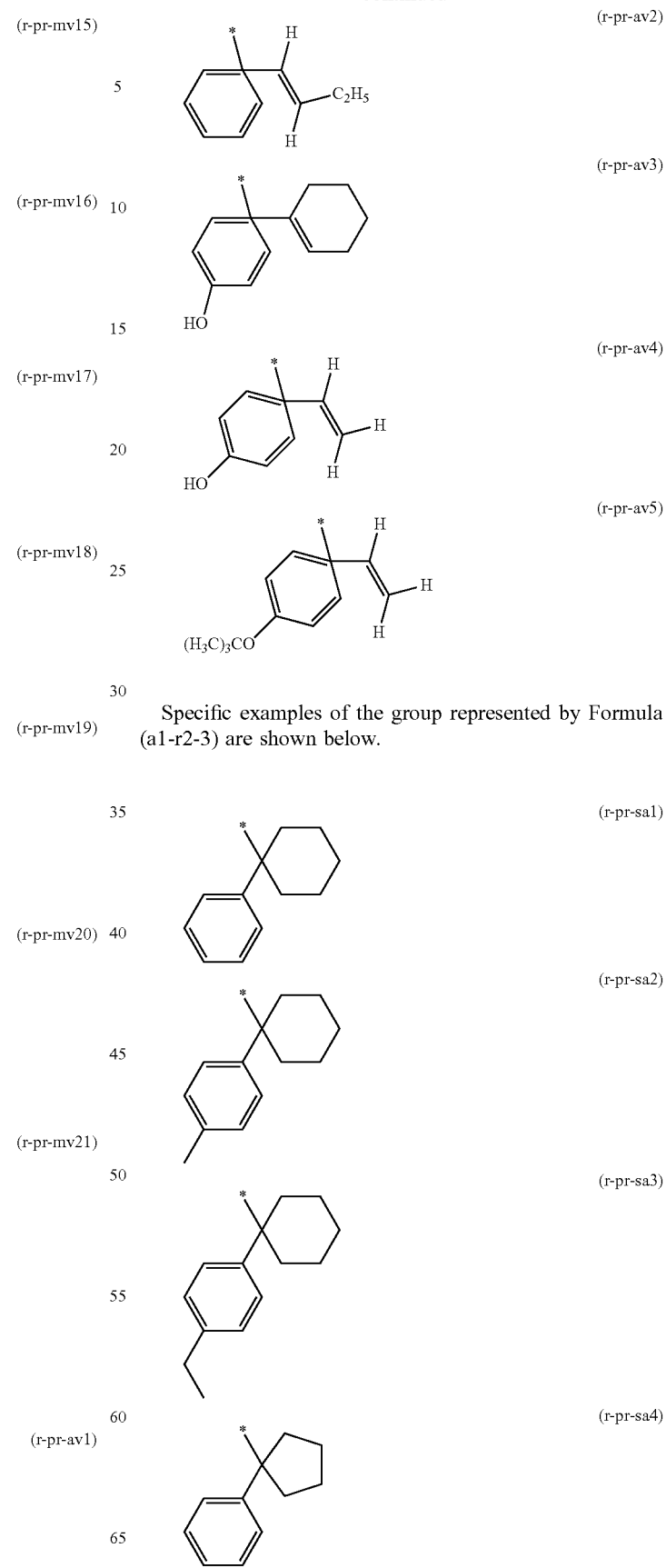
Specific examples of the group represented by Formula (a1-r2-3) are shown below.

-continued (r-pr-sa5)
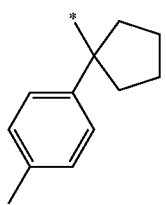

(r-pr-sa6)
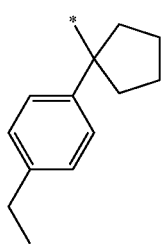

(r-pr-sa7)
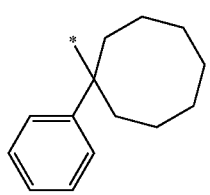

(r-pr-sa8)
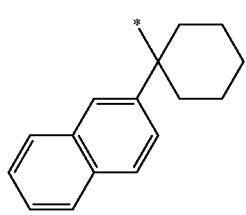

(r-pr-sa9)
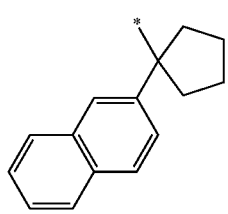

(r-pr-ma1)
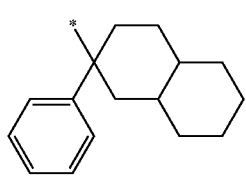

(r-pr-ma2)
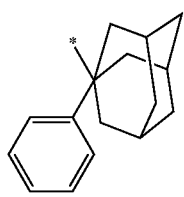

Specific examples of the group represented by Formula (a1-r2-4) are shown below.

(r-pr-cm1)
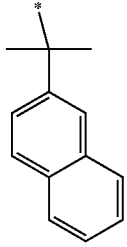

(r-pr-cm2)
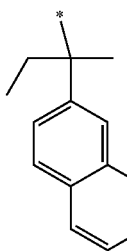

(r-pr-cm3)
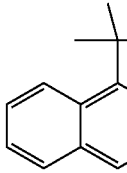

(r-pr-cm4)
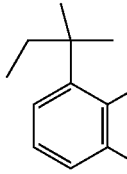

(r-pr-cs1)
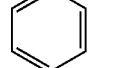

(r-pr-cs2)
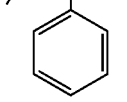

Tertiary Alkyloxycarbonyl Acid Dissociable Group

Examples of the acid dissociable group for protecting a hydroxyl group serving as a polar group include an acid dissociable group (hereinafter, for convenience, also referred to as "tertiary alkyloxycarbonyl type acid dissociable group") represented by Formula (a1-r-3) shown below.

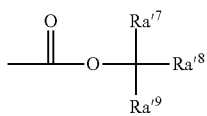
(a1-r-3)

[In the formula, $Ra'^7$ to $Ra'^9$ each independently represent an alkyl group.]

In Formula (a1-r-3), $Ra'^7$ to $Ra'^9$ preferably each independently represent an alkyl group having 1 to 5 carbon atoms and more preferably an alkyl group having 1 to 3 carbon atoms.

Further, the total number of carbon atoms in each alkyl group is preferably in a range of 3 to 7, more preferably in a range of 3 to 5, and most preferably 3 or 4.

Examples of the constitutional unit (a1) include a constitutional unit derived from an acrylic acid ester in which the hydrogen atom bonded to the carbon atom at the α-position may be substituted with a substituent; a constitutional unit derived from acrylamide; a constitutional unit in which at least some hydrogen atoms in a hydroxyl group of a constitutional unit derived from hydroxystyrene or a hydroxystyrene derivative are protected by a substituent containing the acid decomposable group; and a constitutional unit in which some hydrogen atoms in —C(=O)—OH of a constitutional unit derived from vinylbenzoic acid or a vinylbenzoic acid derivative are protected by a substituent containing the acid decomposable group.

Among the examples, as the constitutional unit (a1), a constitutional unit derived from an acrylic acid ester in which the hydrogen atom bonded to the carbon atom at the α-position may be substituted with a substituent is preferable.

Specific preferred examples of such a constitutional unit (a1) include constitutional units represented by Formula (a1-1) or (a1-2) shown below.

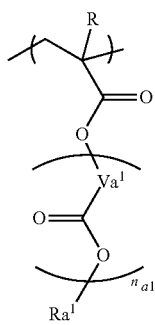
(a1-1)

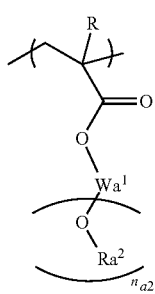
(a1-2)

[In the formulae, R represents a hydrogen atom, an alkyl group having 1 to 5 carbon atoms, or a halogenated alkyl group having 1 to 5 carbon atoms, $Va^1$ represents a divalent hydrocarbon group which may contain an ether bond, $n_{a1}$ represents an integer of 0 to 2, and $Ra^1$ represents an acid dissociable group represented by Formula (a1-r-1) or (a1-r-2). $Wa^1$ represents a $(n_{a2}+1)$-valent hydrocarbon group, $n_{a2}$ represents an integer of 1 to 3, and $Ra^2$ represents an acid dissociable group represented by Formula (a1-r-1) or (a1-r-3)].

In Formula (a1-1), as the alkyl group having 1 to 5 carbon atoms of R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all hydrogen atoms of the alkyl group having 1 to 5 carbon atoms have been substituted with halogen atoms. Examples of the halogen atoms include a fluorine atom, a chlorine atom, a bromine atom, and an iodine atom. Among these, a fluorine atom is preferable.

R preferably represents a hydrogen atom, an alkyl group having 1 to 5 carbon atoms, or a fluorinated alkyl group having 1 to 5 carbon atoms and most preferably a hydrogen atom or a methyl group from the viewpoint of industrial availability.

In Formula (a1-1), the divalent hydrocarbon group of $Va^1$ may be an aliphatic hydrocarbon group or an aromatic hydrocarbon group.

The aliphatic hydrocarbon group serving as the divalent hydrocarbon group represented by $Va^1$ may be saturated or unsaturated. In general, the aliphatic hydrocarbon group is preferably saturated.

Specific examples of the aliphatic hydrocarbon group include a linear or branched aliphatic hydrocarbon group, and an aliphatic hydrocarbon group containing a ring in the structure thereof.

The linear or branched aliphatic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

The branched aliphatic hydrocarbon group preferably has 3 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. As the alkyl group in the alkylalkylene group, a linear alkyl group having 1 to 5 carbon atoms is preferable.

Examples of the aliphatic hydrocarbon group containing a ring in the structure thereof include an alicyclic hydrocarbon group (a group in which two hydrogen atoms have been removed from an aliphatic hydrocarbon ring), a group in which the alicyclic hydrocarbon group is bonded to the terminal of the above-described linear or branched aliphatic hydrocarbon group, and a group in which the alicyclic hydrocarbon group is interposed in the above-described linear or branched aliphatic hydrocarbon group. The linear or branched aliphatic hydrocarbon group is the same as defined for the above-described linear aliphatic hydrocarbon group or the above-described branched aliphatic hydrocarbon group.

The alicyclic hydrocarbon group preferably has 3 to 20 carbon atoms and more preferably 3 to 12 carbon atoms.

The alicyclic hydrocarbon group may be monocyclic or polycyclic. As the monocyclic alicyclic hydrocarbon group, a group in which two hydrogen atoms have been removed from a monocycloalkane is preferable. The monocycloalkane preferably has 3 to 6 carbon atoms, and specific examples thereof include cyclopentane and cyclohexane. As the polycyclic alicyclic group, a group in which two hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The aromatic hydrocarbon group serving as the divalent hydrocarbon group represented by $Va^1$ is a hydrocarbon group having an aromatic ring.

The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring contained in the aromatic hydrocarbon group include aromatic hydrocarbon rings such as benzene, biphenyl, fluorene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom.

Specific examples of the aromatic hydrocarbon group include a group in which two hydrogen atoms have been removed from the above-described aromatic hydrocarbon ring (an arylene group); and a group in which one hydrogen atom of a group (an aryl group) formed by removing one hydrogen atom from the aromatic hydrocarbon ring has been substituted with an alkylene group (a group formed by removing one more hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

In Formula (a1-1), $Ra^1$ represents an acid dissociable group represented by Formula (a1-r-1) or (a1-r-2).

In Formula (a1-2), the $(n_{a2}+1)$-valent hydrocarbon group of $Wa^1$ may be an aliphatic hydrocarbon group or an aromatic hydrocarbon group. The aliphatic hydrocarbon group indicates a hydrocarbon group that has no aromaticity, and may be saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof.

The valency of $n_{a2}+1$ is preferably divalent, trivalent or tetravalent, and divalent or trivalent is more preferable.

Specific examples of the constitutional unit represented by Formula (a1-1) are shown below.

In the formulae shown below, $R^\alpha$ represents a hydrogen atom, a methyl group, or a trifluoromethyl group.

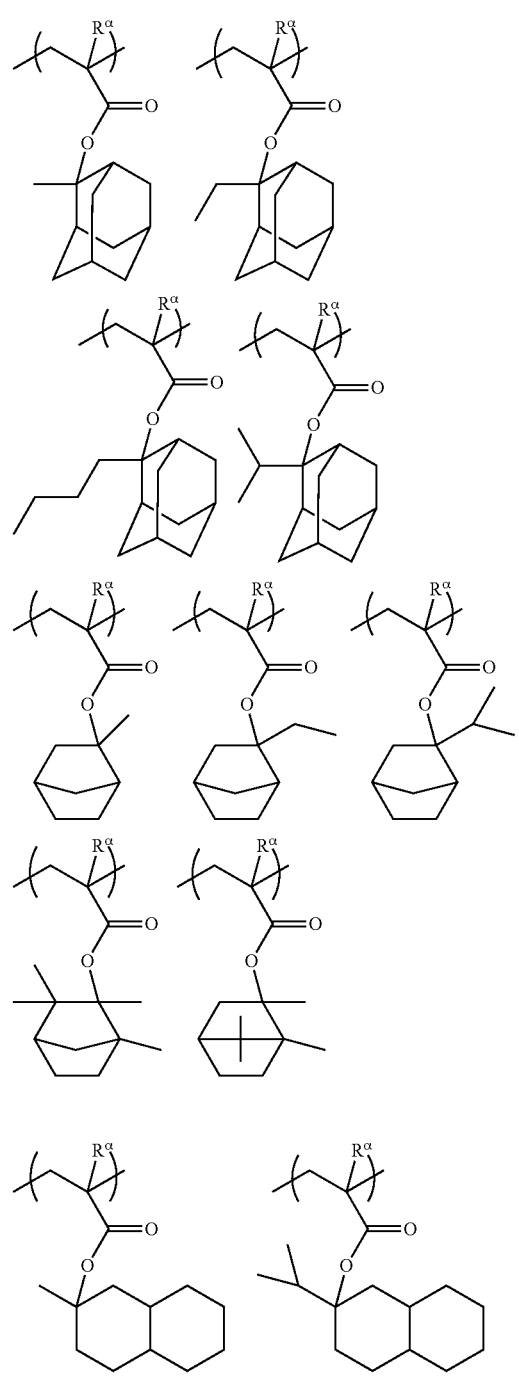

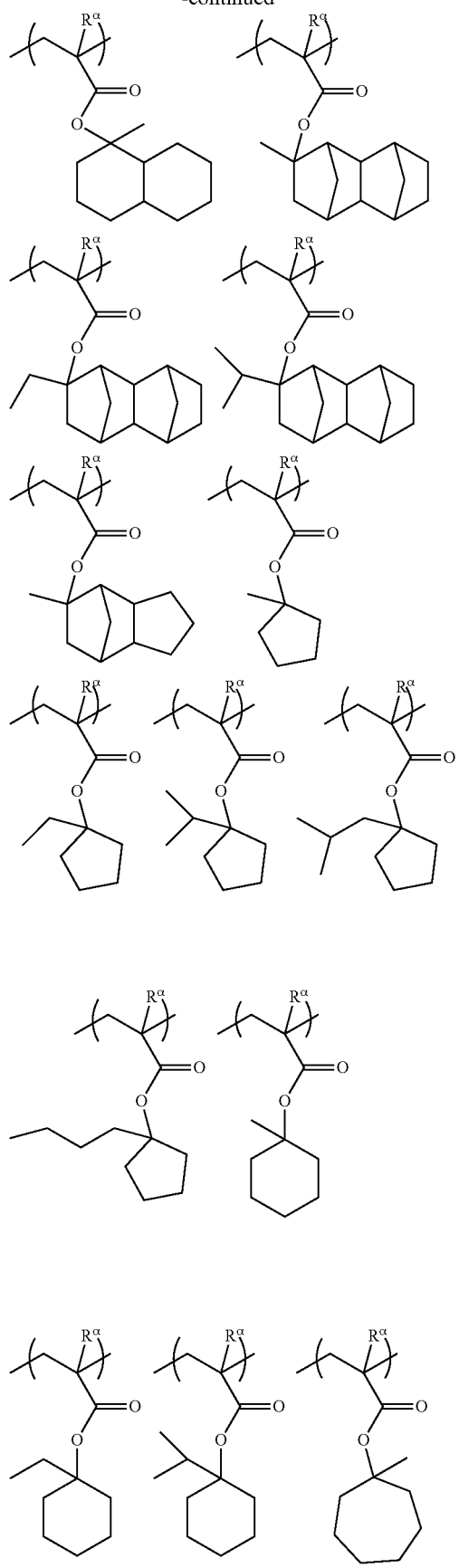
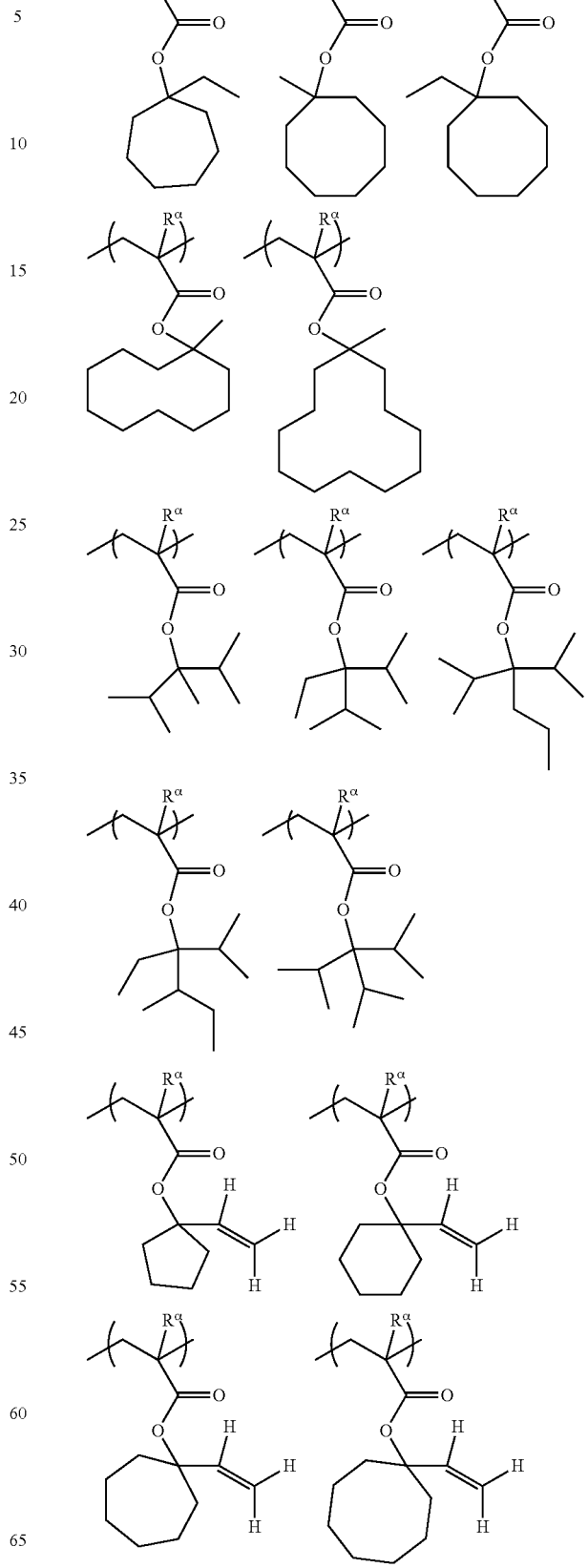

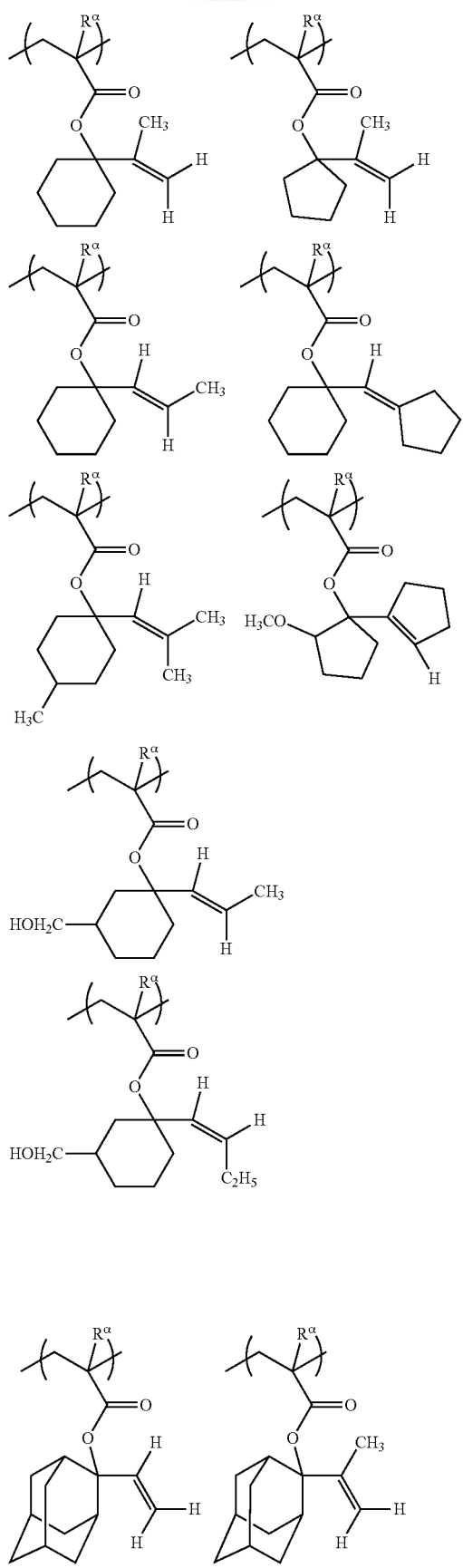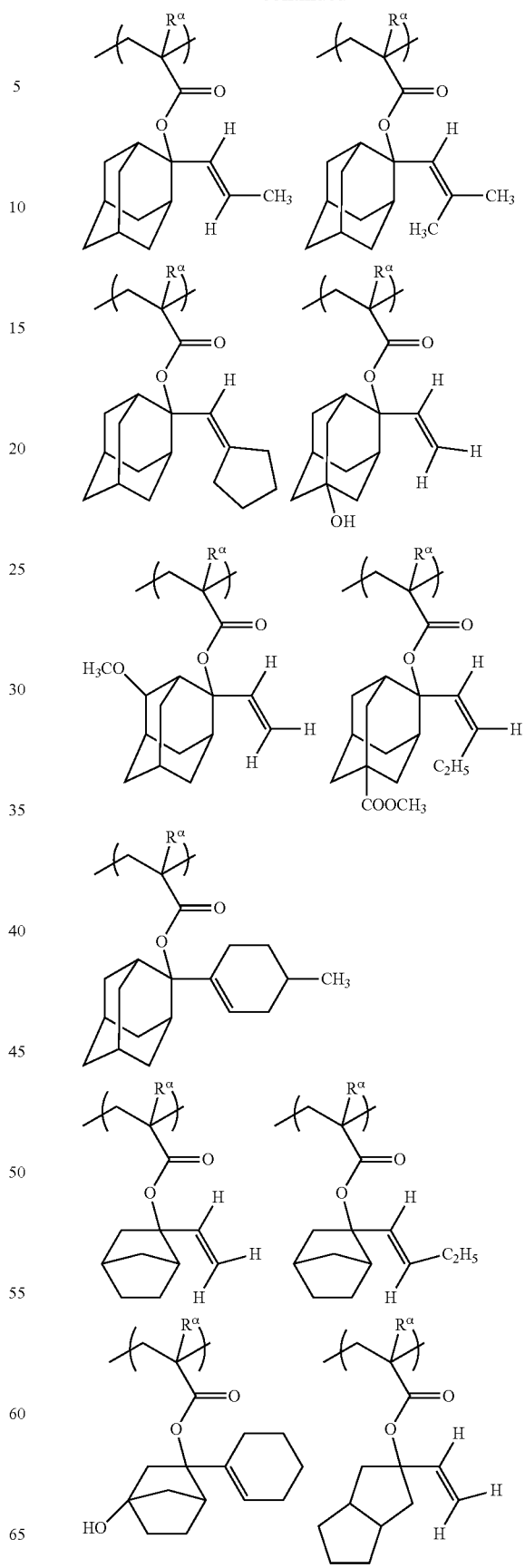

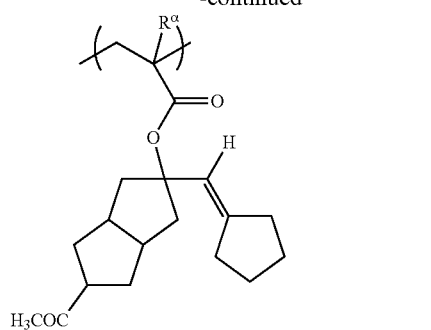
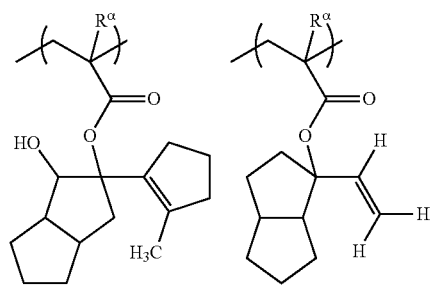
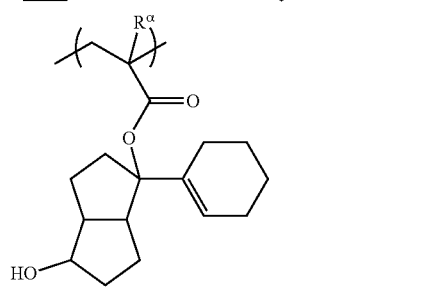
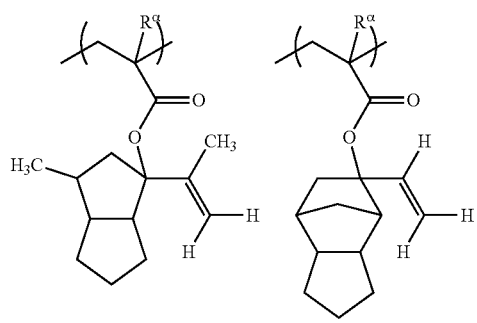
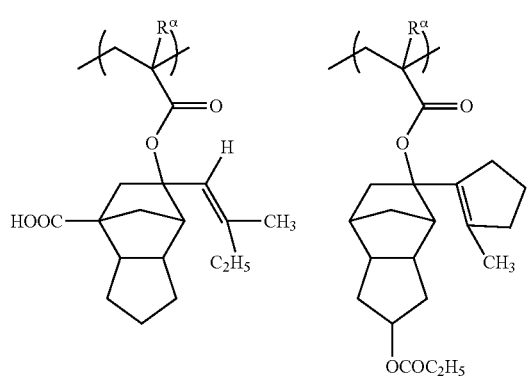
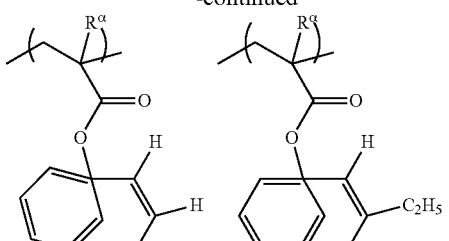
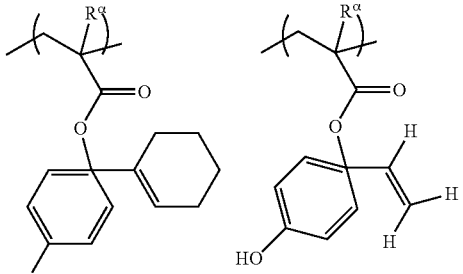
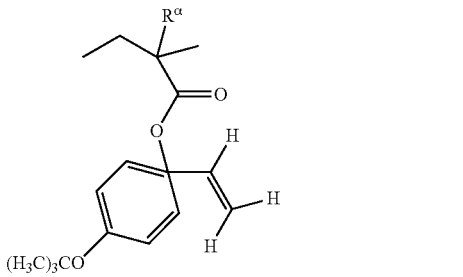
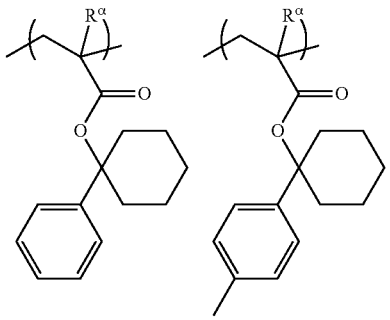
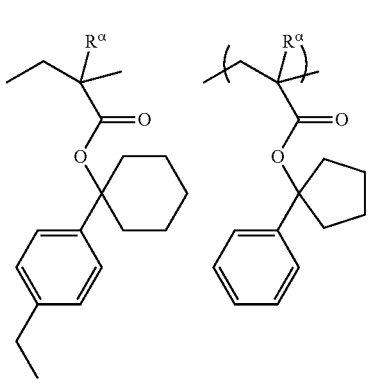

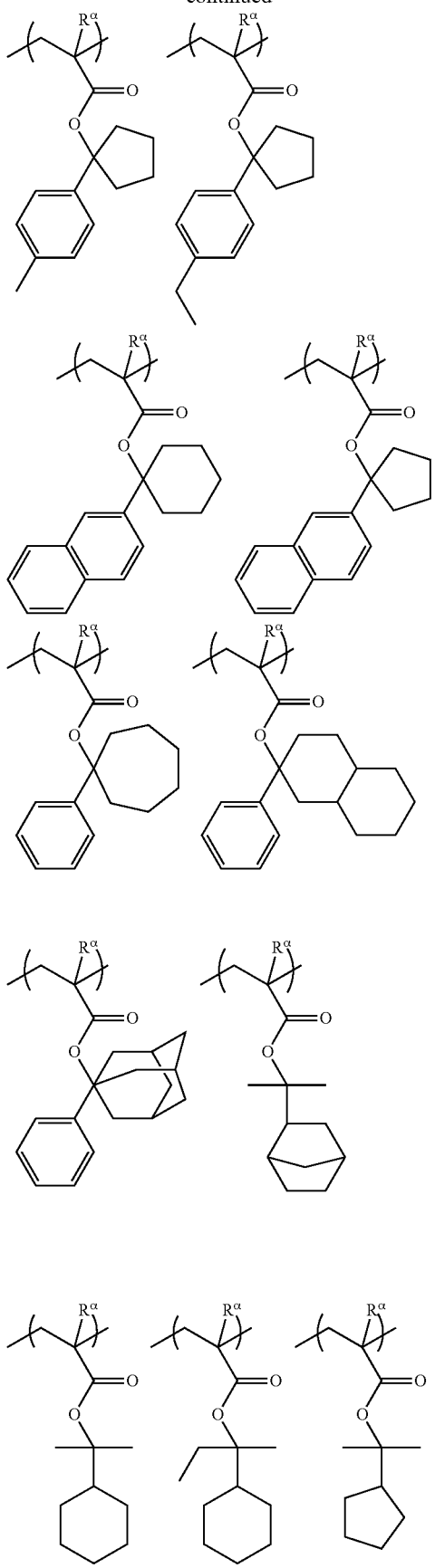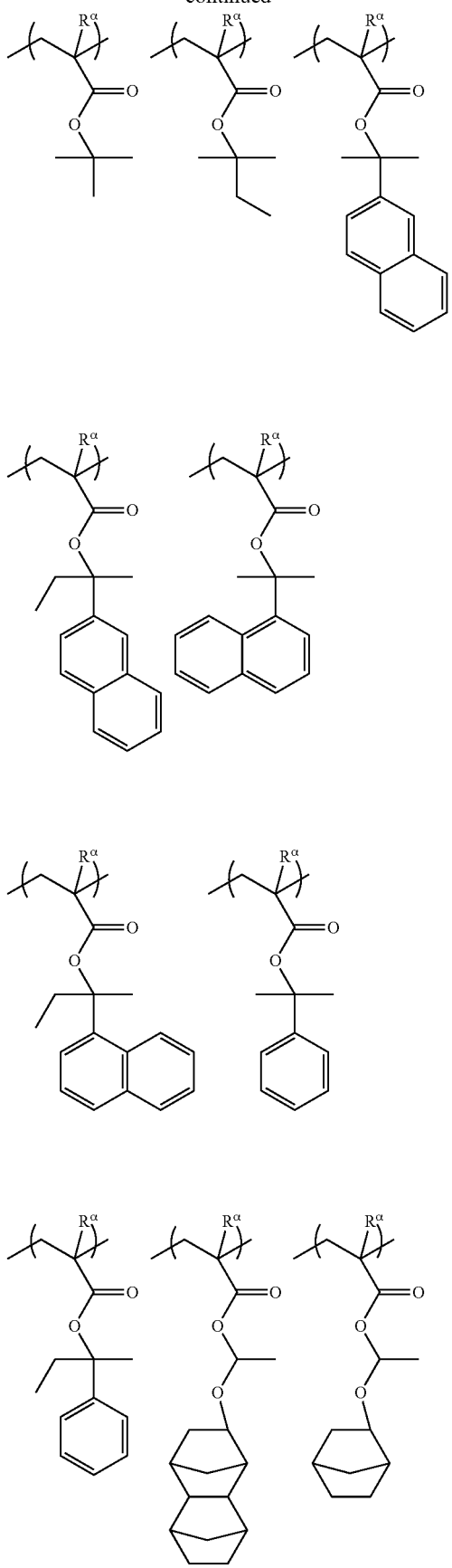

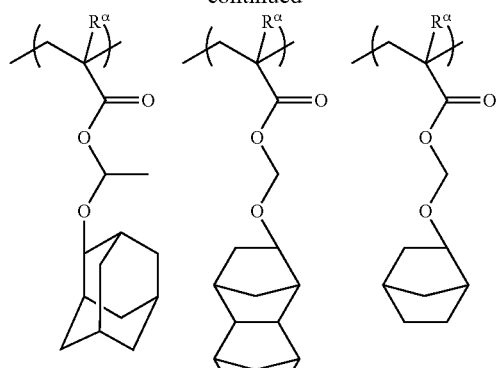
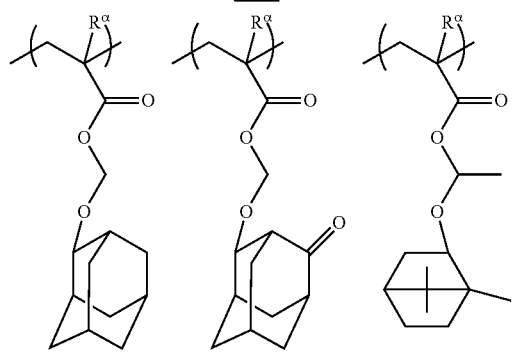
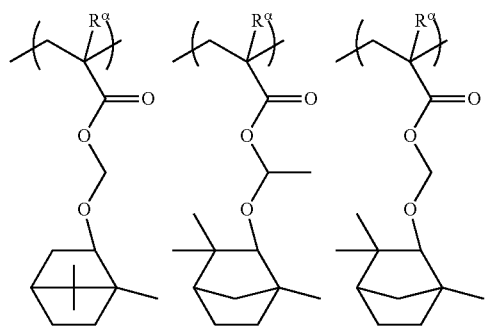
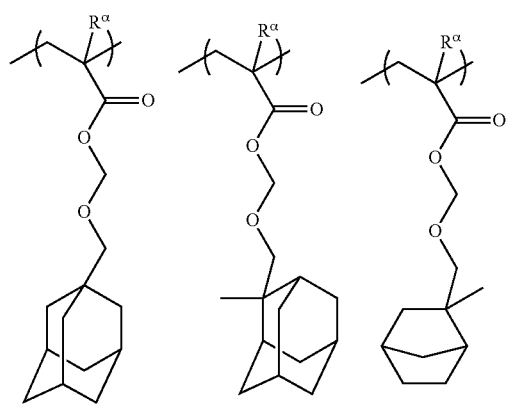
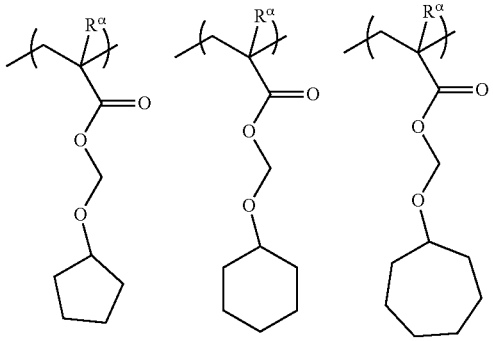
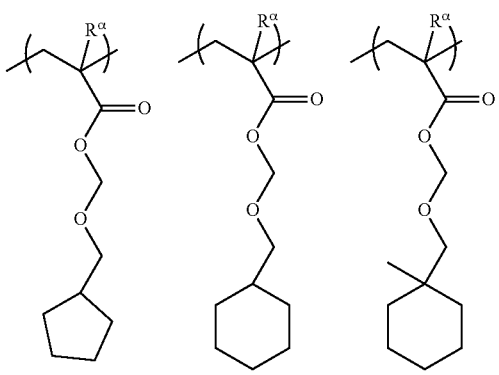
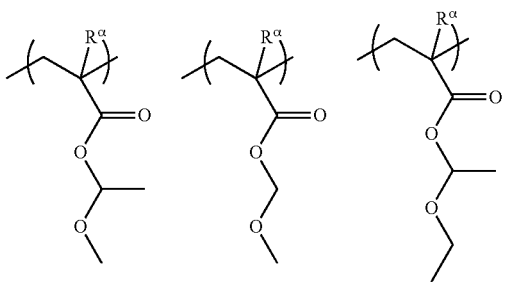
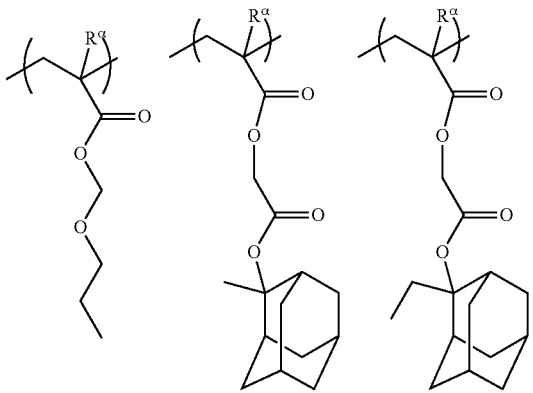

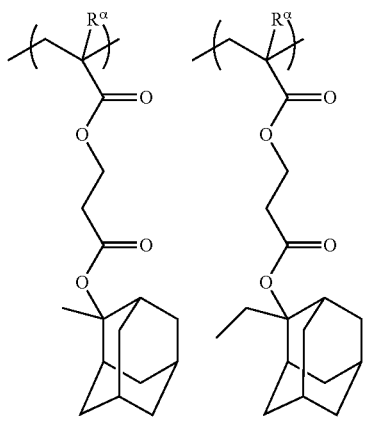
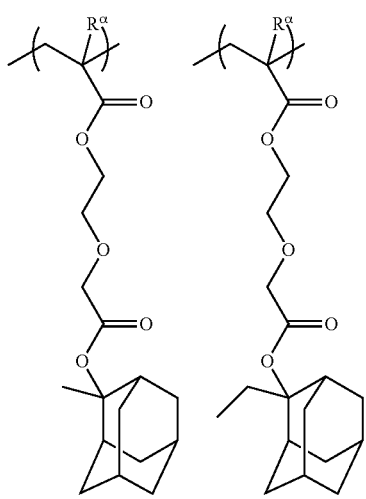
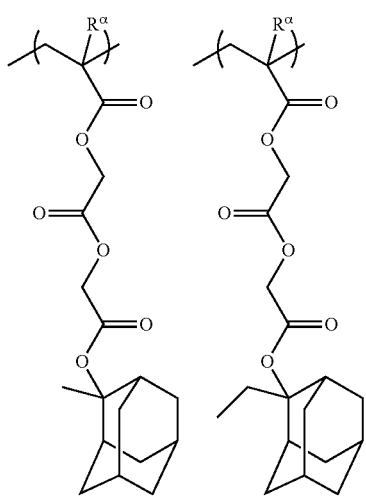
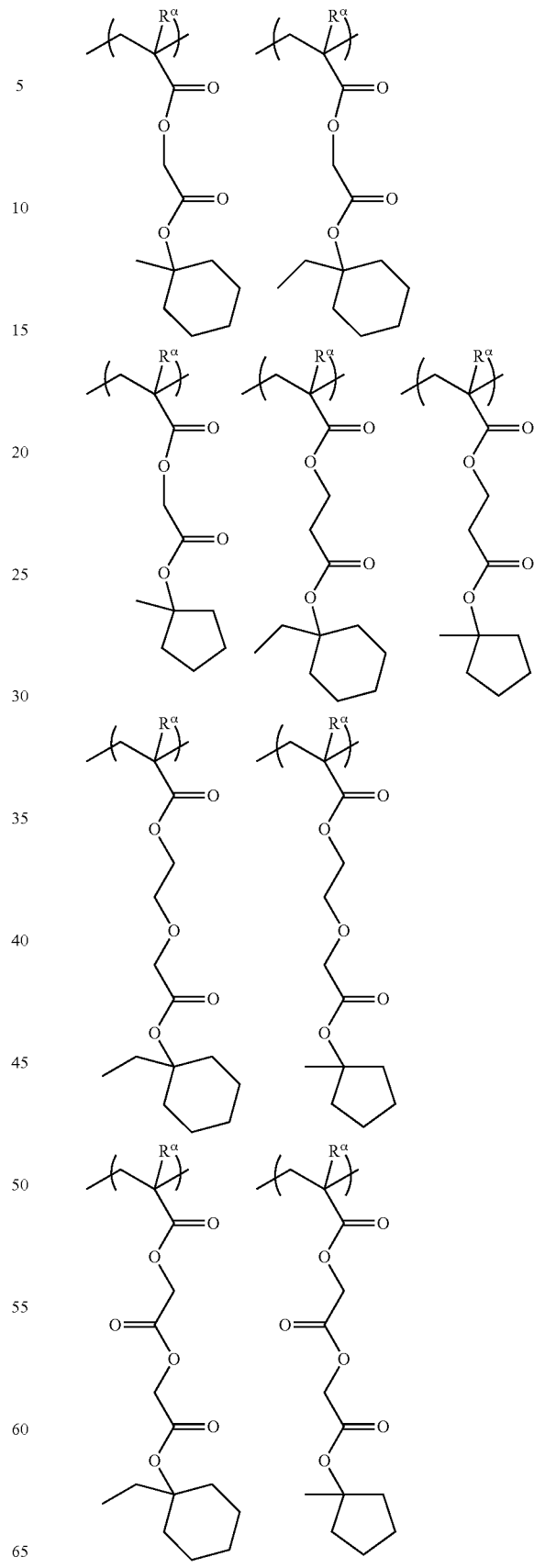

Specific examples of the constitutional unit represented by Formula (a1-2) are shown below.

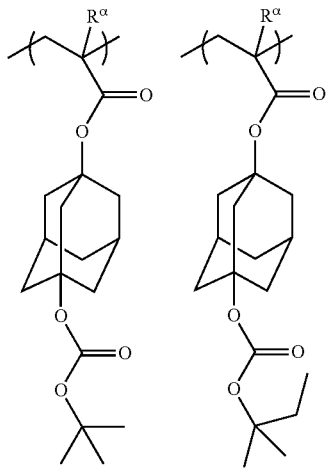

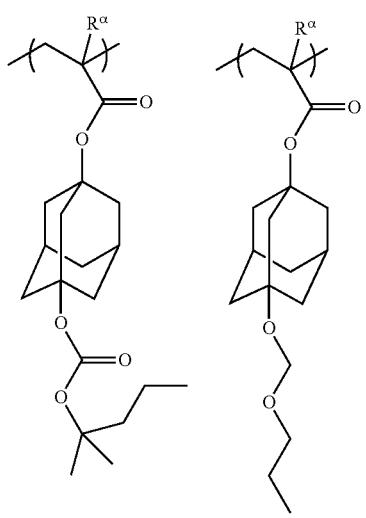

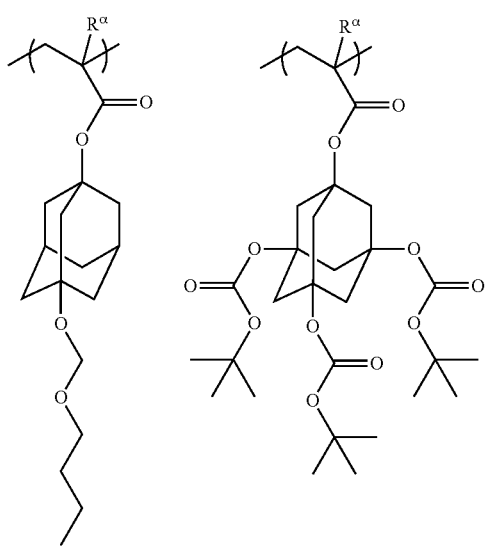

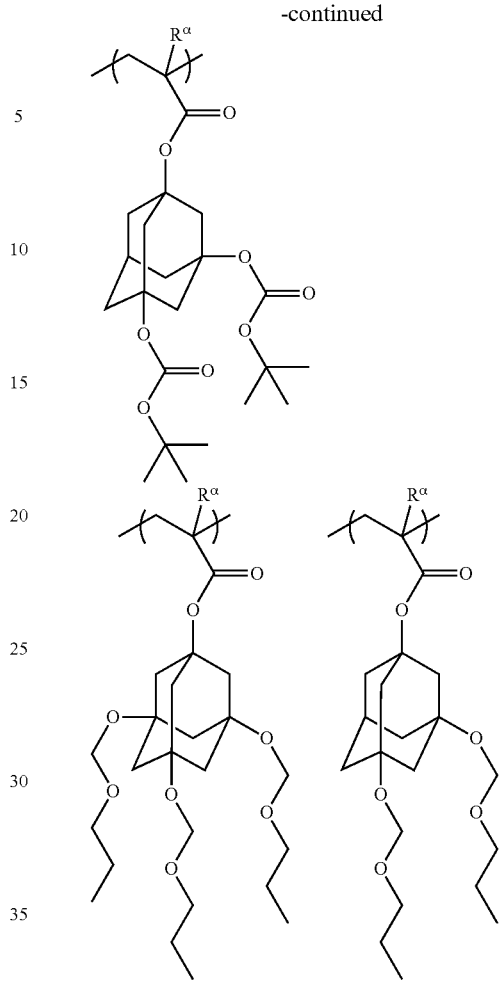

The constitutional unit (a1) included in the component (A1) may be used alone or two or more kinds thereof may be used. The component (A1) may or may not have the constitutional unit (a1). It is preferable that the component (A1) not have the constitutional unit (a1).

The proportion of the constitutional unit (a1) in the component (A1) is preferably in a range of 0% to 40% by mole, more preferably in a range of 0% to 30% by mole, still more preferably in a range of 0% to 20% by mole, and particularly preferably in a range of 0% to 10% by mole or 0% by mole with respect to the total amount (100% by mole) of all constitutional units constituting the component (A1).

By setting the proportion of the constitutional unit (a1) to be in the above-described preferable range, the constitutional unit (a1) and other constitutional units can be balanced.

[Constitutional Unit (a2)]

The component (A1) may have a constitutional unit (a2) (here, a constitutional unit corresponding to the constitutional unit (a0) or the constitutional unit (a1) is excluded) containing a lactone-containing cyclic group, a —$SO_2$-containing cyclic group, or a carbonate-containing cyclic group.

In a case where the component (A1) is used for forming a resist film, the lactone-containing cyclic group, the —$SO_2$-containing cyclic group, or the carbonate-containing cyclic group in the constitutional unit (a2) is effective for improving the adhesiveness of the resist film to the substrate.

Further, by virtue of including the constitutional unit (a2), in an alkali developing process, during development, the solubility of the resist film in an alkali developing solution is enhanced.

The term "lactone-containing cyclic group" indicates a cyclic group that contains a ring (lactone ring) containing a —O—C(=O)— in the ring structure. In a case where the lactone ring is counted as the first ring and the group contains only the lactone ring, the group is referred to as a monocyclic group. Further, in a case where the group has other ring structures, the group is referred to as a polycyclic group regardless of the structures. The lactone-containing cyclic group may be a monocyclic group or a polycyclic group.

The lactone-containing cyclic group for the constitutional unit (a2) is not particularly limited, and an optional constitutional unit may be used. Specific examples thereof include groups represented by Formulae (a2-r-1) to (a2-r-7) shown below.

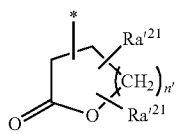
(a2-r-1)

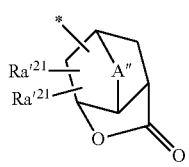
(a2-r-2)

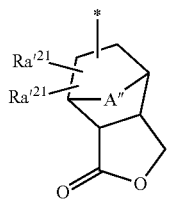
(a2-r-3)

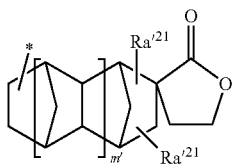
(a2-r-4)

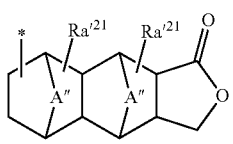
(a2-r-5)

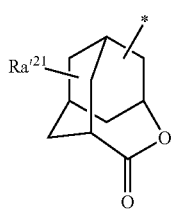
(a2-r-6)

-continued

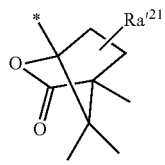
(a2-r-7)

[In the formulae, each $Ra'^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; and R" represents a hydrogen atom, an alkyl group, a lactone-containing cyclic group, a carbonate-containing cyclic group, or a —SO$_2$-containing cyclic group; A" represents an oxygen atom (—O—), a sulfur atom (—S—) or an alkylene group having 1 to 5 carbon atoms which may contain an oxygen atom or a sulfur atom; n' represents an integer of 0 to 2; and m' represents 0 or 1.]

In Formulae (a2-r-1) to (a2-r-7), the alkyl group of $Ra'^{21}$ is preferably an alkyl group having 1 to 6 carbon atoms. Further, the alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly preferable.

The alkoxy group of $Ra'^{21}$ is preferably an alkoxy group having 1 to 6 carbon atoms.

Further, the alkoxy group is preferably a linear or branched alkoxy group.

Specific examples of the alkoxy groups include a group formed by linking the above-described alkyl group of $Ra'^{21}$ to an oxygen atom (—O—).

Examples of the halogen atom of $Ra'^{21}$ include a fluorine atom, a chlorine atom, a bromine atom, and an iodine atom. Among these, a fluorine atom is preferable.

Examples of the halogenated alkyl group of $Ra'^{21}$ include groups in which some or all hydrogen atoms in the above-described alkyl group of $Ra'^{21}$ have been substituted with the above-described halogen atoms. As the halogenated alkyl group, a fluorinated alkyl group is preferable, and a perfluoroalkyl group is particularly preferable.

In —COOR" and —OC(=O)R" of $Ra'^{21}$, R" represents a hydrogen atom, an alkyl group, a lactone-containing cyclic group, a carbonate-containing cyclic group, or a —SO$_2$-containing cyclic group.

The alkyl group of R" may be linear, branched, or cyclic, and preferably has 1 to 15 carbon atoms.

In a case where R" represents a linear or branched alkyl group, it is preferably an alkyl group having 1 to 10 carbon atoms, more preferably an alkyl group having 1 to 5 carbon atoms, and most preferably a methyl group or an ethyl group.

In a case where R" represents a cyclic alkyl group, the number of carbon atoms thereof is preferably in a range of 3 to 15, more preferably in a range of 4 to 12, and most preferably in a range of 5 to 10. Specific examples thereof include groups in which one or more hydrogen atoms have been removed from a monocycloalkane, which may or may not be substituted with a fluorine atom or a fluorinated alkyl group; and groups in which one or more hydrogen atoms have been removed from a polycycloalkane such as a bicycloalkane, a tricycloalkane, or a tetracycloalkane. More specific examples thereof include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane, or tetracyclododecane.

Examples of the lactone-containing cyclic group of R'' include those exemplified as the groups represented by Formulae (a2-r-1) to (a2-r-7).

The carbonate-containing cyclic group of R'' has the same definition as that for the carbonate-containing cyclic group described below. Specific examples of the carbonate-containing cyclic group include groups represented by Formulae (ax3-r-1) to (ax3-r-3).

The —SO$_2$-containing cyclic group of R'' has the same definition as that for the —SO$_2$-containing cyclic group described below. Specific examples of the —SO$_2$-containing cyclic group include groups represented by Formulae (a5-r-1) to (a5-r-4).

The hydroxyalkyl group of $Ra'^{21}$ preferably has 1 to 6 carbon atoms, and specific examples thereof include a group in which at least one hydrogen atom in the alkyl group of $Ra'^{21}$ has been substituted with a hydroxyl group.

In Formulae (a2-r-2), (a2-r-3) and (a2-r-5), as the alkylene group having 1 to 5 carbon atoms of A'', a linear or branched alkylene group is preferable, and examples thereof include a methylene group, an ethylene group, an n-propylene group, and an isopropylene group. Examples of alkylene groups that contain an oxygen atom or a sulfur atom include groups in which —O— or —S— is interposed in the terminal of the alkylene group or between the carbon atoms of the alkylene group, and examples thereof include —O—CH$_2$—, —CH$_2$—O—CH$_2$—, —S—CH$_2$—, and —CH$_2$—S—CH$_2$—. As A'', an alkylene group having 1 to 5 carbon atoms or —O— is preferable, an alkylene group having 1 to 5 carbon atoms is more preferable, and a methylene group is most preferable.

Specific examples of the groups represented by Formulae (a2-r-1) to (a2-r-7) are shown below.

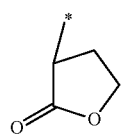

(r-lc-1-1)

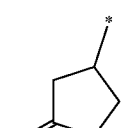

(r-lc-1-2)

(r-lc-1-3)

(r-lc-1-4)

-continued

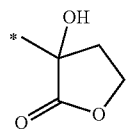

(r-lc-1-5)

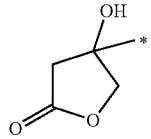

(r-lc-1-6)

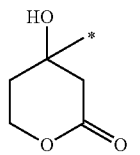

(r-lc-1-7)

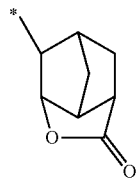

(r-lc-2-1)

(r-lc-2-2)

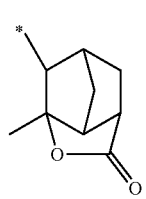

(r-lc-2-3)

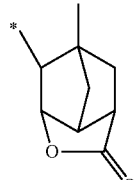

(r-lc-2-4)

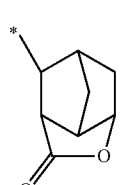

(r-lc-2-5)

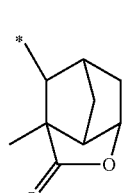

(r-lc-2-6)

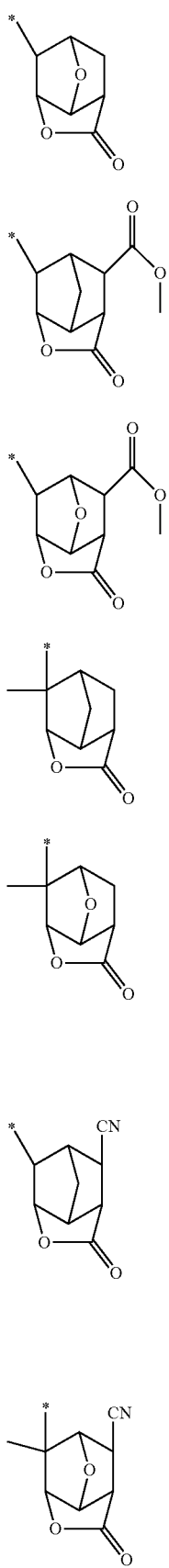

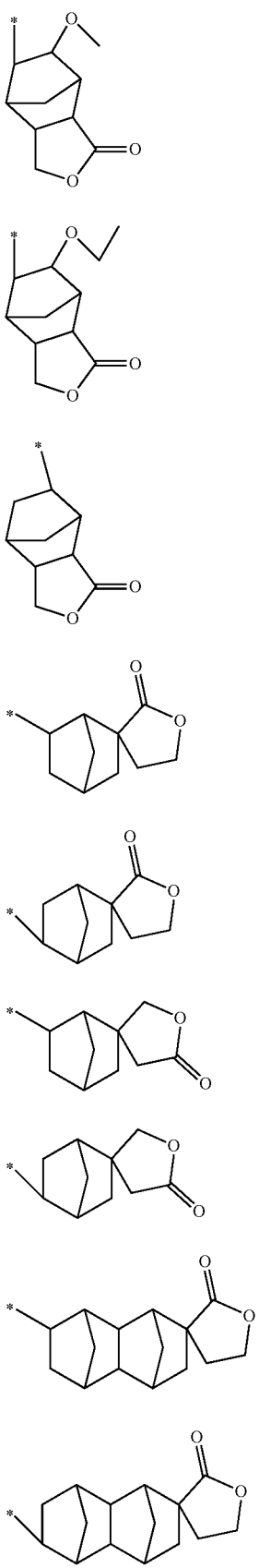
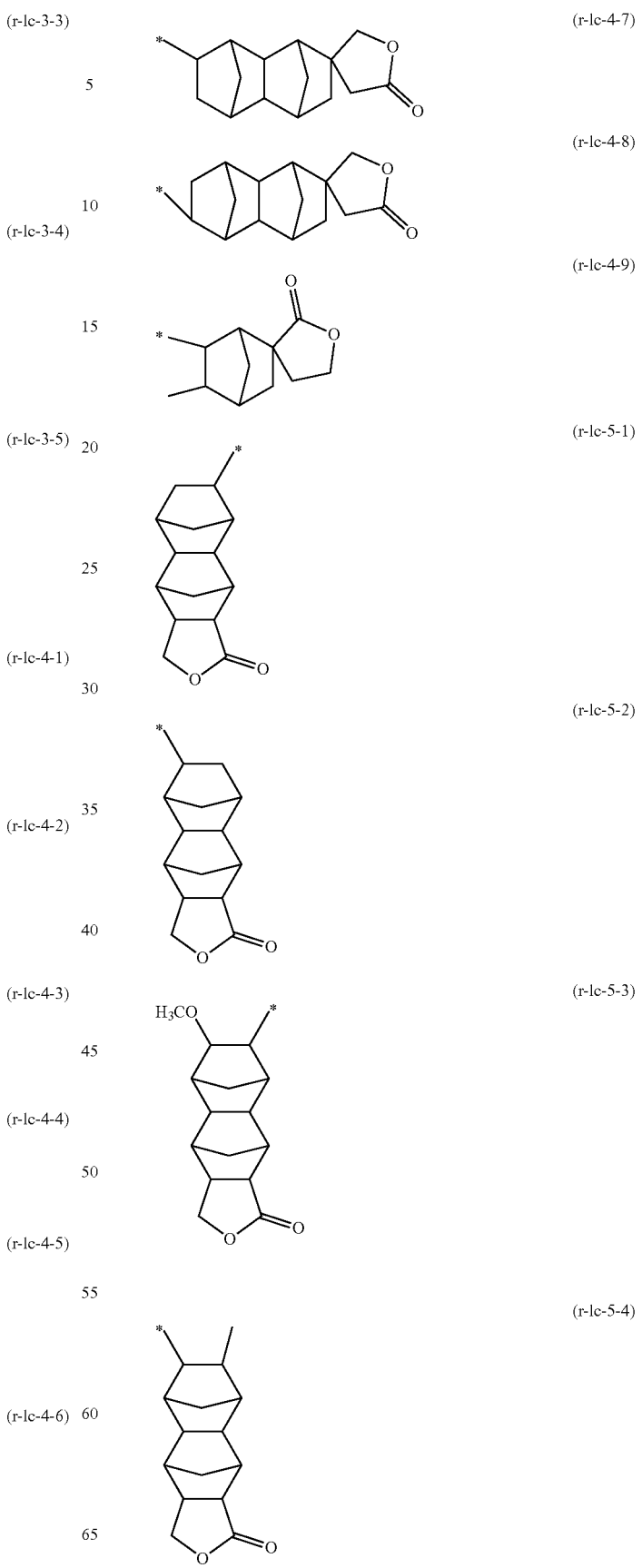

(r-lc-6-1)

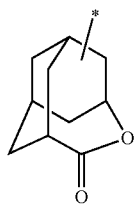

(r-lc-7-1)

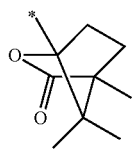

The "—SO₂-containing cyclic group" indicates a cyclic group having a ring containing —SO₂— in the ring structure thereof. Specifically, the —SO₂-containing cyclic group is a cyclic group in which the sulfur atom (S) in —SO₂— forms a part of the ring skeleton of the cyclic group. In a case where the ring containing —SO₂— in the ring skeleton thereof is counted as the first ring and the group contains only the ring, the group is referred to as a monocyclic group. Further, in a case where the group has other ring structures, the group is referred to as a polycyclic group regardless of the structures. The —SO₂-containing cyclic group may be a monocyclic group or a polycyclic group.

As the —SO₂-containing cyclic group, a cyclic group containing —O—SO₂— in the ring skeleton thereof, in other words, a cyclic group containing a sultone ring in which —O—S— in the —O—SO₂— group forms a part of the ring skeleton thereof is particularly preferable.

More specific examples of the —SO₂-containing cyclic group include groups represented by Formulae (a5-r-1) to (a5-r-4) shown below.

(a5-r-1)

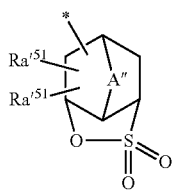

(a5-r-2)

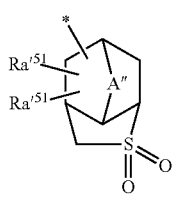

(a5-r-3)

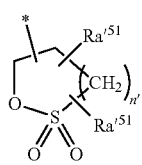

(a5-r-4)

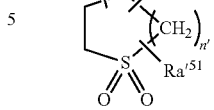

[In the formulae, each $Ra'^{51}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group. R" represents a hydrogen atom, an alkyl group, a lactone-containing cyclic group, a carbonate-containing cyclic group, or a —SO₂-containing cyclic group. A" represents an oxygen atom, a sulfur atom or an alkylene group having 1 to 5 carbon atoms which may contain an oxygen atom or a sulfur atom. n' represents an integer of 0 to 2.]

In Formulae (a5-r-1) and (a5-r-2), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group of $Ra'^{51}$ include the same groups as those described above in the explanation of $Ra'^{21}$ in Formulae (a2-r-1) to (a2-r-7).

Specific examples of the groups represented by Formulae (a5-r-1) to (a5-r-4) are shown below. In the formulae shown below, "Ac" represents an acetyl group.

(r-sl-1-1)

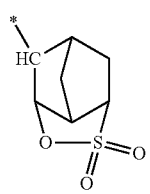

(r-sl-1-2)

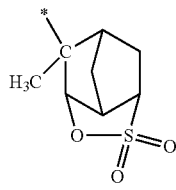

(r-sl-1-3)

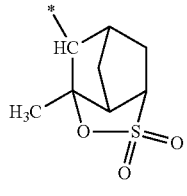

(r-sl-1-4)

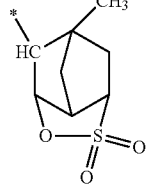

(r-sl-1-5)
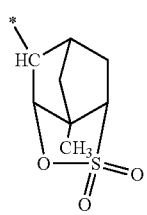
(r-sl-1-6)
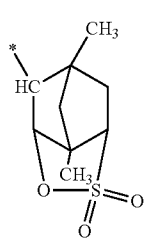
(r-sl-1-7)
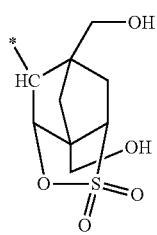
(r-sl-1-8)
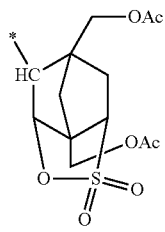
(r-sl-1-9)
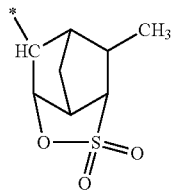
(r-sl-1-10)
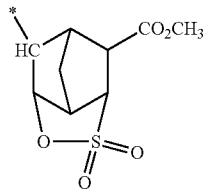
(r-sl-1-11)
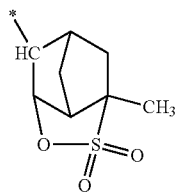
(r-sl-1-12)
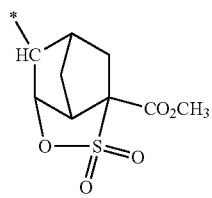
(r-sl-1-13)
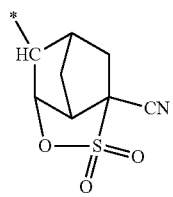
(r-sl-1-14)
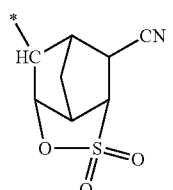
(r-sl-1-15)
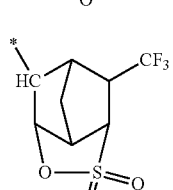
(r-sl-1-16)
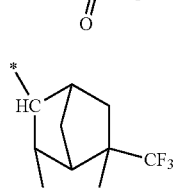
(r-sl-1-17)
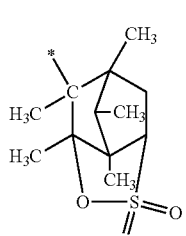
(r-sl-1-18)
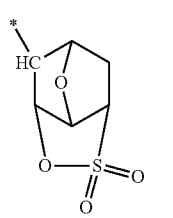

(r-sl-1-19)
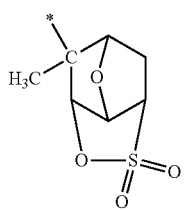
(r-sl-1-20)
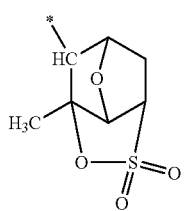
(r-sl-1-21)
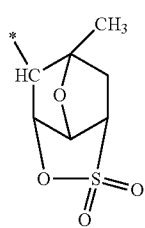
(r-sl-1-22)
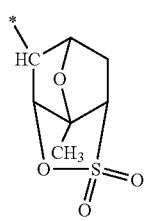
(r-sl-1-23)
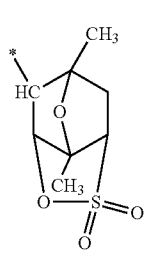
(r-sl-1-24)
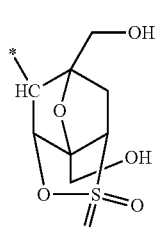
(r-sl-1-25)
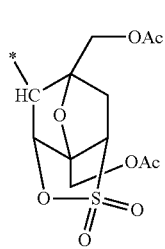
(r-sl-1-26)
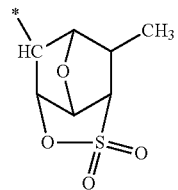
(r-sl-1-27)
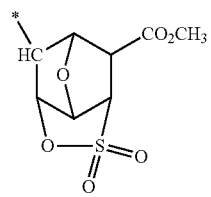
(r-sl-1-28)
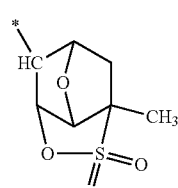
(r-sl-1-29)
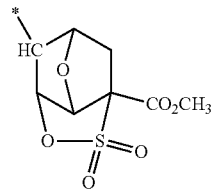
(r-sl-1-30)
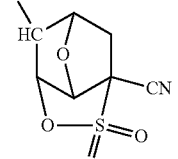
(r-sl-1-31)
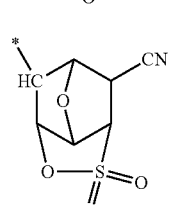
(r-sl-1-32)
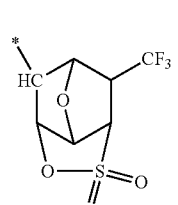
(r-sl-1-33)

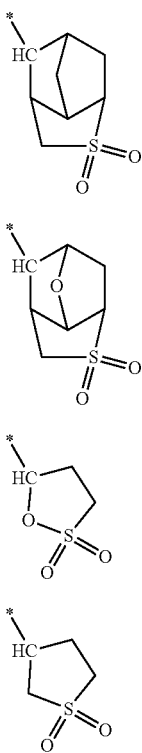

(r-sl-2-1)

(r-sl-2-2)

(r-sl-3-1)

(r-sl-4-1)

The "carbonate-containing cyclic group" indicates a cyclic group having a ring (a carbonate ring) containing —O—C(=O)—O— in the ring structure thereof. In a case where the carbonate ring is counted as the first ring and the group contains only the carbonate ring, the group is referred to as a monocyclic group. Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and an optional group may be used. Specific examples thereof include groups represented by Formulae (ax3-r-1) to (ax3-r-3) shown below.

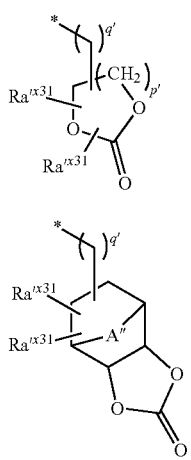

(ax3-r-1)

(ax3-r-2)

(ax3-r-3)

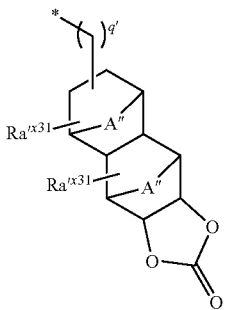

[In the formulae, each Ra$^{\prime x 31}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group. R" represents a hydrogen atom, an alkyl group, a lactone-containing cyclic group, a carbonate-containing cyclic group, or a —SO$_2$-containing cyclic group. A" represents an oxygen atom, a sulfur atom or an alkylene group having 1 to 5 carbon atoms which may contain an oxygen atom or a sulfur atom. p' represents an integer of 0 to 3, and q' represents 0 or 1.]

In Formulae (ax3-r-2) and (ax3-r-3), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group of Ra$^{\prime x 31}$ include the same groups as those described above in the explanation of Ra$^{\prime 21}$ in Formulae (a2-r-1) to (a2-r-7).

Specific examples of the groups represented by Formulae (ax3-r-1) to (ax3-r-3) are shown below.

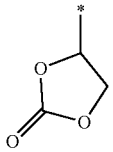

(r-cr-1-1)

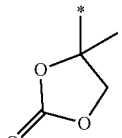

(r-cr-1-2)

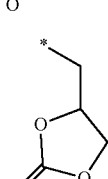

(r-cr-1-3)

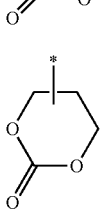

(r-cr-1-4)

(r-cr-1-5)
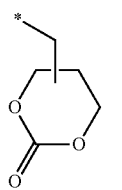
(r-cr-1-6)
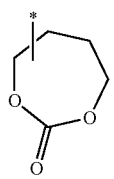
(r-cr-1-7)
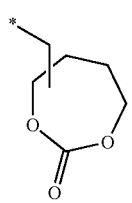
(r-cr-2-1)
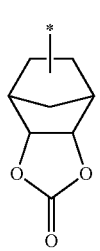
(r-cr-2-2)
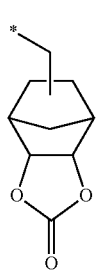
(r-cr-2-3)
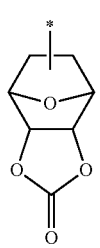
(r-cr-2-4)
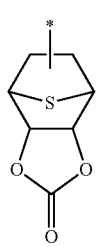
(r-cr-3-1)
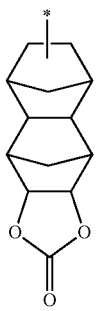
(r-cr-3-2)
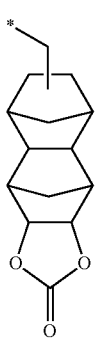
(r-cr-3-3)
(r-cr3-4)
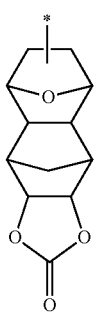
(r-cr-3-5)
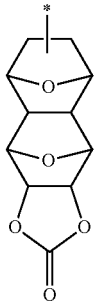
As the constitutional unit (a2), a constitutional unit derived from an acrylic acid ester in which the hydrogen atom bonded to the carbon atom at the α-position may be substituted with a substituent is preferable.

Specific preferred examples of such a constitutional unit (a2) include a constitutional unit represented by Formula (a2-1) shown below.

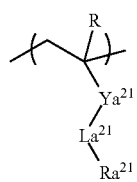
(a2-1)

In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO— or —CONHCS—. R' represents a hydrogen atom or a methyl group;

provided that, in a case where $La^{21}$ represents —O—, $Ya^{21}$ does not represents —CO—. $Ra^{21}$ represents a lactone-containing cyclic group, a carbonate-containing cyclic group, or a —$SO_2$-containing cyclic group.]

In Formula (a2-1), R has the same definition as described above.

The divalent linking group of $Ya^{21}$ is not particularly limited, and suitable examples thereof include a divalent hydrocarbon group which may have a substituent and a divalent linking group having hetero atoms.

Divalent Hydrocarbon Group which may have Substituent:

In a case where $Ya^{21}$ represents a divalent hydrocarbon group which may have a substituent, the hydrocarbon group may be an aliphatic hydrocarbon group or an aromatic hydrocarbon group.

Aliphatic Hydrocarbon Group of $Ya^{21}$

The aliphatic hydrocarbon group indicates a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The branched aliphatic hydrocarbon group preferably has 3 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples thereof include alkylalkylene groups, for example, alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$— and —$CH_2$CH($CH_3$)$CH_2$—; and alkyltetramethylene groups such as —CH($CH_3$)$CH_2CH_2CH_2$— and —$CH_2$CH($CH_3$)$CH_2CH_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. As the linear or branched aliphatic hydrocarbon group, the same groups as those described above can be used.

The cyclic aliphatic hydrocarbon group preferably has 3 to 20 carbon atoms and more preferably 3 to 12 carbon atoms.

The cyclic aliphatic hydrocarbon group may be a polycyclic group or a monocyclic group. As the monocyclic alicyclic hydrocarbon group, a group in which two hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Examples of the polycycloalkane include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group serving as the substituent is preferably an alkyl group having 1 to 5 carbon atoms, and a methyl group, an ethyl group, a propyl group, an n-butyl group, or a tert-butyl group are particularly preferable.

The alkoxy group serving as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom serving as the substituent include a fluorine atom, a chlorine atom, a bromine atom, and an iodine atom, and a fluorine atom is preferable.

Examples of the halogenated alkyl group serving as the substituent include groups in which some or all hydrogen atoms in the above-described alkyl groups have been substituted with the above-described halogen atoms.

In the cyclic aliphatic hydrocarbon group, some carbon atoms constituting the ring structure thereof may be substituted with a substituent containing a hetero atom. As the substituent containing a hetero atom, —O—, —C(=O)—O—, —S—, —S(=O)$_2$—, or —S(=O)$_2$—O— is preferable.

Aromatic Hydrocarbon Group of Ya$^{21}$

The aromatic hydrocarbon group is a hydrocarbon group having at least one aromatic ring.

The aromatic ring is not particularly limited as long as it is a cyclic conjugated system having (4n+2)π electrons, and may be monocyclic or polycyclic. The aromatic ring preferably has 5 to 30 carbon atoms, more preferably 5 to 20 carbon atoms, still more preferably 6 to 15 carbon atoms, and most preferably 6 to 12 carbon atoms. Here, the number of carbon atoms in a substituent is not included in the number of carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group include a group in which two hydrogen atoms have been removed from the above-described aromatic hydrocarbon ring or aromatic hetero ring (an arylene group or a heteroarylene group); a group in which two hydrogen atoms have been removed from an aromatic compound having two or more aromatic rings (biphenyl, fluorene or the like); and a group in which one hydrogen atom of a group (an aryl group or a heteroaryl group) obtained by removing one hydrogen atom from the above-described aromatic hydrocarbon ring or aromatic hetero ring has been substituted with an alkylene group (a group in which one hydrogen atom has been removed from the aryl group in the above-described arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aryl group or heteroaryl group preferably has 1 to 4 carbon atoms, more preferably 1 or 2 carbon atoms, and particularly preferably 1 carbon atom.

With respect to the aromatic hydrocarbon group, the hydrogen atom in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group serving as the substituent is preferably an alkyl group having 1 to 5 carbon atoms, and a methyl group, an ethyl group, a propyl group, an n-butyl group, or a tert-butyl group is more preferable.

As the alkoxy group, the halogen atom, and the halogenated alkyl group serving as the substituents, the same groups as the above-described substituent groups for substituting a hydrogen atom in the cyclic aliphatic hydrocarbon group can be exemplified.

Divalent Linking Group Containing Hetero Atom

In a case where Ya$^{21}$ represents a divalent linking group containing a hetero atom, preferred examples of the linking group include —O—, —C(=O)—O—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by Formula: —Y$^{21}$—O—Y$^{22}$—, —Y$^{21}$—O—, —Y$^{21}$—C(=O)$_2$—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represent a divalent hydrocarbon group which may have a substituent, O represents an oxygen atom, and m'' represents an integer of 0 to 3].

In a case where the divalent linking group containing a hetero atom is —C(=O)—NH—, —C(=O)—NH—C(=O)—, —NH— or —NH—C(=NH)—, H may be substituted with a substituent such as an alkyl group, an acyl group, or the like. The substituent (an alkyl group, an acyl group, or the like) preferably has 1 to 10 carbon atoms, more preferably 1 to 8 carbon atoms, and most preferably 1 to 5 carbon atoms.

In Formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$—, Y$^{21}$ and Y$^{22}$ each independently represent a divalent hydrocarbon group which may have a substituent. Examples of the divalent hydrocarbon group include the same groups as those described above as the "divalent hydrocarbon group which may have a substituent" in the explanation of the above-described divalent linking group.

As Y$^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As Y$^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m'' represents an integer of 0 to 3, preferably an integer of 0 to 2, more preferably 0 or 1, and particularly preferably 1. In other words, it is particularly preferable that the group represented by Formula —[Y$^{21}$—C(=O)—O]$_{m''}$—Y$^{22}$— be a group represented by Formula —Y$^{21}$—C(=O)—O—Y$^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

As Ya$^{21}$, a single bond, an ester bond [—C(=O)—O—], an ether bond (—O—), a linear or branched alkylene group, or a combination of these is preferable, and a single bond is more preferable.

In Formula (a2-1), La$^{21}$ represents —O—, —COO—, —CON(R')—, —OCO—, —CONHCO—, or —CONHCS—.

R' represents a hydrogen atom or a methyl group.

Here, in a case where La$^{21}$ represents —O—, Ya$^{21}$ does not represent —CO—. It is preferable that La$^{21}$ represent —COO—.

In Formula (a2-1), $Ra^{21}$ represents a lactone-containing cyclic group, a —$SO_2$-containing cyclic group, or a carbonate-containing cyclic group.

Preferred examples of the lactone-containing cyclic group, the —$SO_2$-containing cyclic group, and the carbonate-containing cyclic group of $Ra^{21}$ include groups represented by Formulae (a2-r-1) to (a2-r-7), groups represented by Formulae (a5-r-1) to (a5-r-4), and groups represented by Formulae (ax3-r-1) to (ax3-r-3).

Among the examples, $Ra^{21}$ preferably represents a lactone-containing cyclic group or a —$SO_2$-containing cyclic group and more preferably a group represented by Formula (a2-r-1), (a2-r-2), (a2-r-6) or (a5-r-1). Specifically, a group represented by any of chemical Formulae (r-lc-1-1) to (r-lc-1-7), (r-lc-2-1) to (r-lc-2-18), (r-lc-6-1), (r-sl-1-1), and (r-sl-1-18) is still more preferable.

Among these, $Ra^{21}$ preferably represents a lactone-containing cyclic group, more preferably a group represented by Formula (a2-r-1) or (a2-r-2), and still more preferably a group represented by any of Chemical Formulae (r-lc-1-1) to (r-lc-1-7) and (r-lc-2-1) to (r-lc-2-7).

The constitutional unit (a2) included in the component (A1) may be used alone or two or more kinds thereof may be used.

In a case where the component (A1) has the constitutional unit (a2), the proportion of the constitutional unit (a2) in the component (A1) is preferably in a range of 1% to 80% by mole, more preferably in a range of 10% to 70% by mole, still more preferably in a range of 20% to 65% by mole, and even more preferably in a range of 40% to 60% by mole with respect to the total amount (100% by mole) of all constitutional units constituting the component (A1).

In a case where the proportion of the constitutional unit (a2) is greater than or equal to the lower limit of the above preferable range, the effect obtained by allowing the component (A1) to contain the constitutional unit (a2) can be satisfactorily achieved, and the lithography characteristics of enhancing the sensitivity, CDU, and the like are improved. On the other hand, in a case where the proportion of the constitutional unit (a2) is less than or equal to the upper limit of the above preferable range, the constitutional unit (a2) and other constitutional units can be balanced, and various lithography characteristics and the pattern shape can be improved.

[Constitutional Unit (a3)]

The component (a3) is a constitutional unit (here, a constitutional unit corresponding to the above-described constitutional unit (a1) or (a2) is excluded) containing a polar group-containing resin hydrocarbon group.

The component (A1) may have a constitutional unit (a3). In a case where the component (A1) includes the constitutional unit (a3), the hydrophilicity of the component (A1) is enhanced, and this is considered to contribute to improvement of the resolution.

Examples of the polar group include a hydroxyl group, a cyano group, a carboxyl group, or a hydroxyalkyl group in which some hydrogen atoms of the alkyl group have been substituted with fluorine atoms. Among these, a hydroxyl group is particularly preferable.

Examples of the aliphatic hydrocarbon group include linear or branched hydrocarbon groups (preferably alkylene groups) having 1 to 10 carbon atoms, and cyclic aliphatic hydrocarbon groups (cyclic groups). The cyclic group may be a monocyclic group or a polycyclic group. For example, these cyclic groups can be selected appropriately from the multitude of groups that have been proposed for the resins of resist compositions for ArF excimer lasers. The cyclic group is preferably a polycyclic group and more preferably a polycyclic group having 7 to 30 carbon atoms.

Among the examples, constitutional units derived from an acrylic acid ester that include an aliphatic polycyclic group containing a hydroxyl group, a cyano group, a carboxyl group, or a hydroxyalkyl group in which some hydrogen atoms of the alkyl group have been substituted with fluorine atoms are particularly preferable. Examples of the polycyclic group include groups in which two or more hydrogen atoms have been removed from a bicycloalkane, tricycloalkane, tetracycloalkane or the like. Specific examples thereof include groups in which two or more hydrogen atoms have been removed from a polycycloalkane such as adamantane, norbornane, isobornane, tricyclodecane or tetracyclododecane. Among these polycyclic groups, groups in which two or more hydrogen atoms have been removed from adamantane, groups in which two or more hydrogen atoms have been removed from norbornane or groups in which two or more hydrogen atoms have been removed from tetracyclododecane are preferred industrially.

The constitutional unit (a3) is not particularly limited as long as the constitutional unit contains a polar group-containing aliphatic hydrocarbon group, and an optional constitutional unit may be used.

The constitutional unit (a3) is a constitutional unit derived from an acrylic acid ester in which the hydrogen atom bonded to the carbon atom at the α-position may be substituted with a substituent, and a constitutional unit containing a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, the constitutional unit (a3) is preferably a constitutional unit derived from a hydroxyethyl ester of acrylic acid. On the other hand, in a case where the hydrocarbon group is a polycyclic group, a constitutional unit represented by Formula (a3-1), a constitutional unit represented by Formula (a3-2), and a constitutional unit represented by Formula (a3-3) shown below are preferable.

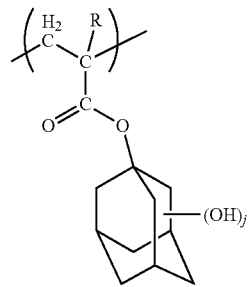

(a3-1)

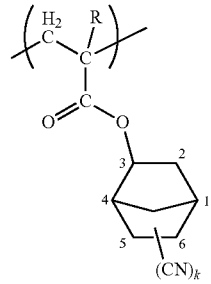

(a3-2)

-continued

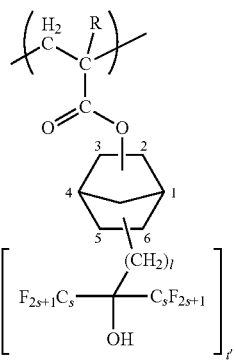
(a3-3)

[In the formulae, R has the same definition as described above, j represents an integer of 1 to 3, k represents an integer of 1 to 3, t' represents an integer of 1 to 3, l represents an integer of 1 to 5, and s represents an integer of 1 to 3.]

In Formula (a3-1), j preferably represents 1 or 2 and more preferably 1. In a case where j represents 2, it is preferable that the hydroxyl groups be bonded to the 3rd and 5th positions of the adamantyl group. In a case where j represents 1, it is preferable that the hydroxyl group be bonded to the 3rd position of the adamantyl group.

j preferably represents 1, and it is particularly preferable that the hydroxyl group be bonded to the 3rd position of the adamantyl group.

In Formula (a3-2), k preferably represents 1. The cyano group is preferably bonded to the 5th or 6th position of the norbornyl group.

In Formula (a3-3), t' preferably represents 1. l preferably represents 1. s preferably represents 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbomyl group.

The constitutional unit (a3) included in the component (A1) may be used alone or two or more kinds thereof may be used.

In a case where the component (A1) has the constitutional unit (a3), the proportion of the constitutional unit (a3) is preferably in a range of 5% to 50% by mole, more preferably in a range of 5% to 40% by mole, and still more preferably in a range of 5% to 25% by mole with respect to the total amount (100% by mole) of all constitutional units constituting the component (A1).

By setting the proportion of the constitutional unit (a3) to be greater than or equal to the lower limit of the above-described preferable range, the effects obtained by allowing the constitutional unit (a3) to be contained in the component (A1) can be sufficiently obtained. Further, by setting the proportion of the constitutional unit (a3) to be lower than or equal to the upper limit of the above-described preferable range, the constitutional unit (a3) and other constitutional units can be balanced.

[Constitutional Unit (a4)]

The constitutional unit (a4) is a constitutional unit containing an acid undissociable aliphatic cyclic group.

The component (A1) may further have a constitutional unit (a4). In a case where the component (A1) includes the constitutional unit (a4), the dry etching resistance of the resist pattern to be formed is improved. Further, the hydrophobicity of the component (A1) is improved. An increase in the hydrophobicity is considered to contribute to improvement of the resolution, the shape of the resist pattern, and the like particularly in a case of a solvent developing process.

The "acid undissociable aliphatic cyclic group" in the constitutional unit (a4) indicates a cyclic group which remains in the constitutional unit without being dissociated even at the time of an action of an acid in a case where an acid is generated in the resist composition upon exposure (for example, an acid is generated from the component (B) described below).

As the constitutional unit (a4), a constitutional unit which contains an acid undissociable aliphatic cyclic group and is also derived from an acrylic acid ester is preferable. As the cyclic group, any of the multitude of conventional polycyclic groups used in the resin component of resist compositions for ArF excimer lasers or KrF excimer lasers (preferably for ArF excimer lasers) can be used.

From the viewpoint of the industrial availability and the like, at least one polycyclic group selected from among a tricyclodecyl group, an adamantyl group, a tetracyclododecyl group, an isobornyl group, and a norbornyl group is particularly preferable. These polycyclic groups may include a linear or branched alkyl group having 1 to 5 carbon atoms as a substituent.

Specific examples of the constitutional unit (a4) include constitutional units represented by Formulae (a4-1) to (a4-7) shown below.

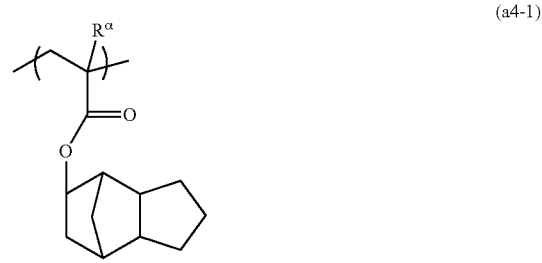
(a4-1)

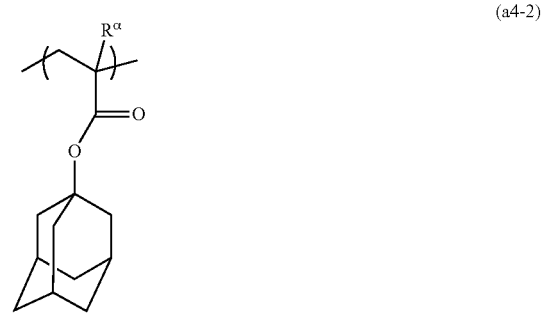
(a4-2)

(a4-3)

-continued

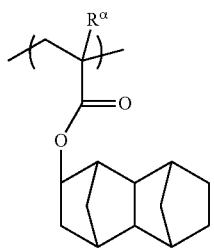
(a4-4)

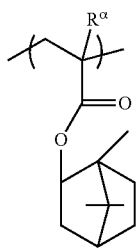
(a4-5)

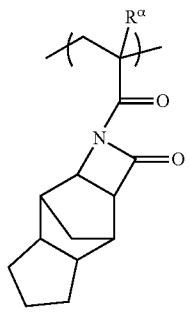
(a4-6)

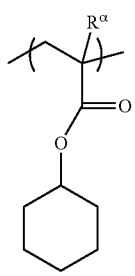
(a4-7)

[In the formulae, $R^\alpha$ has the same definition as described above.]

The constitutional unit (a4) included in the component (A1) may be used alone or two or more kinds thereof may be used.

In a case where the component (A1) has the constitutional unit (a4), the proportion of the constitutional unit (a4) is preferably in a range of 1% to 30% by mole and more preferably in a range of 3% to 20% by mole with respect to the total amount (100% by mole) of all constitutional units constituting the component (A1).

By setting the proportion of the constitutional unit (a4) to be greater than or equal to the lower limit of the above-described preferable range, the effects obtained by allowing the constitutional unit (a4) to be contained in the component (A1) can be sufficiently obtained. Further, by setting the proportion of the constitutional unit (a4) to be lower than or equal to the upper limit of the above-described preferable range, the constitutional unit (a4) and other constitutional units can be balanced.

The component (A1) can be obtained by polymerizing a monomer from which each constitutional unit is derived through known radical polymerization performed using a radical polymerization initiator such as azobisisobutyronitrile (AIBN) or dimethyl azobisisobutyrate.

Further, a —$C(CF_3)_2$—OH group may be introduced into the terminal of the component (A1) during the polymerization using a chain transfer agent such as HS—$CH_2$—$CH_2$—$CH_2$—$C(CF_3)_2$—OH together. As described above, a copolymer into which a hydroxyalkyl group, formed by substitution of some hydrogen atoms in the alkyl group with fluorine atoms, has been introduced is effective for reducing development defects and reducing line edge roughness (LER: uneven irregularities of a line side wall).

Preferred examples of the component (A1) include a polymer compound formed of repeating structures of the constitutional unit (a0) and the constitutional unit (a2) and a polymer compound formed of repeating structures of the constitutional unit (a0), the constitutional unit (a2), and the constitutional unit (a3).

The weight average molecular weight (Mw) (in terms of polystyrene determined by gel permeation chromatography) of the component (A1) is not particularly limited, but is preferably in a range of 1,000 to 50,000, more preferably in a range of 1,500 to 30,000, and most preferably in a range of 2,000 to 20,000. In a case where the weight average molecular weight thereof is less than or equal to the upper limit of the above-described range, the resist composition exhibits satisfactory solubility in a solvent for a resist to be used as a resist. Meanwhile, in a case where the weight average molecular weight is greater than or equal to the lower limit of the above-described range, dry etching resistance and the cross-sectional shape of the resist pattern become excellent.

The component (A1) may be used alone or in a combination of two or more kinds thereof.

The proportion of the component (A1) in the component (A) is preferably 25% by mass or greater, more preferably 50% by mass or greater, still more preferably 75% by mass or greater, or may be 100% by mass with respect to the total mass of the component (A). In a case where the proportion thereof is 25% by mass or greater, a resist pattern with excellent lithography characteristics of enhancing the sensitivity, CDU, and the like is easily formed.

«Component (A2)»

In the resist composition of the present embodiment, a base material component (hereinafter, referred to as a "component (A2)") which does not correspond to the component (A1) and whose solubility in a developing solution is changed due to the action of an acid may be used in combination as the component (A).

The component (A2) is not particularly limited, and may be optionally selected from those known in the related art as the base material components for a chemically amplified resist composition.

In the component (A2), a high molecular weight compound or a low molecular weight compound may be used alone or in a combination of two or more kinds thereof.

In the resist composition of the present embodiment, the content of the component (A) may be appropriately adjusted according to the film thickness of a resist intended to be formed.

<Acid Generator Component; Component (B)>

In the present embodiment, the acid generator component (B) contains an acid generator (B1) (hereinafter, also referred to as a "component (B1)") formed of a compound represented by Formula (b1).

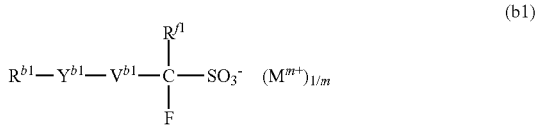
(b1)

[In the formula, $R^{b1}$ represents a monovalent hydrocarbon group which has a steroid skeleton and 17 to 50 carbon atoms, where the steroid skeleton contains at least one hydroxyl group and may have a substituent other than the hydroxyl group. $Y^{b1}$ represents a divalent linking group having a hetero atom or a single bond. $V^{b1}$ represents an alkylene group, a fluorinated alkylene group, or a single bond. $R^{f1}$ represents a hydrogen atom, a fluorine atom, or a fluorinated alkyl group having 1 to 5 carbon atoms. m represents an integer of 1 or greater. $M^{m+}$ represents an m-valent organic cation.]

[Anion moiety($R^{b1}$—$Y^{b1}$—$V^{b1}$—$CFR^{f1}$—$SO_3^-$)]

In Formula (b1), $R^{b1}$ represents a monovalent hydrocarbon group which has a steroid skeleton and 17 to 50 carbon atoms. Here, the steroid skeleton has at least one hydroxyl group and may have a substituent other than the hydroxyl group.

Here, "steroid skeleton" indicates a skeleton having a ring structure represented by Chemical Formula (St), in which three 6-membered rings and one 5-membered ring are fused.

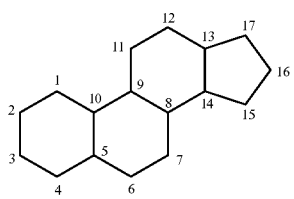
(St)

In Formula (St), the numbers adjacent to the carbon atoms indicate the carbon numbers. In mention of the position of the carbon atom in the steroid skeleton in the present specification, the carbon number shown in Formula (St) is used.

The steroid skeleton included in the monovalent hydrocarbon group of $R^{b1}$ contains at least one hydroxyl group. In other words, in the steroid skeleton in $R^{b1}$, at least one hydrogen atom in the ring structure represented by Formula (St) is substituted with one hydroxyl group. In the ring structure represented by Formula (St), the carbon atom containing a hydroxyl group is not particularly limited, and may be preferably a carbon atom at at least one position selected from the group consisting of the 3-position, the 7-position, and the 12-position. Alternatively, the carbon atom at at least one position selected from the 3-position, the 5-position, and the 14-position may contain a hydroxyl group.

The number of hydroxyl groups contained in the steroid skeleton is not particularly limited, and the number thereof may be in a range of 1 to 10, 1 to 5, or 1 to 3. The number of hydroxyl groups is preferably in a range of 1 to 3, more preferably 2 or 3, and still more preferably 3.

Preferred examples thereof include a structure having hydroxyl groups at any one position of the 3-position, the 7-position, and the 12-position in the ring structure represented by Formula (St), a structure having hydroxyl groups at any two positions of the 3-position, the 7-position, and the 12-position in the ring structure represented by Formula (St), and a structure having hydroxyl groups at all three positions of the 3-position, the 7-position, and the 12-position in the ring structure represented by Formula (St).

Other preferred examples include a structure having hydroxyl groups at any one position of the 3-position, the 5-position, and the 14-position in the ring structure represented by Formula (St), a structure having hydroxyl groups at any two positions of the 3-position, the 5-position, and the 14-position in the ring structure represented by Formula (St), and a structure having hydroxyl groups at all three positions of the 3-position, the 5-position, and the 14-position in the ring structure represented by Formula (St).

The steroid skeleton in $R^{b1}$ may have a substituent other than a hydroxyl group. For example, an alkyl group (preferably an alkyl group having 1 to 5 carbon atoms and particularly preferably a methyl group), a carboxy group, an oxo group (=O), an alkoxy group, an alkylcarbonyloxy group (preferably an acetoxy group), a formyloxy group (HC(=O)—O—), or a lactone-containing cyclic group may be bonded to the ring structure represented by Chemical Formula (St). The lactone-containing cyclic group may contain one or more double bonds in the ring structure. The number of double bonds is not particularly limited, and is preferably 1.

In a case where the steroid skeleton as $R^{b1}$ contains an alkyl group serving as a substituent, the position of the alkyl group is not particularly limited, and examples of the position include the 10-position, the 13-position, and the 17-position. It is preferable that the alkyl group be present at the 10-position and the 13-position.

In a case where the steroid skeleton as $R^{b1}$ contains a substituent other than an alkyl group and a hydroxyl group, the position of the substituent is not particularly limited, and examples of the position include the 3-position, the 7-position, and the 12-position. The substituent may be present at any one or two of the 3-position, the 7-position, and the 12-position. Further, in a case where the substituent is a lactone-containing cyclic group, the substituent may be present at the 17-position.

The number of carbon atoms of $R^{b1}$ is in a range of 17 to 50, preferably in a range of 17 to 40, more preferably in a range of 17 to 30, and particularly preferably in a range of 17 to 22.

Here, the number of carbon atoms of $R^{b1}$ includes the number of carbon atoms constituting the steroid skeleton and the number of carbon atoms in the substituent bonded to the steroid skeleton.

It is preferable that $R^{b1}$ represent a group represented by Formula ($R^{b1}$-1) or ($R^{b1}$-2). Further, in a case where an enantiomer or a diastereomer is present, the following formulae represent these stereoisomers and include those stereoisomers.

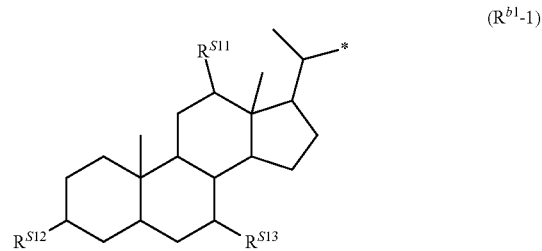
($R^{b1}$-1)

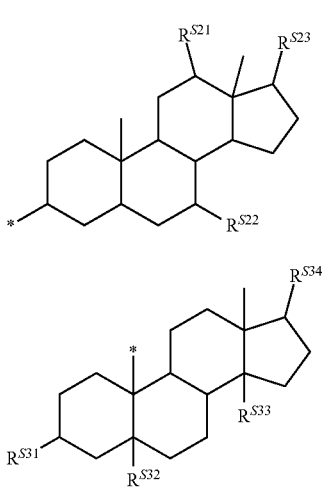

(R$^{b1}$-2)

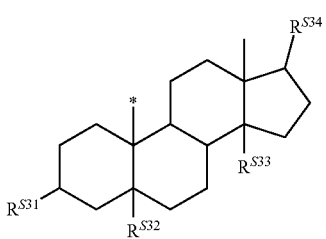

(R$^{b1}$-3)

[In Formula (R$^{b1}$-1), R$^{S11}$, R$^{S12}$, and R$^{S13}$ each independently represent a hydrogen atom, a hydroxyl group, or a substituent having a hetero atom other than a hydroxyl group. Here, at least one of R$^{S11}$, R$^{S12}$, and R$^{S13}$ represents a hydroxyl group. In Formula (R$^{b1}$-2), R$^{S21}$ and R$^{S22}$ each independently represent a hydrogen atom, a hydroxyl group, or a substituent having a hetero atom other than a hydroxyl group. Here, at least one of R$^{S21}$ and R$^{S22}$ represents a hydroxyl group. R$^{S23}$ represents an alkyl group which may have a hetero atom. In Formula (R$^{b1}$-3), R$^{S31}$, R$^{S32}$, and R$^{S33}$ each independently represent a hydrogen atom, a hydroxyl group, or a substituent having a hetero atom other than a hydroxyl group. Here, at least one of R$^{S31}$, R$^{S32}$, and R$^{S33}$ represents a hydroxyl group. R$^{S34}$ represents a lactone-containing cyclic group. The symbol "*" represents a bonding site to be bonded to Y$^{b1}$ in Formula (b1).]

In Formula (R$^{b1}$-1), examples of the substituent having a hetero atom other than a hydroxyl group of R$^{S11}$ to R$^{S13}$ include a carboxy group, an oxo group (═O), an alkoxy group, an alkylcarbonyloxy group, and a formyloxy group (HC(═O)—O—). Among these, an oxo group, an alkylcarbonyloxy group (preferably an acetoxy group), or a formyloxy group is preferable, and an oxo group is particularly preferable. In Formula (R$^{b1}$-2), examples of the substituent having a hetero atom other than a hydroxyl group of R$^{S21}$ and R$^{S22}$ are the same as described above. Further, in Formula (R$^{b1}$-3), examples of the substituent having a hetero atom other than a hydroxyl group of R$^{S31}$ to R$^{S33}$ are the same as described above.

In Formula (R$^{b1}$-1), at least one of R$^{S11}$ to R$^{S13}$ represents a hydroxyl group. It is preferable that any two or more of R$^{S11}$ to R$^{S13}$ represent a hydroxyl group and more preferable that all of R$^{S11}$ to R$^{S13}$ represent a hydroxyl group. It is preferable that any of R$^{S11}$ to R$^{S13}$ that does not represent a hydroxyl group represent a hydrogen atom.

In Formula (R$^{b1}$-2), at least one of R$^{S21}$ and R$^{S22}$ represents a hydroxyl group, and it is preferable that both of R$^{S21}$ and R$^{S22}$ represent a hydroxyl group. It is preferable that any one of R$^{S21}$ and R$^{S22}$ that does not represent a hydroxyl group represent a hydrogen atom.

In Formula (R$^{b1}$-2), R$^{S23}$ represents an alkyl group which may have a hetero atom. The alkyl group may be linear or branched. As the alkyl group, an alkyl group having 1 to 10 carbon atoms is preferable. Examples of the hetero atom in the alkyl group include an oxygen atom, a nitrogen atom, and a sulfur atom. Among these, an oxygen atom is preferable. Preferred examples of the group of R$^{S23}$ include an alkyl group having 1 to 10 carbon atoms and a group in which some carbon chains of the alkyl group have been substituted with ester bonds (—CO—O—).

In Formula (R$^{b1}$-3), at least one of R$^{S31}$ to R$^{S33}$ represents a hydroxyl group. Any two or more of R$^{S31}$ to R$^{S33}$ represent a hydroxyl group and it is more preferable that all of R$^{S31}$ to R$^{S33}$ represent a hydroxyl group. It is preferable that any of R$^{S31}$ to R$^{S33}$ that does not represent a hydroxyl group represent a hydrogen atom.

In Formula (R$^{b1}$-3), R$^{S34}$ represents a lactone-containing cyclic group. The lactone-containing cyclic group may have one or more double bonds in the ring structure. Examples of the lactone-containing cyclic group include those having one or more double bonds in the ring structure of a group represented by Formula (a2-r-1). The number of double bonds is preferably 1.

Among the examples, it is preferable that R$^{b1}$ represent a group represented by Formula (R$^{b1}$-1).

Specific examples of the group of R$^{b1}$ are shown below, but the present invention is not limited thereto. In the formulae, the symbol "*" represents a bonding site to be bonded to Y$^{b1}$ in Formula (b1).

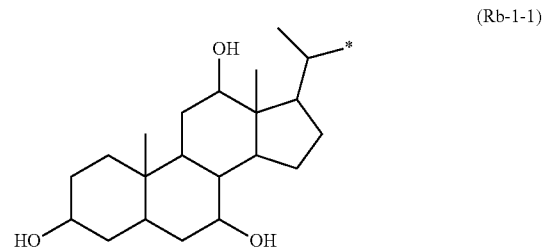

(Rb-1-1)

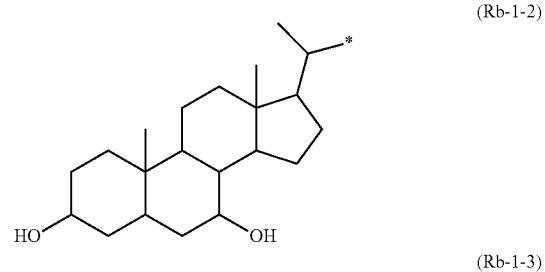

(Rb-1-2)

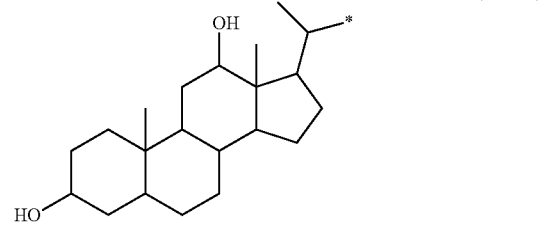

(Rb-1-3)

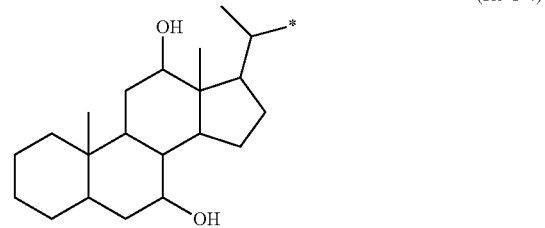

(Rb-1-4)

(Rb-1-5)
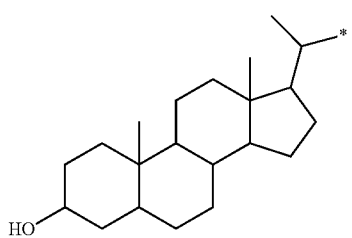
(Rb-1-6)
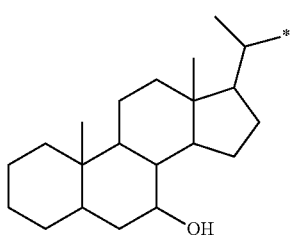
(Rb-1-7)
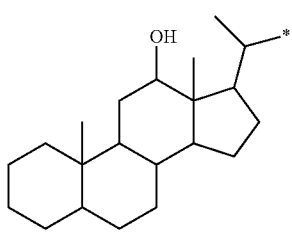
(Rb-1-8)
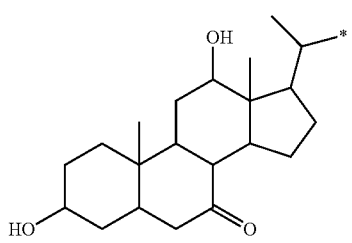
(Rb-1-9)
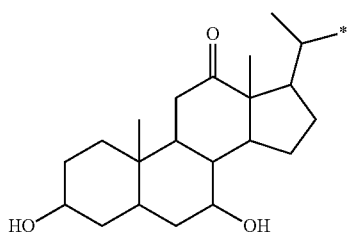
(Rb-1-10)
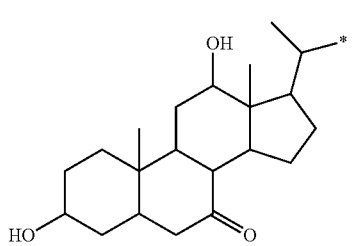
(Rb-1-11)
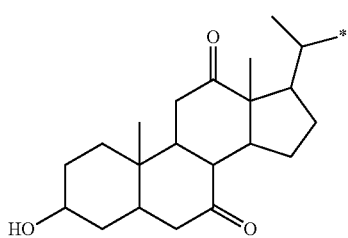
(Rb-1-12)
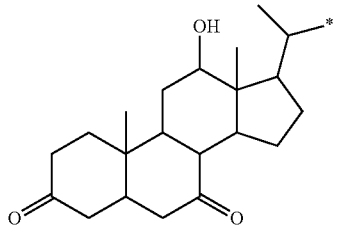
(Rb-1-13)
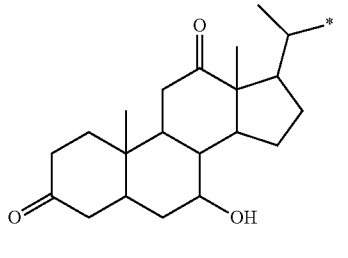
(Rb-1-14)
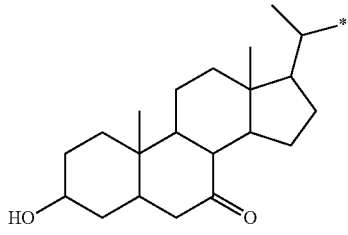
(Rb-1-15)
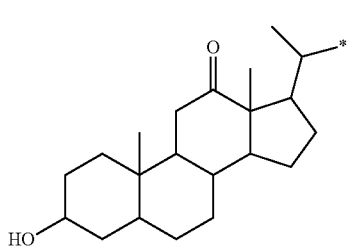
(Rb-1-16)
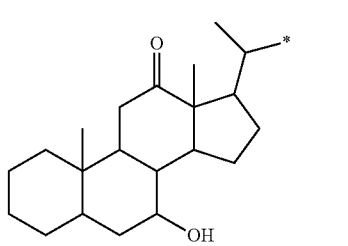

(Rb-1-17) 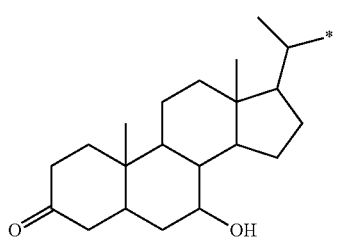
(Rb-1-18) 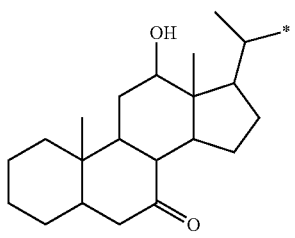
(Rb-1-19) 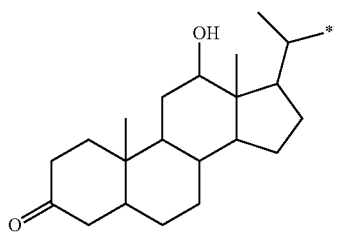
(Rb-1-20) 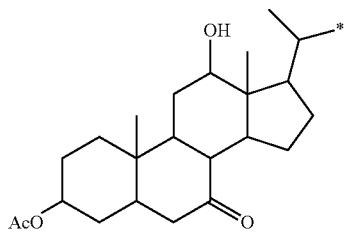
(Rb-1-21) 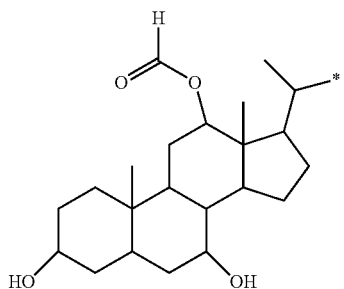
(Rb-1-22) 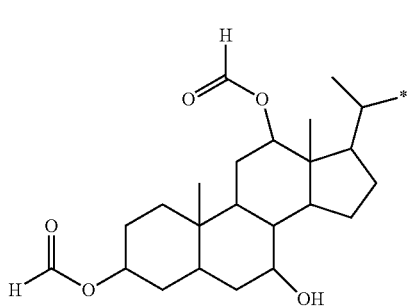
(Rb-1-23) 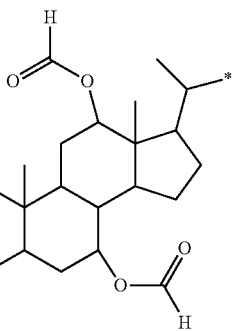
(Rb-1-24) 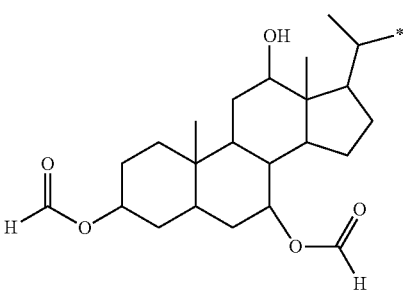
(Rb-1-25) 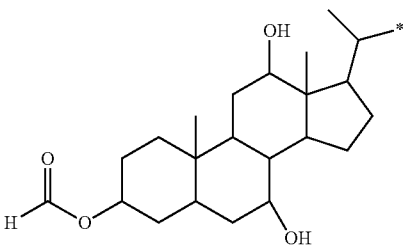
(Rb-1-26) 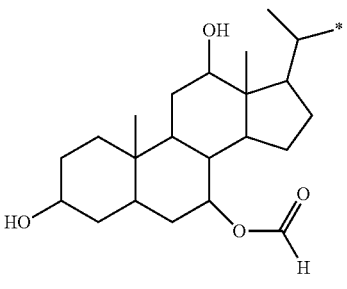
(Rb-1-27) 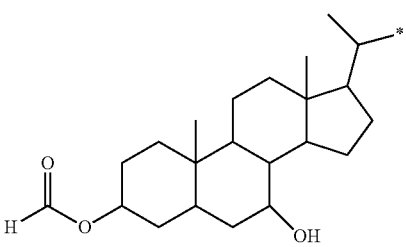

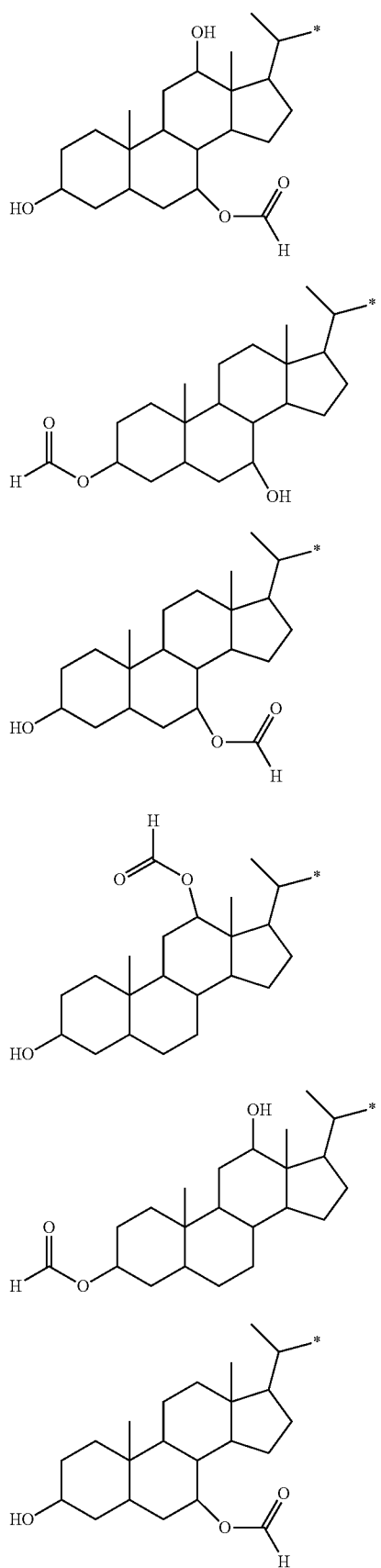
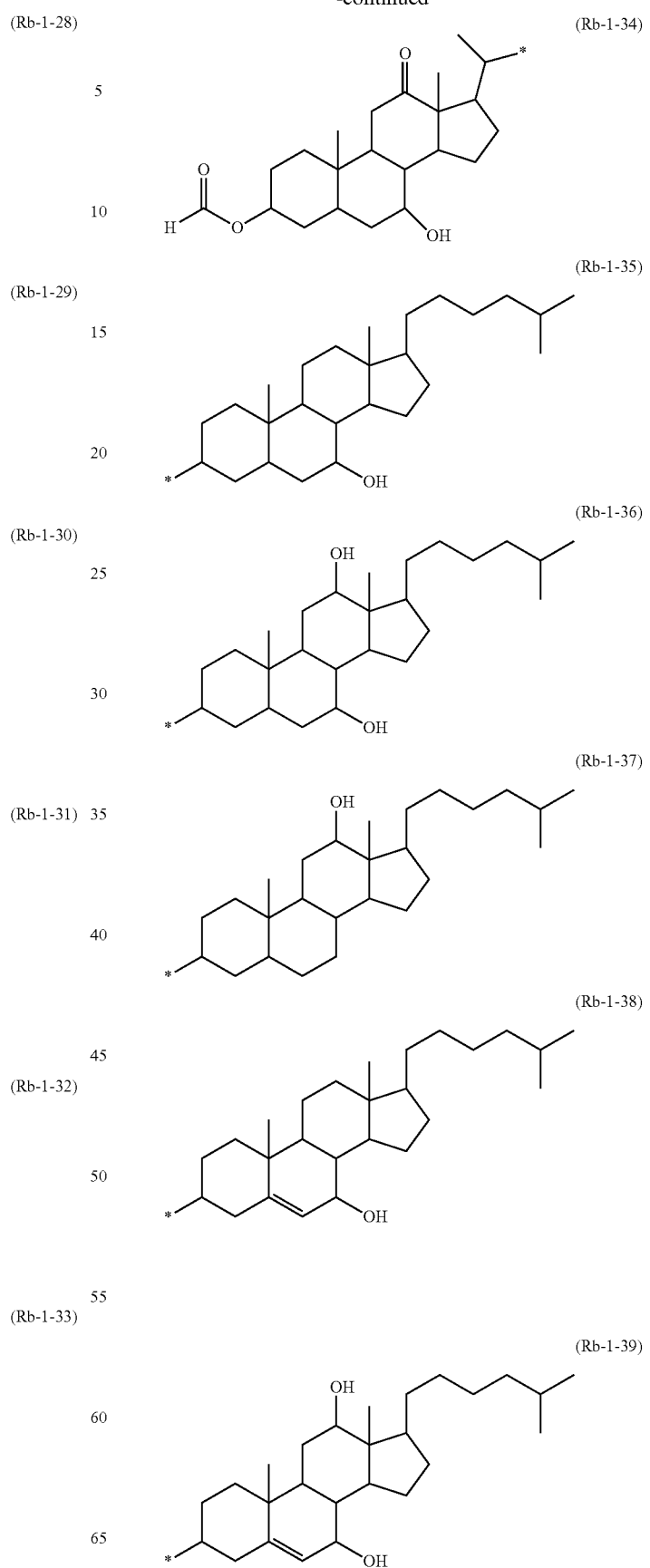

-continued

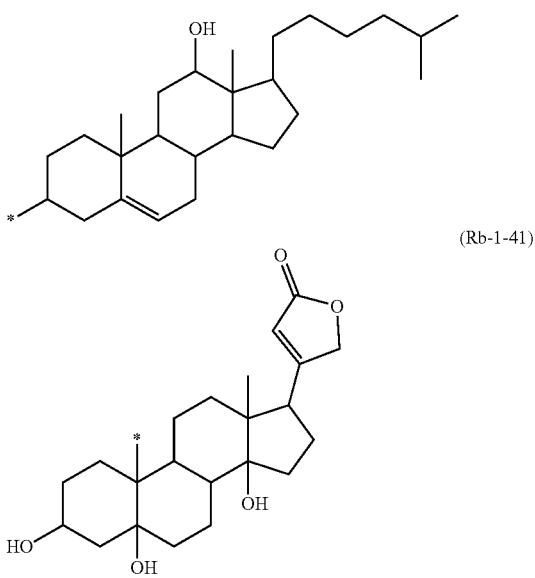

(Rb-1-40)

(Rb-1-41)

Among the examples, $R^{b1}$ preferably represents a group represented by any of Formulae (Rb-1-1) to (Rb-1-19) and more preferably a group represented by any of Formulae (Rb-1-1) to (Rb-1-7).

In Formula (b1), $R^{f1}$ represents a hydrogen atom, a fluorine atom, or a fluorinated alkyl group having 1 to 5 carbon atoms.

The fluorinated alkyl group having 1 to 5 carbon atoms of $R^{f1}$ may be linear or branched. Examples of the fluorinated alkylene group of $R^{f1}$ include a group in which some or all hydrogen atoms in the alkylene group have been substituted with fluorine atoms. Among these, as the fluorinated alkyl group, a perfluoroalkyl group in which all hydrogen atoms in the alkylene group have been substituted with fluorine atoms is preferable, and a perfluoroalkyl group having 1 to 3 carbon atoms is more preferable.

Among the examples, $R^{f1}$ preferably represents a fluorine atom or a perfluoroalkyl group having 1 to 3 carbon atoms, more preferably a fluorine atom or a perfluoroalkyl group having 1 or 2 carbon atoms, still more preferably a fluorine atom or a trifluoromethylene group, and particularly preferably a fluorine atom.

In Formula (b1), $Y^{b1}$ represents a divalent linking group having a hetero atom or a single bond.

Examples of the divalent linking group having a hetero atom of $Y^{b1}$ are the same as those exemplified as the divalent linking group having a hetero atom represented by $Ya^1$ in Formula (a2-1).

As the hetero atom in the divalent linking group having a hetero atom, the divalent linking group preferably has an oxygen atom and may have a hetero atom other than an oxygen atom. Examples of the hetero atom other than an oxygen atom include a nitrogen atom and a sulfur atom. It is preferable that the divalent linking group having a hetero atom of $Y^{b1}$ be a divalent linking group containing at least one functional group selected from the group consisting of a carboxylic acid ester group, an ether group, a carbonic acid ester group, a carbonyl group, and an amide group.

Examples of the divalent linking group containing a functional group include a carboxylic acid ester group [—C(=O)—O— or —O—C(=O)—], an ether group (—O—), a carbonic acid ester group [—O—C(=O)—O—], a carbonyl group [—C(=O)—], an amide group [—NH—C(=O)— or —C(=O)—NH—], and a combination of an alkylene group and at least one functional group of these. A sulfonyl group (—SO₂—) may be further linked to the combination. Examples of the combination include linking groups represented by Formulae (y-al-1) to (y-al-8).

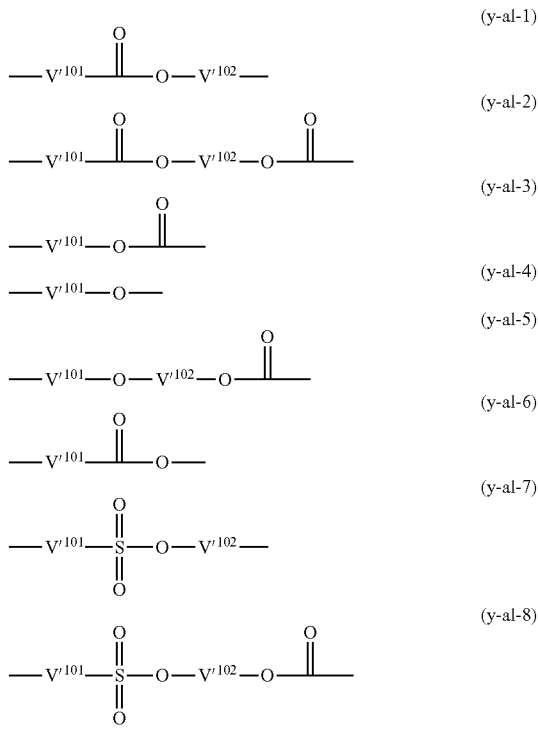

[In the formulae, $V'^{101}$ represents a single bond or an alkylene group having 1 to 5 carbon atoms, and $V'^{102}$ represents a divalent saturated hydrocarbon group having 1 to 30 carbon atoms.]

It is preferable that the divalent saturated hydrocarbon group of $V'^{102}$ be an alkylene group having 1 to 30 carbon atoms. As the alkylene group of $V'^{102}$, an alkylene group having 1 to 30 carbon atoms is preferable, an alkylene group having 1 to 10 carbon atoms is more preferable, and an alkylene group having 1 to 5 carbon atoms is still more preferable.

The alkylene group of $V'^{101}$ and $V'^{102}$ may be a linear alkylene group or a branched alkylene group.

Specific examples of the alkylene group of $V'^{101}$ and $V'^{102}$ include a methylene group [—CH₂—]; an alkylmethylene group such as —CH(CH₃)—, —CH(CH₂CH₃)—, —C(CH₃)₂—, —C(CH₃)(CH₂CH₃)—, —C(CH₃)(CH₂CH₂CH₃)—, or —C(CH₂CH₃)₂—; an ethylene group [—CH₂CH₂—]; an alkylethylene group such as —CH(CH₃)CH₂—, —CH(CH₃)CH(CH₃)—, —C(CH₃)₂CH₂—, or —CH(CH₂CH₃)CH₂—; a trimethylene group (n-propylene group) [—CH₂CH₂CH₂—]; an alkyltrimethylene group such as —CH(CH₃)CH₂CH₂— or —CH₂CH(CH₃)CH₂—; a tetramethylene group [—CH₂CH₂CH₂CH₂—]; an alkyltetramethylene group such as —CH(CH₃)CH₂CH₂CH₂— or —CH₂CH(CH₃)CH₂CH₂—; and a pentamethylene group [—CH₂CH₂CH₂CH₂CH₂—].

Further, a part of the methylene group in the alkylene group exemplified above may be substituted with a divalent aliphatic cyclic group having 5 to 10 carbon atoms. As the aliphatic cyclic group, a cyclohexylene group, a 1,5-adamantylene group, or a 2,6-adamantylene group is preferable.

$Y^{b1}$ preferably represents a divalent linking group having an ester bond or an ether bond, more preferably a linking group represented by any of Formulae (y-al-1) to (y-al-6), and still more preferably a linking group represented by any of Formulae (y-al-1) to (y-al-3) and (y-al-6).

In Formula (b1), $V^{b1}$ represents an alkylene group, a fluorinated alkylene group, or a single bond.

The alkylene group or fluorinated alkylene group of $V^{b1}$ may be linear or branched, but it is preferable that the alkylene group or fluorinated alkylene group be linear. The number of carbon atoms of the alkylene group or fluorinated alkylene group of Vb1 is preferably in a range of 1 to 4 and more preferably in a range of 1 to 3.

Examples of the fluorinated alkylene group of $V^{b1}$ include a group in which some or all hydrogen atoms in the alkylene group have been substituted with fluorine atoms. In the fluorinated alkylene group of $V^{b1}$, it is preferable that a carbon atom adjacent to the carbon atom to which $R^{f1}$ is bonded have a fluorinated alkylene group having at least one fluorine atom or 1 to 3 carbon atoms.

Particularly preferred examples of the group of $V^{b1}$ include a single bond, an alkylene group having 1 to 3 carbon atoms, and a fluorinated alkylene group having 1 to 3 carbon atoms. In the fluorinated alkylene group having 1 to 3 carbon atoms, it is preferable that $Y^{b1}$—$V^{b1}$ be represented by $Y^{b1}$—$(CH_2)_n$—CHF— or $Y^{b1}$—$(CH_2)_n$—$CF_2$— (n represents an integer of 0 to 2).

Specific examples of the anion moiety in the component (B1) are shown below. In the formulae, k and k' each independently represent an integer of 0 to 5, and k" represents an integer of 1 to 5. Further, the anion moiety in the component (B1) is not limited to these specific examples.

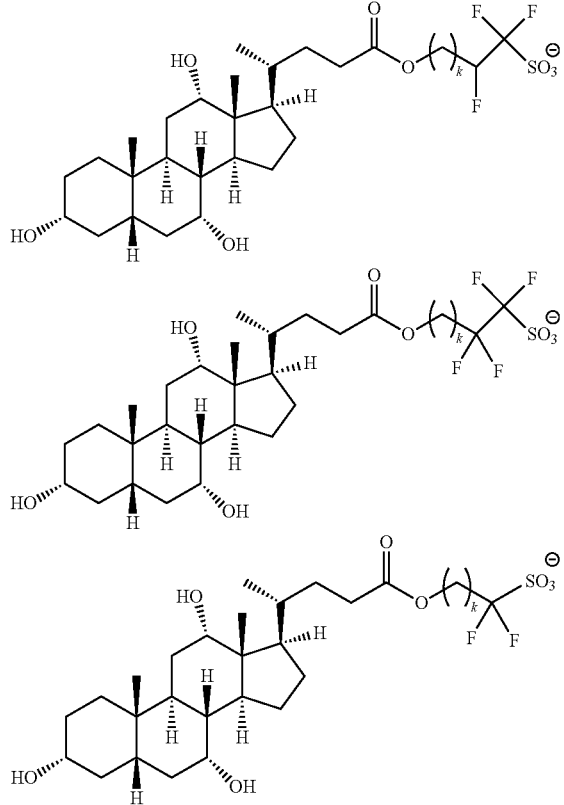

-continued

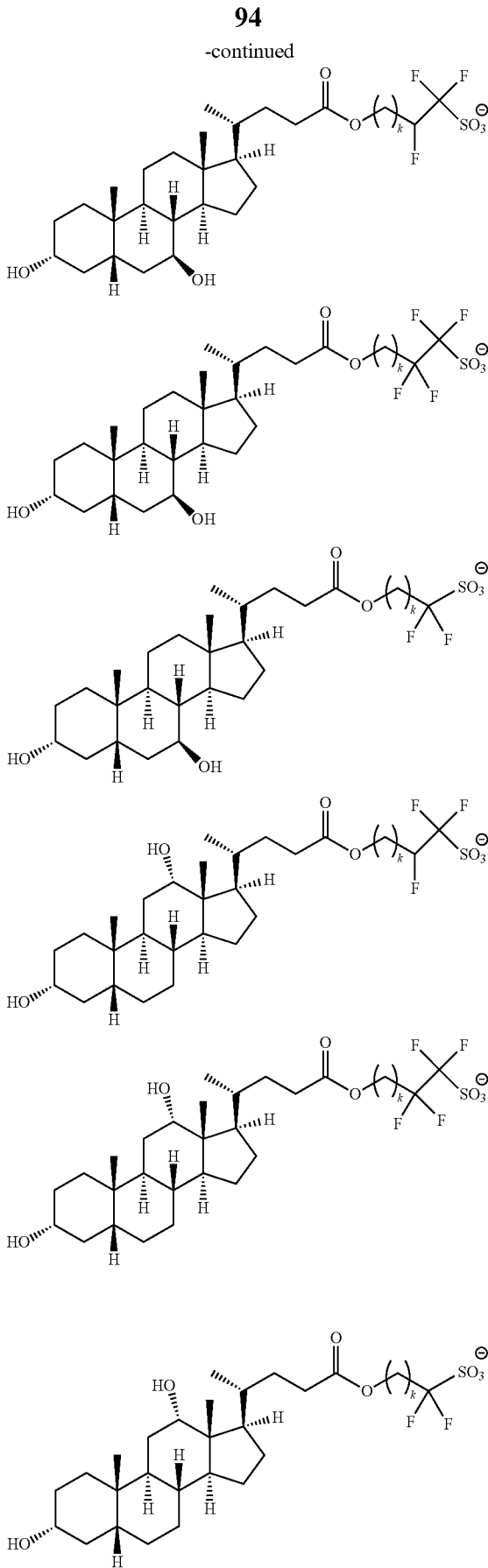

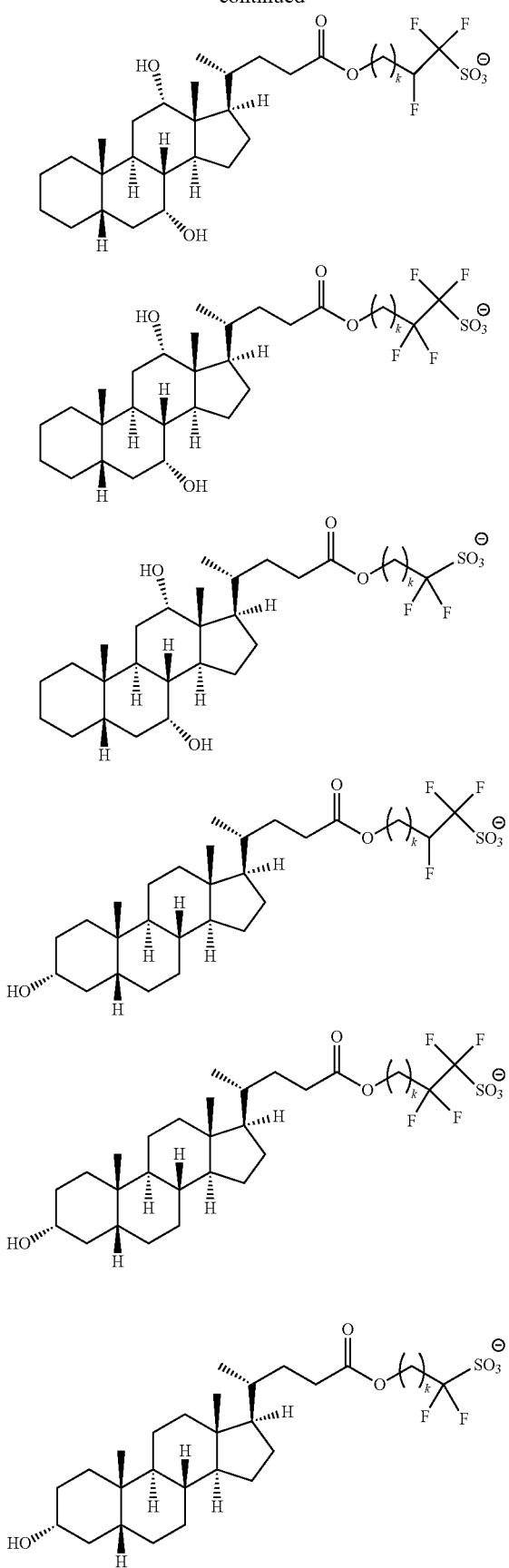
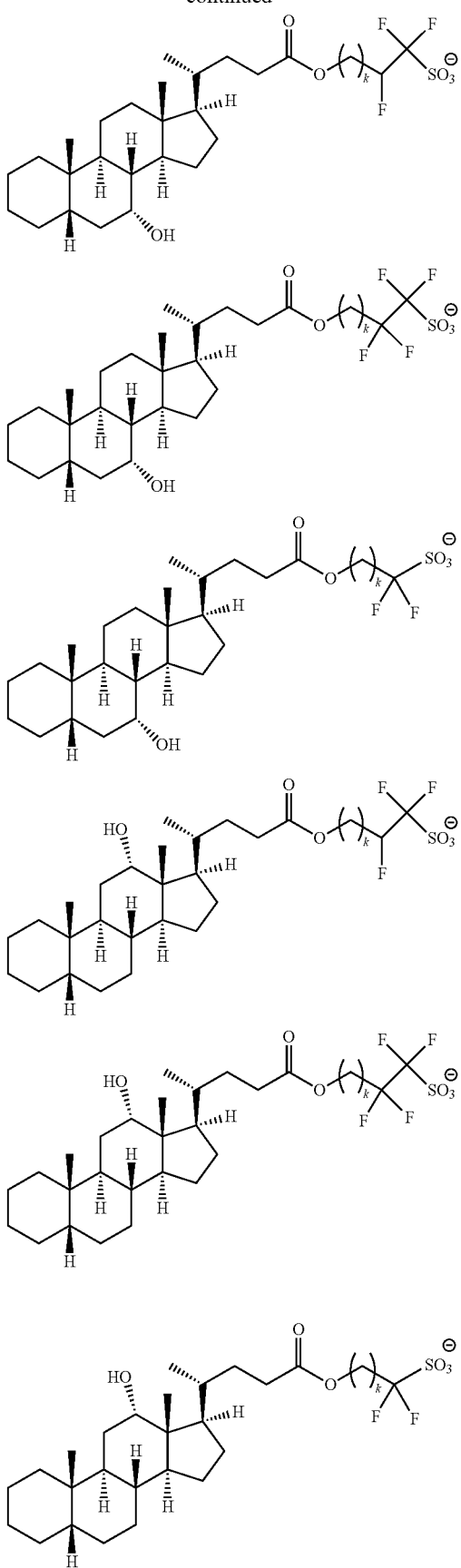

97
-continued
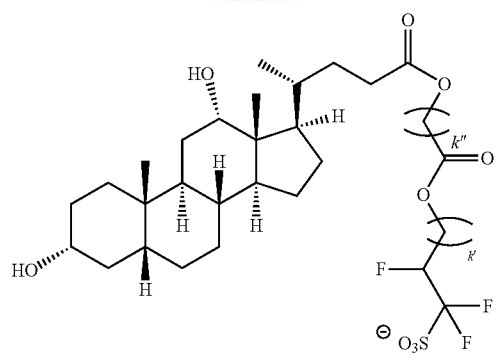
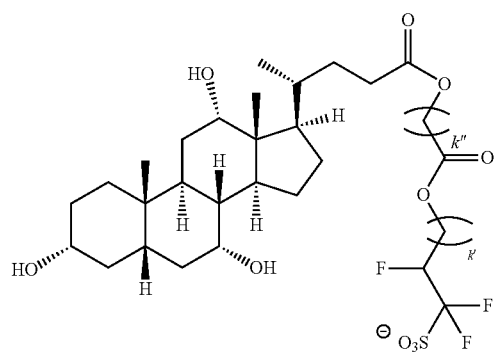
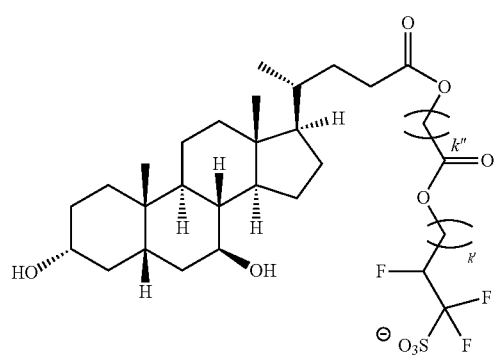
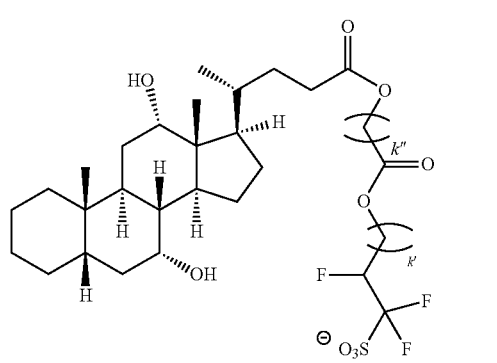
98
-continued
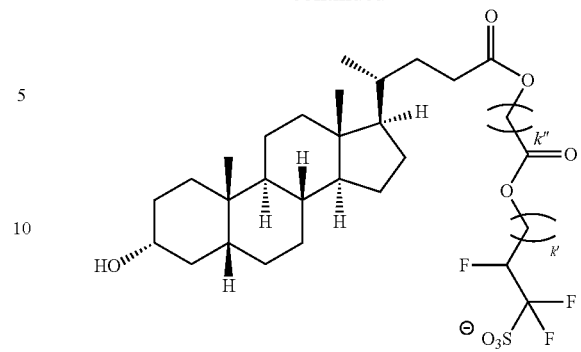
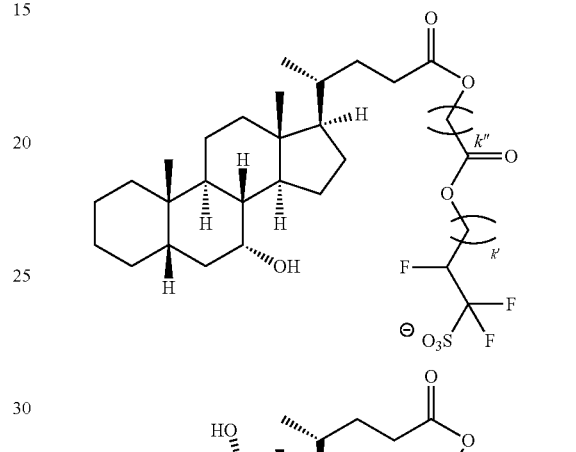
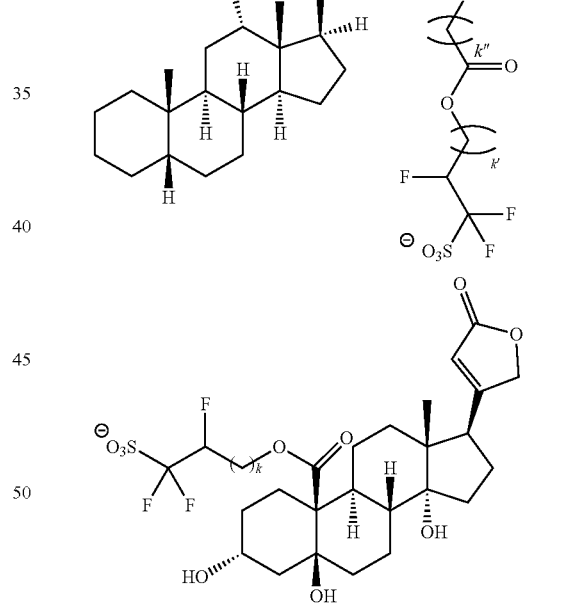
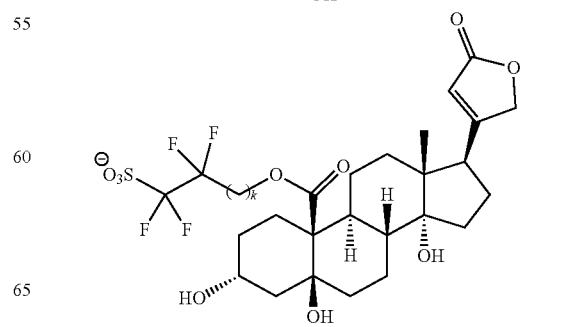

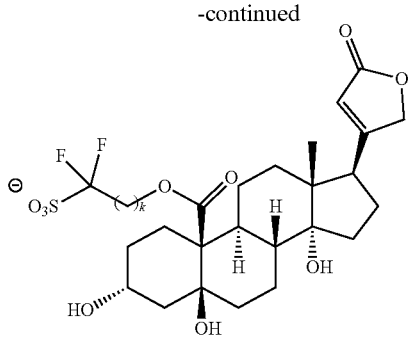

As the anion moiety in the component (B1), an anion represented by Formula (b1-an1) is preferable.

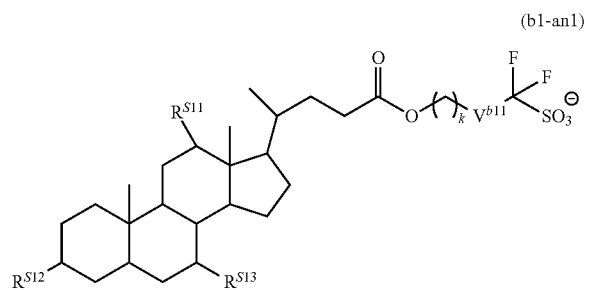

(b1-an1)

[In the formula, $R^{S11}$ to $R^{S13}$ each have the same definition as that in Formula (Rb1-1). $V^{b11}$ represents a single bond, —CHF—, or CHF$_2$—. k represents an integer of 1 to 5.]

In Formula (b1-an1), $R^{S11}$ to $R^{S13}$ each have the same definition as that in Formula $(R^{b1}\text{-}1)$.

In Formula (b1-an1), $V^{b11}$ represents a single bond, —CHF—, or CHF$_2$— and preferably —CHF—.

In Formula (b1-an1), k represents an integer of 1 to 5, preferably an integer of 1 to 3, more preferably 1 or 2, and still more preferably 2.

[Cation moiety: $(M^{m+})_{1/m}$]

In Formula (b1), $M^{m+}$ represents an m-valent organic cation.

As the organic cation represented by $M^{m+}$ an onium cation is preferable, and a sulfonium cation or an iodonium cation is more preferable. m represents an integer of 1 or greater.

Preferred examples of the cation moiety $((M^{m+})_{1/m})$ include organic cations represented by Formulae (ca-1) to (ca-5).

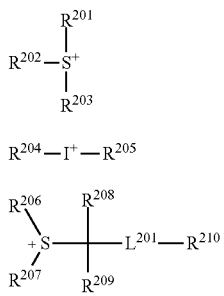

(ca-1)

$R^{204}$—$I^+$—$R^{205}$ (ca-2)

(ca-3)

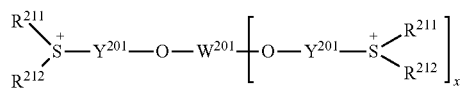

(ca-4)

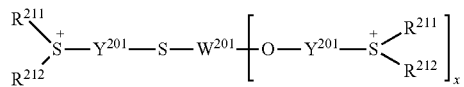

(ca-5)

[In the formulae, $R^{201}$ to $R^{207}$, $R^{211}$, and $R^{212}$ each independently represent an aryl group, an alkyl group, or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represent a hydrogen atom or an alkyl group having 1 to 5 carbon atoms; $R^{210}$ represents an aryl group which may have a substituent, an alkyl group which may have a substituent, an alkenyl group which may have a substituent, or a —SO$_2$-containing cyclic group which may have a substituent; $L^{201}$ represents —C(=O)— or —C(=O)—O—; $Y^{201}$ each independently represent an arylene group, an alkylene group, or an alkenylene group; x represents 1 or 2; and $W^{201}$ represents an (x+1)-valent linking group.]

Examples of the aryl group of $R^{201}$ to $R^{207}$, $R^{211}$, and $R^{212}$ include an unsubstituted aryl group having 6 to 20 carbon atoms, and a phenyl group or a naphthyl group is preferable.

The alkyl group of $R^{201}$ to $R^{207}$, $R^{211}$, and $R^{212}$ is a chain-like or cyclic alkyl group, and the number of carbon atoms thereof is preferably in a range of 1 to 30.

The alkenyl group of $R^{201}$ to $R^{207}$, $R^{211}$, and $R^{212}$ preferably has 2 to 10 carbon atoms.

Examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by Formulae (ca-r-1) to (ca-r-7) shown below.

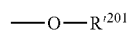

[ca-r-1]

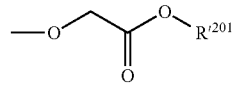

[ca-r-2]

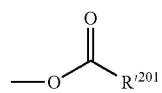

[ca-r-3]

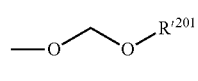

[ca-r-4]

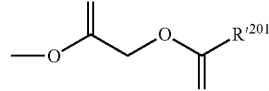

[ca-r-5]

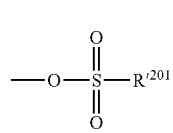

[ca-r-6]

-continued

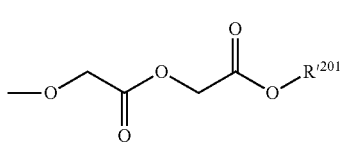
[ca-r-7]

[In the formulae, each $R'^{201}$ independently represents a hydrogen atom, a cyclic group which may have a substituent, a chain-like alkyl group which may have a substituent, or a chain-like alkenyl group which may have a substituent.]

In Formulae (ca-r-1) to (ca-r-7), $R'^{201}$ represents a hydrogen atom, a cyclic group which may have a substituent, a chain-like alkyl group which may have a substituent, or a chain-like alkenyl group which may have a substituent.

Cyclic group which may have substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated, but in general, the aliphatic hydrocarbon group is preferably saturated.

The aromatic hydrocarbon group of $R'^{201}$ is a hydrocarbon group having an aromatic ring. The aromatic hydrocarbon ring preferably has 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Specific examples of the aromatic ring contained in the aromatic hydrocarbon group of $R'^{201}$ include benzene, fluorene, naphthalene, anthracene, phenanthrene, biphenyl, or an aromatic hetero ring in which some carbon atoms constituting any of these aromatic rings have been substituted with hetero atoms. Examples of the hetero atom in the aromatic hetero rings include an oxygen atom, a sulfur atom, and a nitrogen atom.

Specific examples of the aromatic hydrocarbon group of $R'^{201}$ include a group in which one hydrogen atom has been removed from the above-described aromatic ring (an aryl group such as a phenyl group or a naphthyl group), and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) preferably has 1 to 4 carbon atoms, more preferably 1 or 2 carbon atoms, and particularly preferably 1 carbon atom.

Examples of the cyclic aliphatic hydrocarbon group of $R'^{201}$ include aliphatic hydrocarbon groups containing a ring in the structure thereof.

Examples of the hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group preferably has 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among polycycloalkanes, a polycycloalkane having a bridged ring polycyclic skeleton, such as adamantane, norbornane, isobornane, tricyclodecane, or tetracyclododecane, and a polycycloalkane having a fused ring polycyclic skeleton, such as a cyclic group having a steroid skeleton are preferable.

Among these examples, as the cyclic aliphatic hydrocarbon group of $R'^{201}$, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and particularly preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferable, and specific examples thereof include various alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group in the alkylalkylene group, a linear alkyl group having 1 to 5 carbon atoms is preferable.

The cyclic hydrocarbon group of $R'^{201}$ may contain a hetero atom such as a hetero ring. Specific examples thereof include lactone-containing cyclic groups represented by Formulae (a2-r-1) to (a2-r-7), the —$SO_2$—containing cyclic group represented by Formulae (a5-r-1) to (a5-r-4), and other heterocyclic groups represented by Chemical Formulae (r-hr-1) to (r-hr-16).

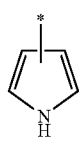
(r-hr-1)

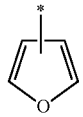
(r-hr-2)

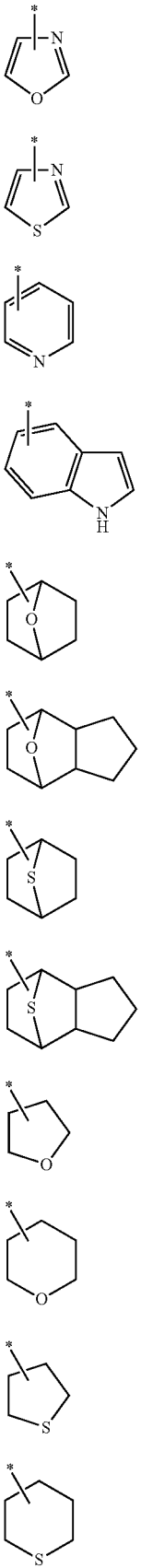
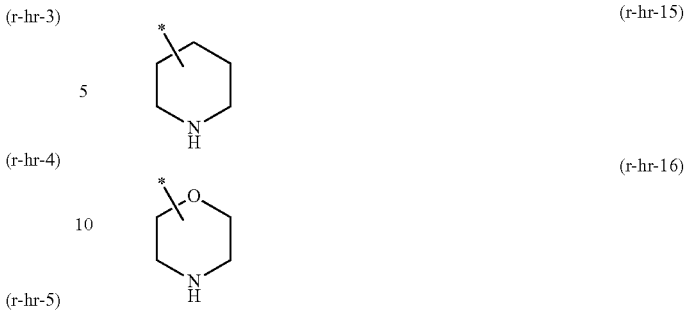

Examples of the substituent for the cyclic group of $R'^{201}$ include an alkyl group, an alkoxy group, a halogen atom, a halogenated alkyl group, a hydroxyl group, a carbonyl group, and a nitro group.

The alkyl group serving as the substituent is preferably an alkyl group having 1 to 5 carbon atoms, and a methyl group, an ethyl group, a propyl group, an n-butyl group, or a tert-butyl group is most preferable.

The alkoxy group serving as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom, and a fluorine atom is preferable.

Examples of the above-described halogenated alkyl group serving as the substituent include a group in which some or all hydrogen atoms in an alkyl group having 1 to 5 carbon atoms such as a methyl group, an ethyl group, a propyl group, an n-butyl group, or a tert-butyl group have been substituted with the above-described halogen atoms.

The carbonyl group serving as the substituent is a group that substitutes a methylene group (—$CH_2$—) constituting the cyclic hydrocarbon group.

Chain-like alkyl group which may have substituent:

The chain-like alkyl group of $R'^{201}$ may be linear or branched.

The linear alkyl group preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group preferably has 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-like alkenyl group which may have substituent:

Such a chain-like alkenyl group of $R'^{201}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

As the substituent for the chain-like alkyl group or alkenyl group of $R'^{201}$, an alkoxy group, a halogen atom, a halogenated alkyl group, a hydroxyl group, a carbonyl group, a nitro group, an amino group, a cyclic group of $R'^{201}$ or the like can be used.

Examples of the cyclic group which may have a substituent, the chain-like alkyl group which may have a substituent, and the chain-like alkenyl group which may have a substituent of $R'^{201}$ are the same as those exemplified as the acid dissociable group represented by Formula (a1-r-2) as a cyclic group which may have a substituent or a chain-like alkyl group which may have a substituent, in addition to the above-described groups.

Among the examples, as $R'^{201}$, a cyclic group which may have a substituent is preferable, and a cyclic hydrocarbon group which may have a substituent is more preferable. More specific preferred examples thereof include a phenyl group, a naphthyl group, a group in which one or more hydrogen atoms have been removed from a polycycloalkane, a lactone-containing cyclic group represented by any of Formulae (a2-r-1) to (a2-r-7), and a —SO$_2$-containing cyclic group represented by any of Formulae (a5-r-1) to (a5-r-4).

In a case where $R^{201}$ to $R^{203}$, $R^{206}$, $R^{207}$, $R^{211}$, and $R^{212}$ are bonded to one another to form a ring with a sulfur atom in the formula, these groups may be bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (here, R$_N$ represents an alkyl group having 1 to 5 carbon atoms). As a ring to be formed, a ring containing the sulfur atom in the formula in the skeleton thereof is preferably a 3- to 10-membered ring and most preferably a 5- to 7-membered ring including the sulfur atom. Specific examples of the ring to be formed include a thiophene ring, a thiazole ring, a benzothiophene ring, a thianthrene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represent an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —SO$_2$-containing cyclic group which may have a substituent.

Examples of the aryl group of $R^{210}$ include an unsubstituted aryl group having 6 to 20 carbon atoms, and a phenyl group or a naphthyl group is preferable.

As the alkyl group of $R^{210}$, a chain-like or cyclic alkyl group having 1 to 30 carbon atoms is preferable.

The alkenyl group of $R^{210}$ preferably has 2 to 10 carbon atoms.

As the —SO$_2$-containing cyclic group of $R^{210}$ which may have a substituent, the same groups as the —SO2-containing cyclic group represented by Formulae (a5-r-1) to (a5-r-4) are exemplified. Among these, a "—SO$_2$-containing polycyclic group" is preferable, and a group represented by Formula (a5-r-1) is more preferable.

In Formulae (ca-4) and (ca-5), each $Y^{201}$ independently represents an arylene group, an alkylene group, or an alkenylene group.

Examples of the arylene group of $Y^{201}$ include groups in which one hydrogen atom has been removed from an aryl group exemplified as the aromatic hydrocarbon group represented by $R'^{201}$ described above.

Examples of the alkylene group and alkenylene group of $Y^{201}$ include groups in which one hydrogen atom has been removed from the chain-like alkyl group or the chain-like alkenyl group of $R'^{201}$ in Formula (b-1).

In Formulae (ca-4) and (ca-5), x represents 1 or 2.

$W^{201}$ represents an (x+1)-valent linking group, that is, a divalent or trivalent linking group.

As the divalent linking group represented by $W^{201}$, a divalent hydrocarbon group which may have a substituent is preferable, and as examples thereof, the same hydrocarbon groups which may have a substituent as those described above represented by Ya$^{21}$ in Formula (a2-1) can be exemplified. The divalent linking group of $W^{201}$ may be linear, branched or cyclic, and cyclic is more preferable. Among these, an arylene group having two carbonyl groups, each bonded to the terminal thereof, is preferable. Examples of the arylene group include a phenylene group and a naphthylene group, and a phenylene group is particularly preferable.

As the trivalent linking group of $W^{201}$, a group in which one hydrogen atom has been removed from the above-described divalent linking group of $W^{201}$ and a group in which the divalent linking group has been bonded to another divalent linking group can be exemplified. The trivalent linking group of $W^{201}$ is preferably a group in which two carbonyl groups are bonded to an arylene group.

Specific suitable examples of the cation represented by Formula (ca-1) include cations represented by Formulae (ca-1-1) to (ca-1-129) shown below.

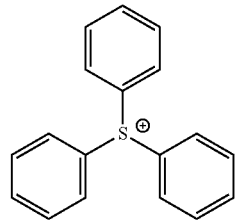

(ca-1-1)

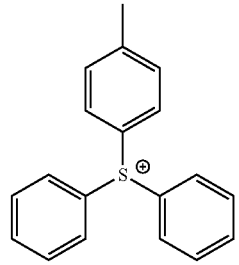

(ca-1-2)

(ca-1-3)
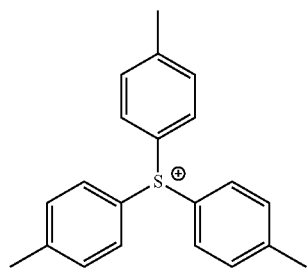
(ca-1-4)
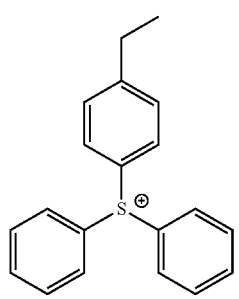
(ca-1-5)
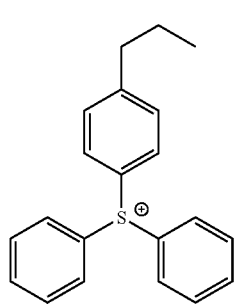
(ca-1-6)
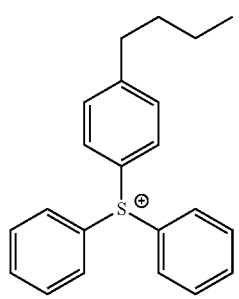
(ca-1-7)
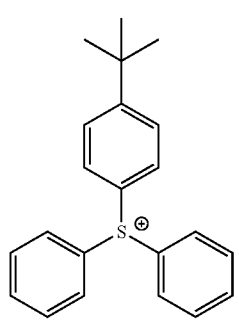
(ca-1-8)
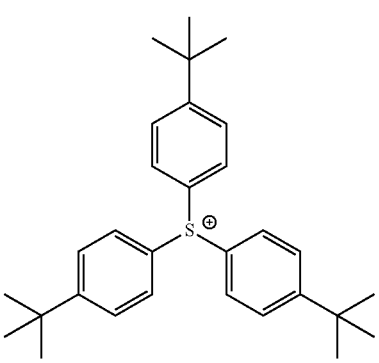
(ca-1-9)
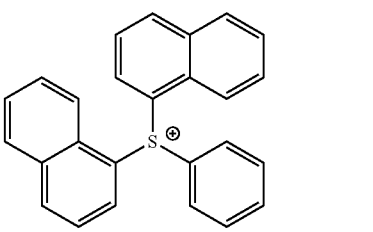
(ca-1-10)
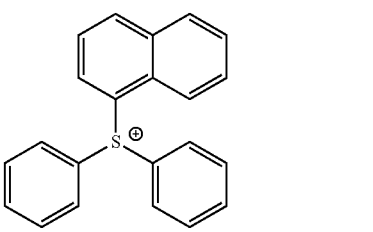
(ca-1-11)
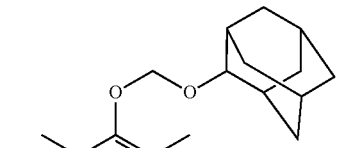
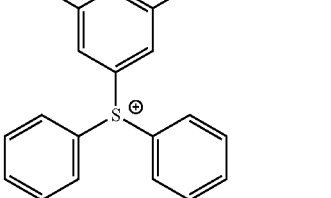
(ca-1-12)
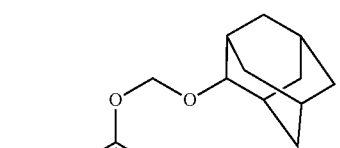
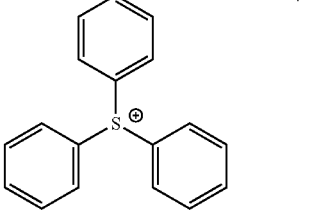

(ca-1-13) 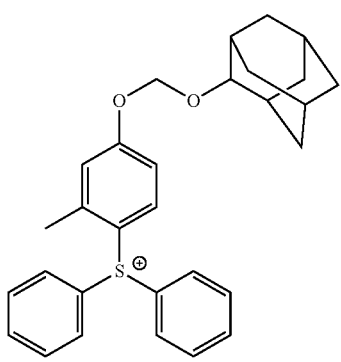
(ca-1-17) 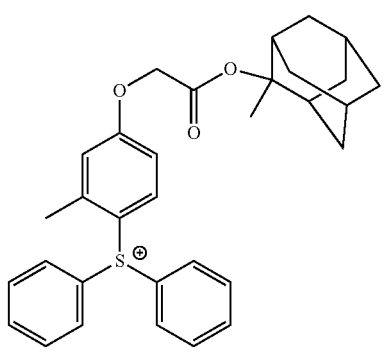
(ca-1-14) 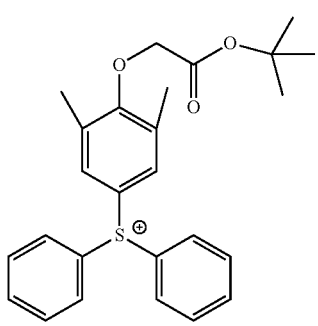
(ca-1-18) 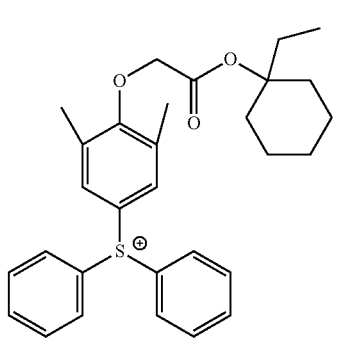
(ca-1-15) 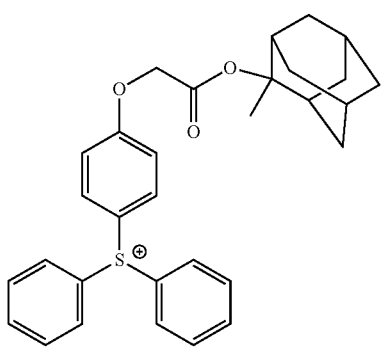
(ca-1-19) 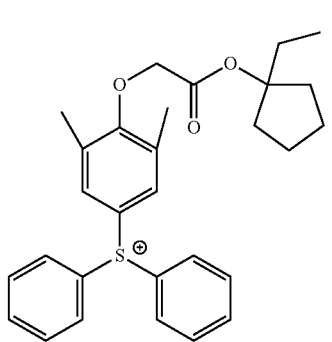
(ca-1-16) 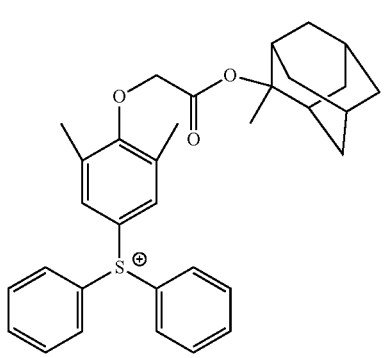
(ca-1-20) 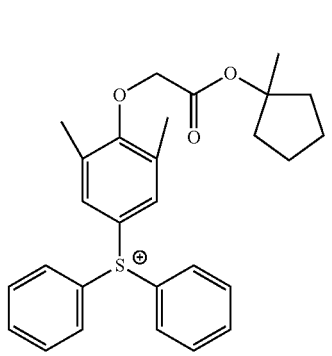

(ca-1-21) 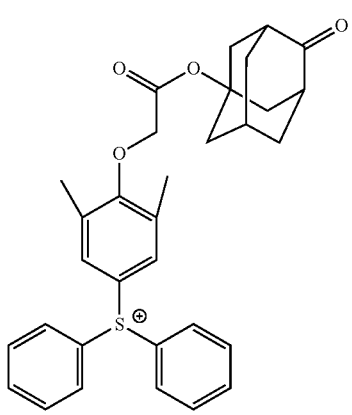
(ca-1-25) 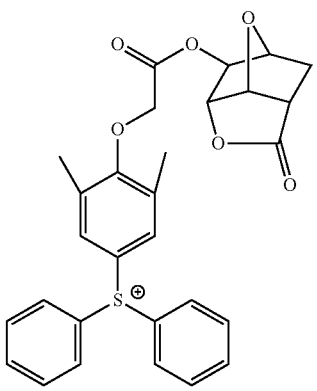
(ca-1-22) 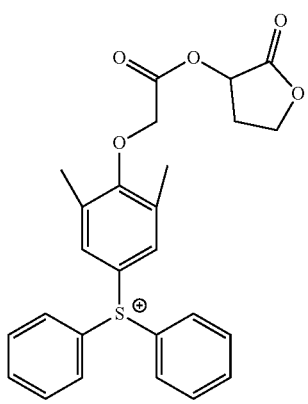
(ca-1-26) 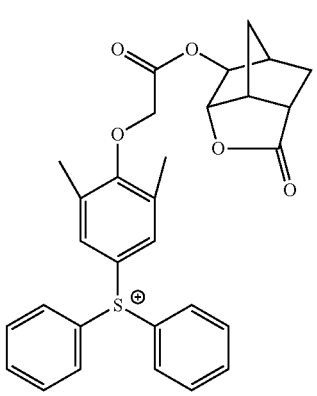
(ca-1-23) 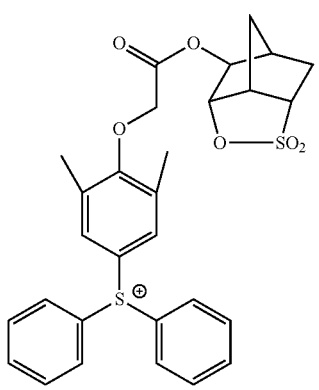
(ca-1-27) 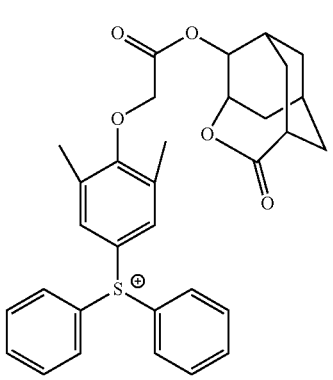
(ca-1-24) 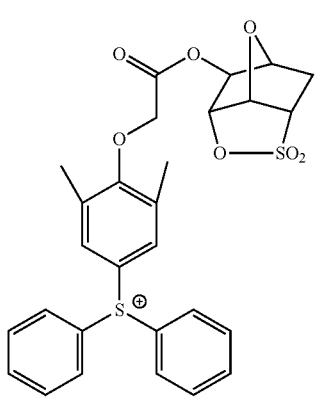
(ca-1-28) 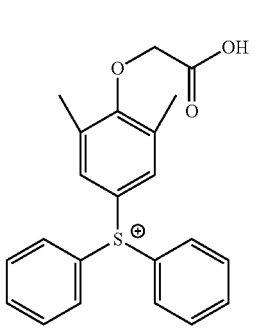

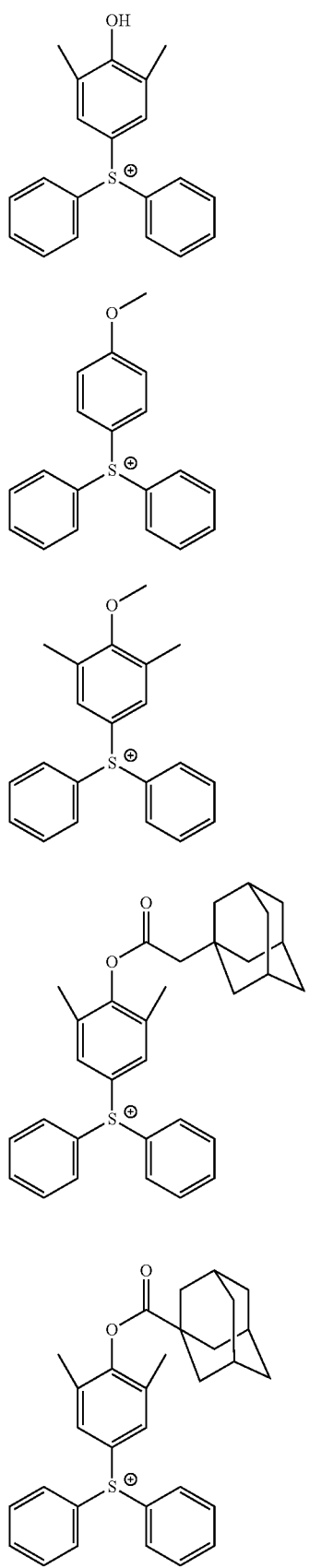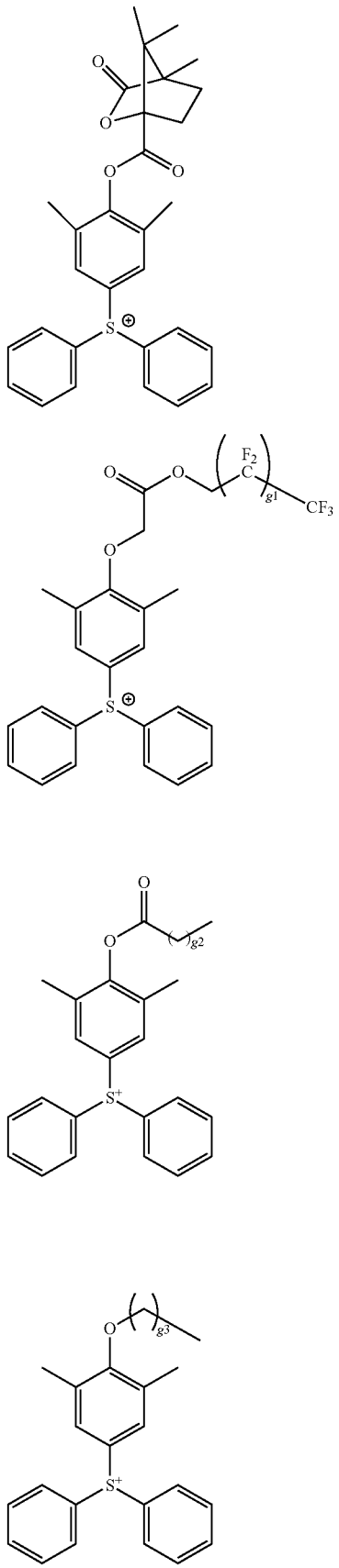

(ca-1-38)
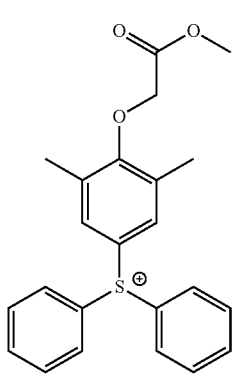
(ca-1-39)
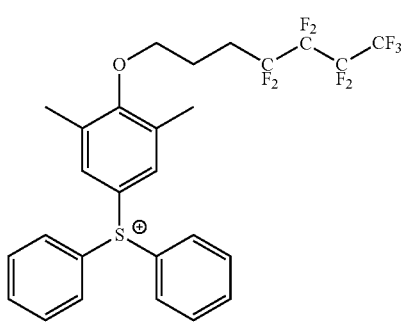
(ca-1-40)
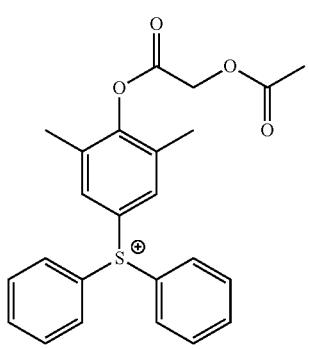
(ca-1-41)
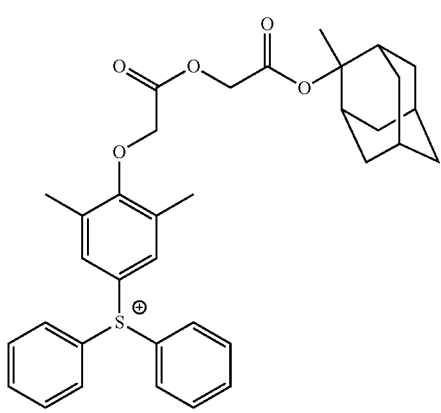
(ca-1-42)
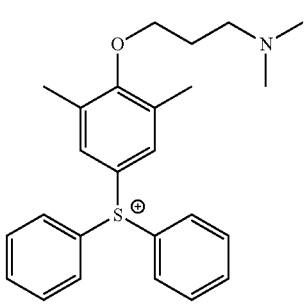
(ca-1-43)
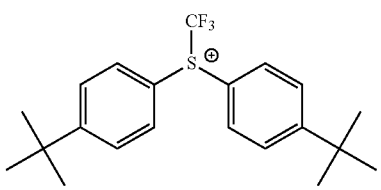
(ca-1-44)
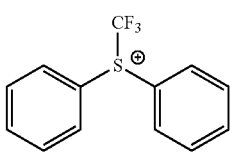
(ca-1-45)
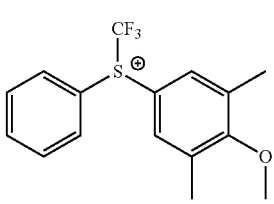
(ca-1-46)
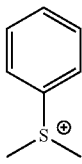
(ca-1-47)
(ca-1-48)
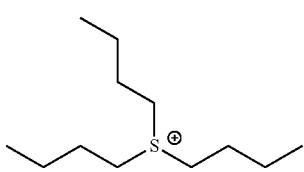
(ca-1-49)
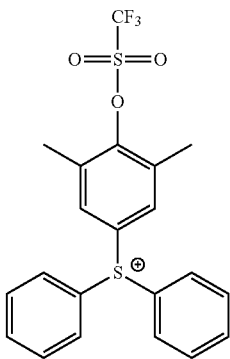

(ca-1-50)
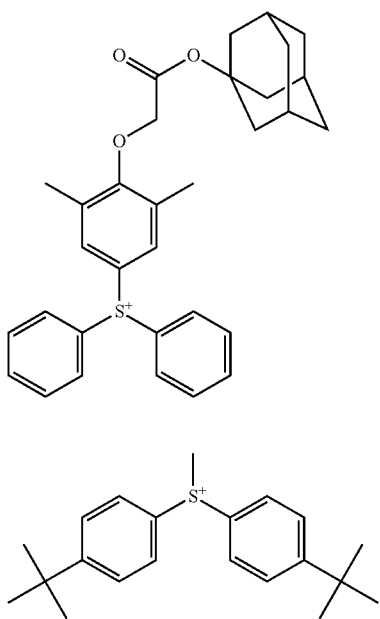
(ca-1-51)
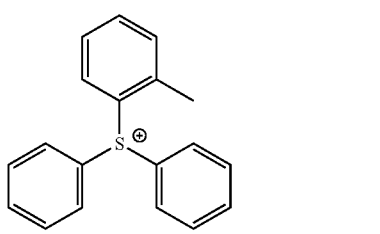
(ca-1-52)
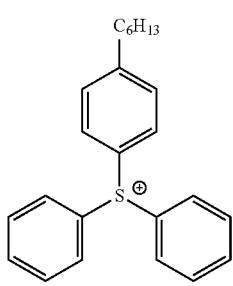
(ca-1-53)
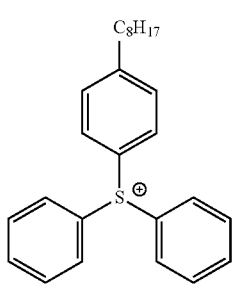
(ca-1-55)
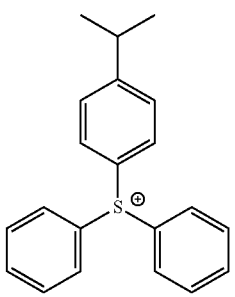
(ca-1-56)
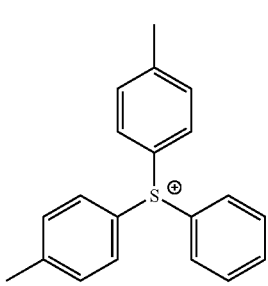
[In the formulae, g1, g2 and g3 represent a repeating number, g1 represents an integer of 1 to 5, g2 represents an integer of 0 to 20, and g3 represents an integer of 0 to 20.]
(ca-1-57)
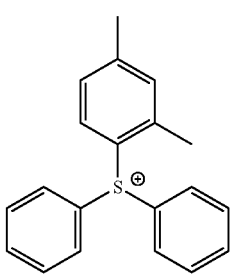
(ca-1-58)
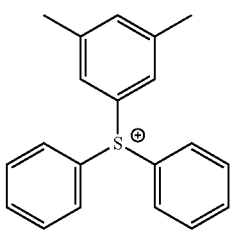
(ca-1-59)
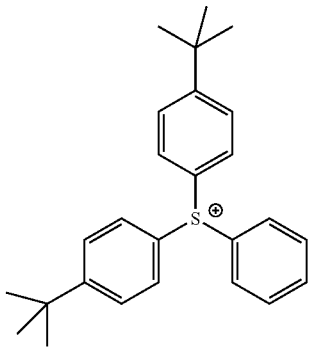

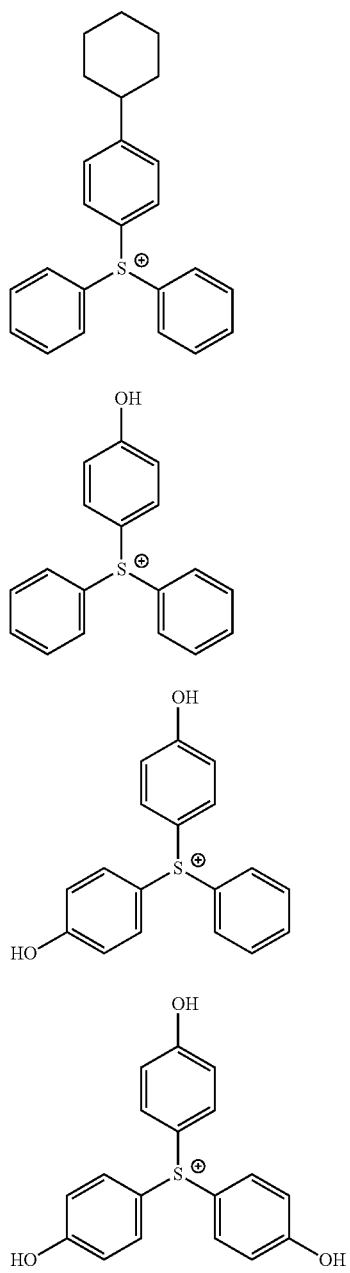
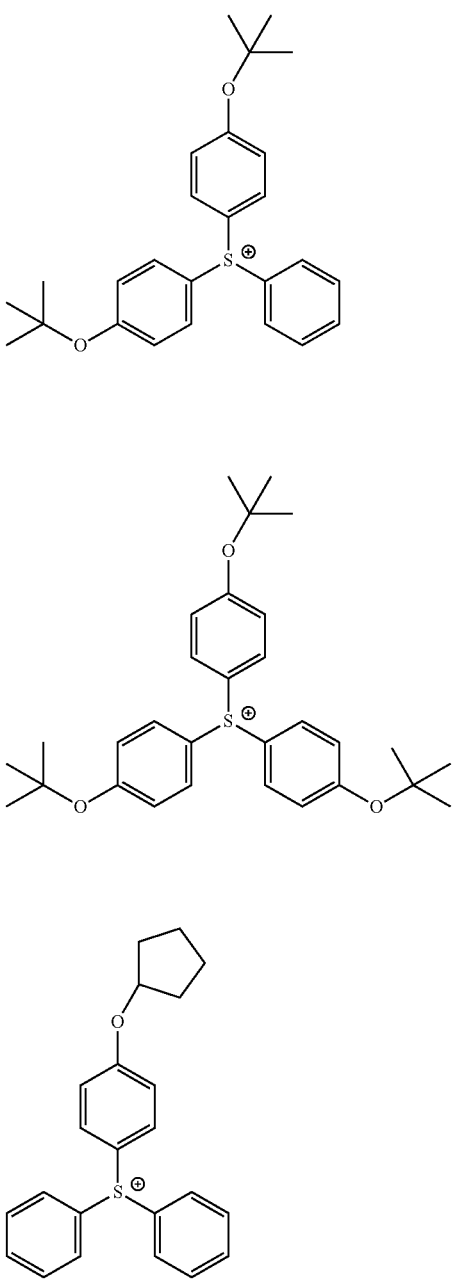

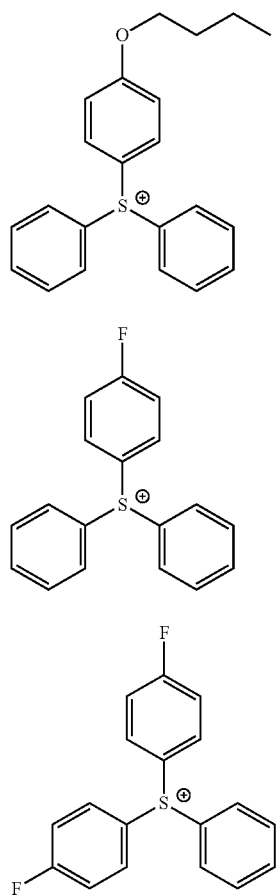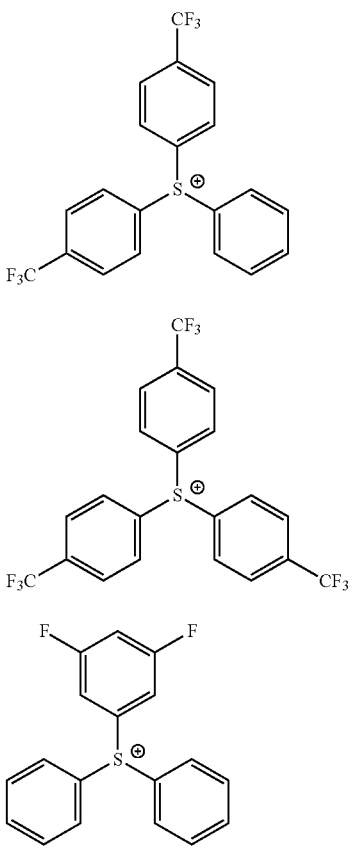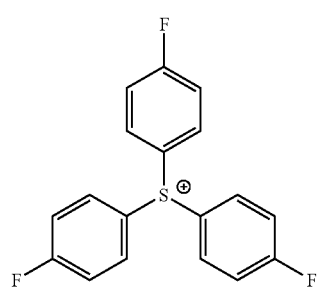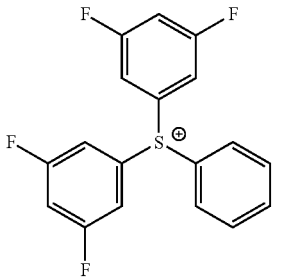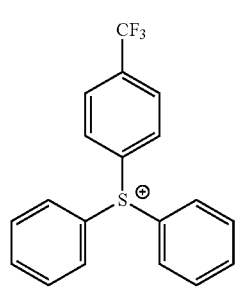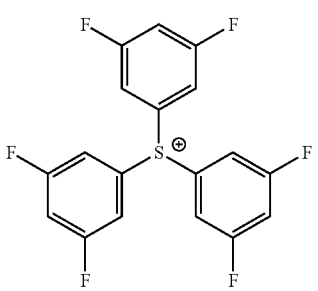

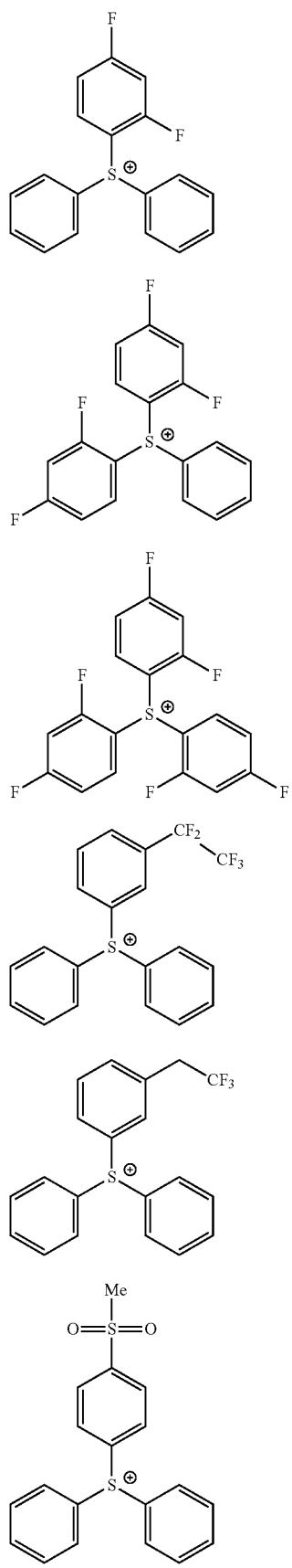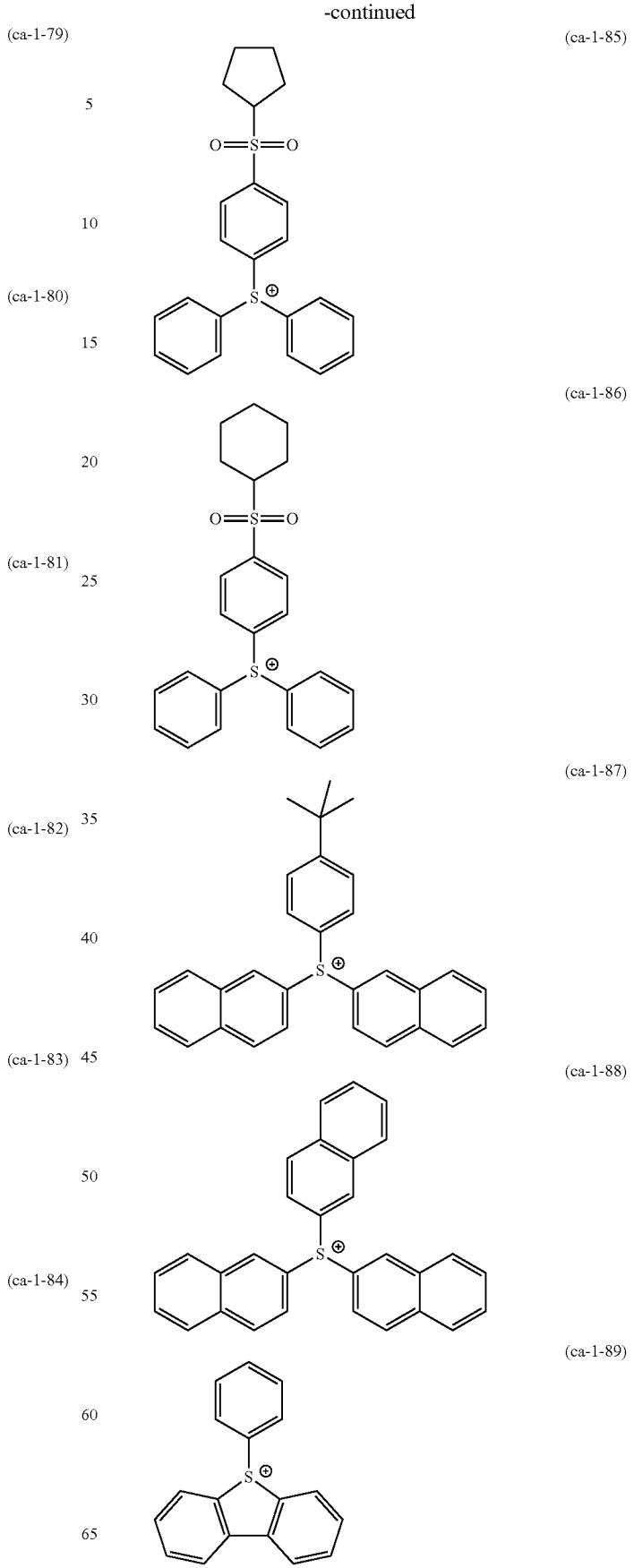

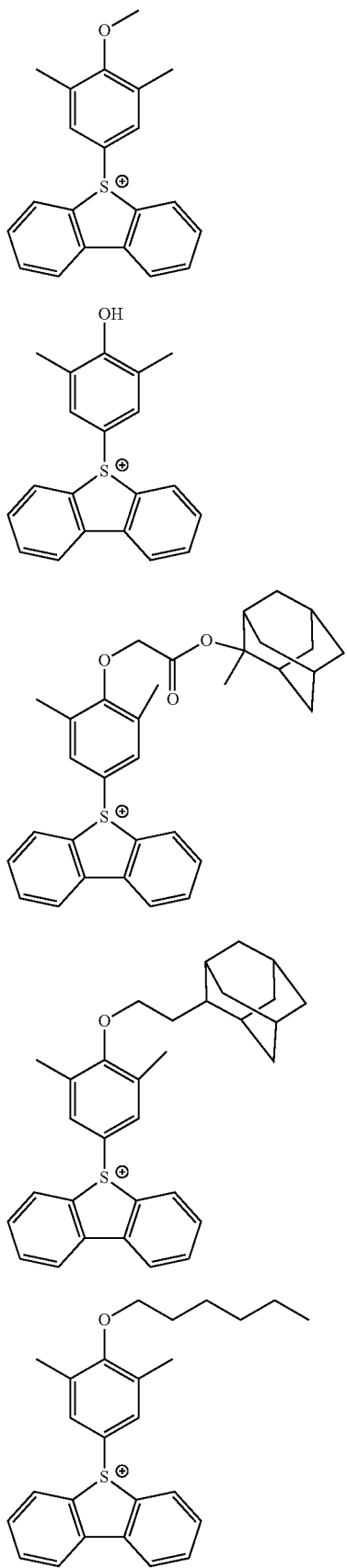
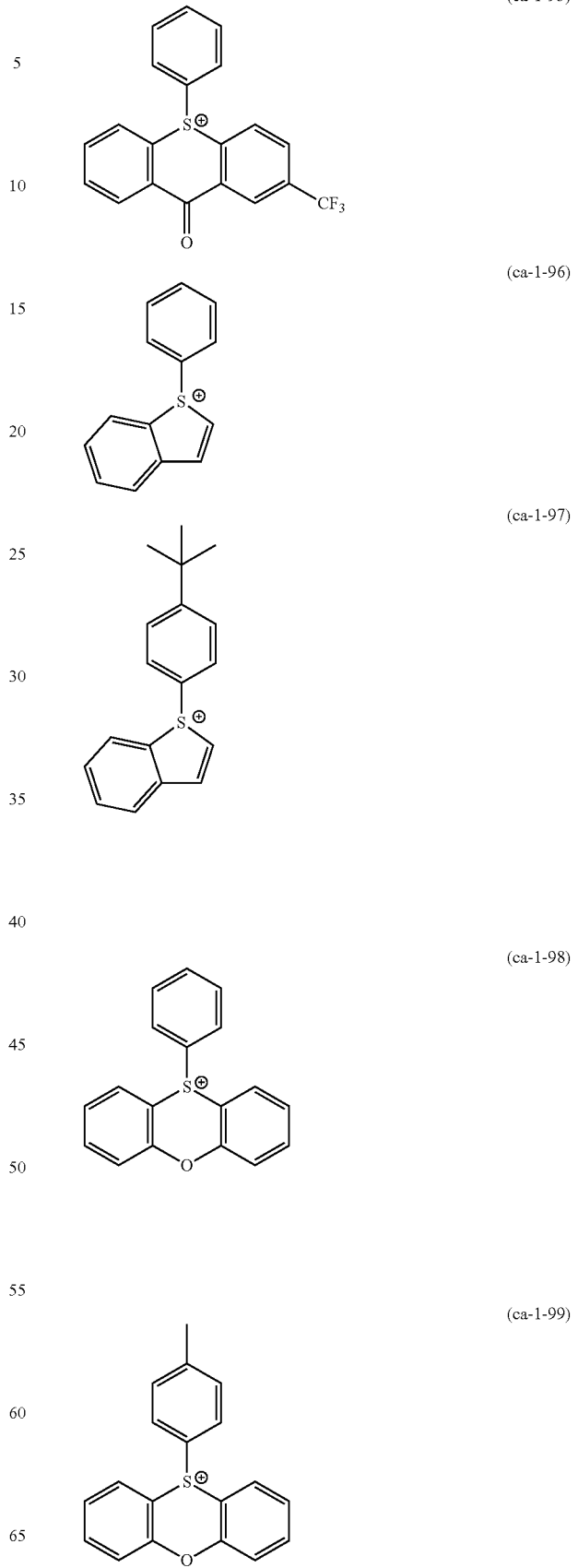

(ca-1-100)
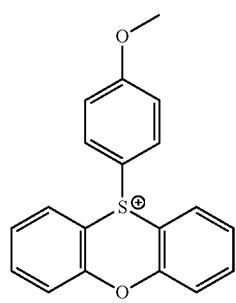
(ca-1-101)
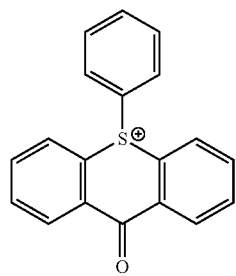
(ca-1-102)
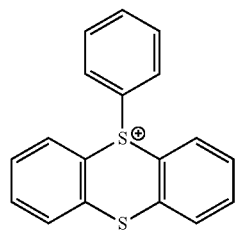
(ca-1-103)
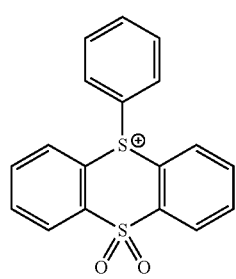
(ca-1-104)
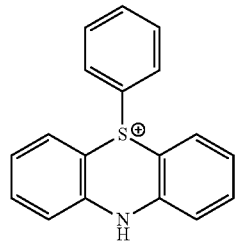
(ca-1-105)
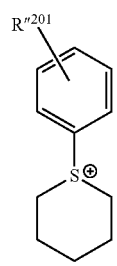
(ca-1-106)
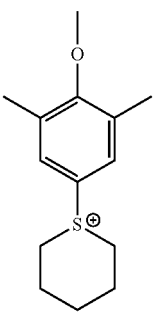
(ca-1-107)
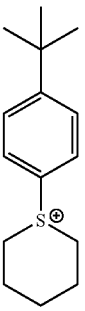
(ca-1-108)
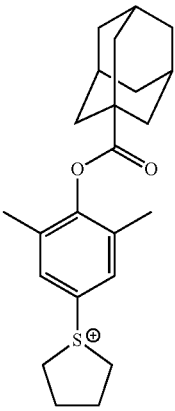
(ca-1-109)
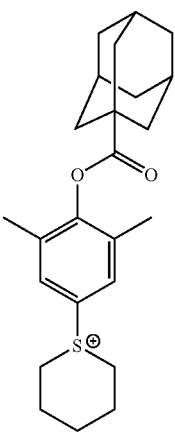

(ca-1-110)
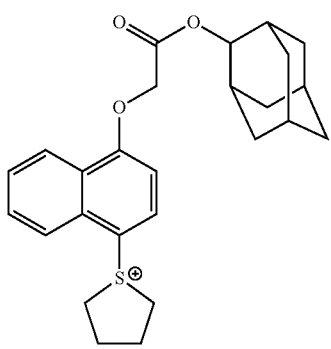
(ca-1-111)
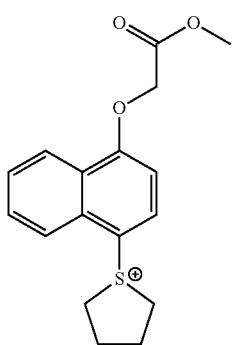
[In the formulae, $R''^{201}$ represents a hydrogen atom or a substituent, and as the substituent, the same groups as those described above for substituting $R^{201}$ to $R^{207}$ and $R^{210}$ to $R^{212}$ can be exemplified.]
(ca-1-112)
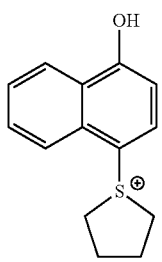
(ca-1-113)
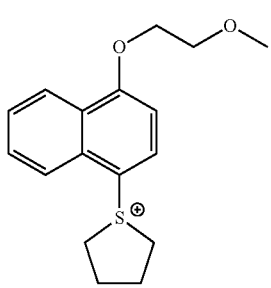
(ca-1-114)
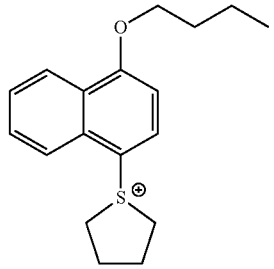
(ca-1-115)
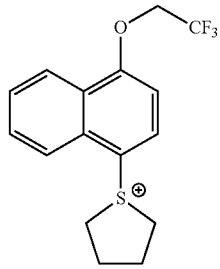
(ca-1-116)
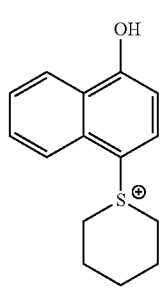
(ca-1-117)
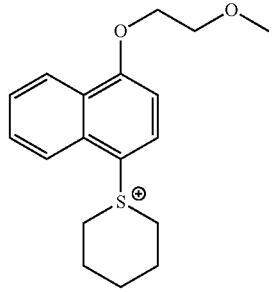
(ca-1-118)
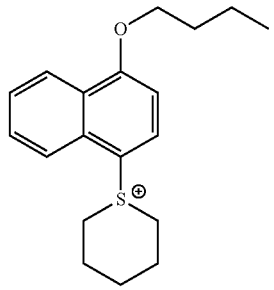

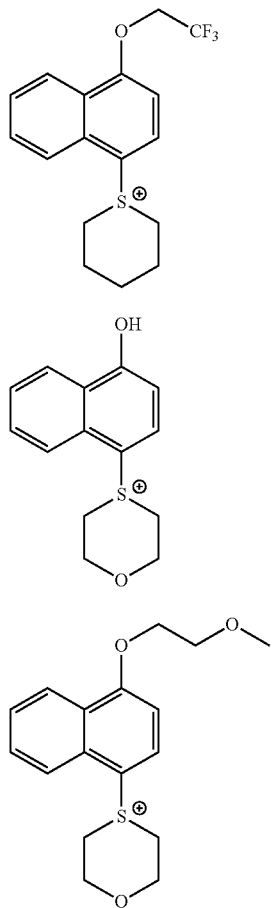
(ca-1-119)
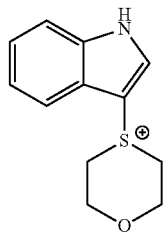
(ca-1-124)
(ca-1-120)
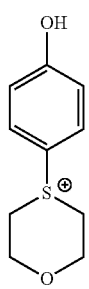
(ca-1-125)
(ca-1-121)
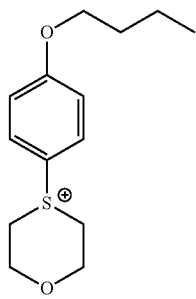
(ca-1-126)
(ca-1-122)
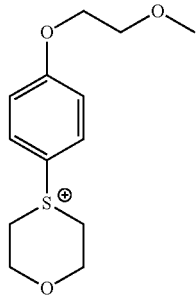
(ca-1-127)
(ca-1-123)
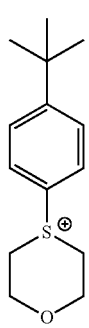
(ca-1-128)

(ca-1-129)

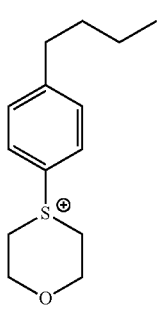

Specific examples of suitable cations represented by Formula (ca-2) include a dihphenyliodonium cation and a bis(4-tert-butylphenyl)iodonium cation.

Specific examples of suitable cations represented by Formula (ca-3) include cations represented by Formulae (ca-3-1) to (ca-3-6) shown below.

(ca-3-1)

(ca-3-2)

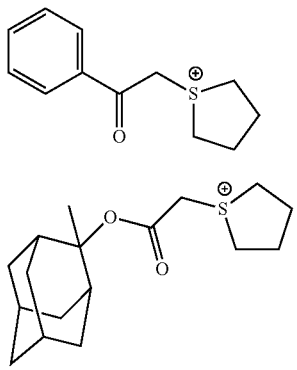

(ca-3-3)

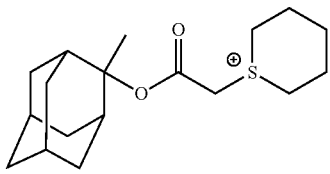

(ca-3-4)

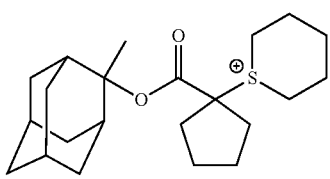

(ca-3-5)

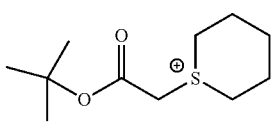

(ca-3-6)

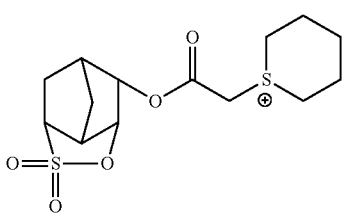

Specific examples of suitable cations represented by Formula (ca-4) include cations represented by Formulae (ca-4-1) and (ca-4-2) shown below.

(ca-4-1)

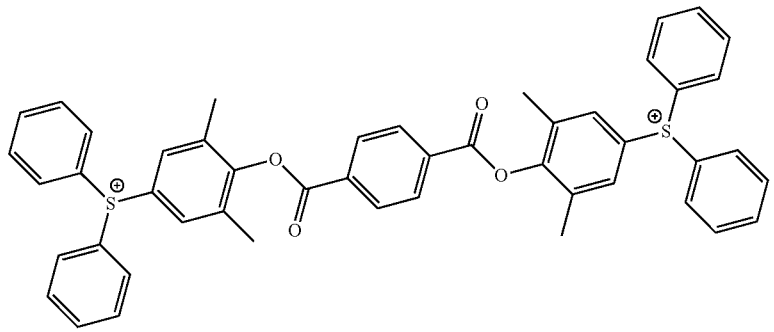

(ca-4-2)

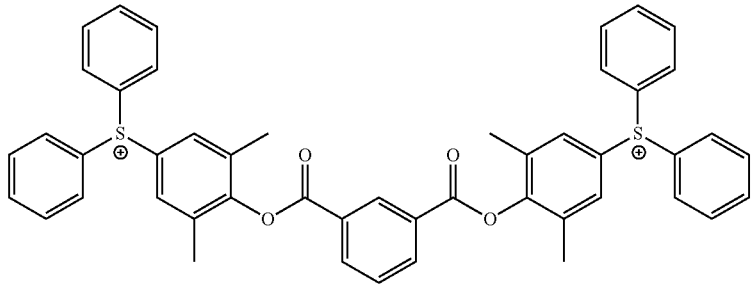

Further, as the cation represented by Formula (ca-5), cations represented by Formulae (ca-5-1) to (ca-5-3) are also preferable.
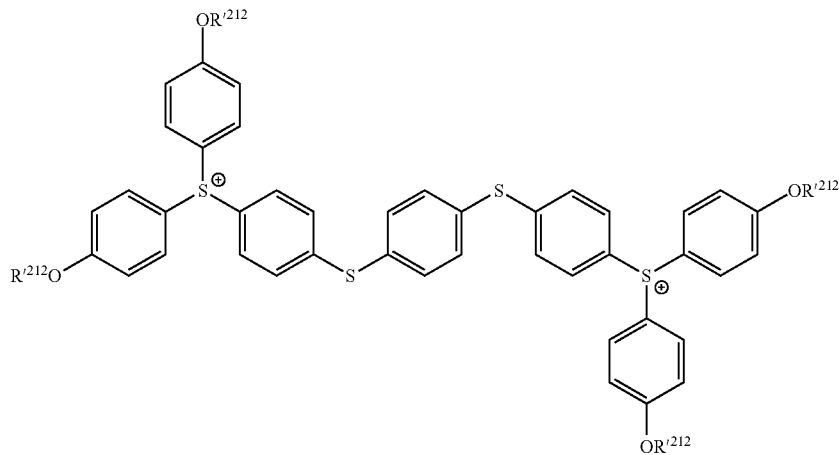
(ca-5-1)
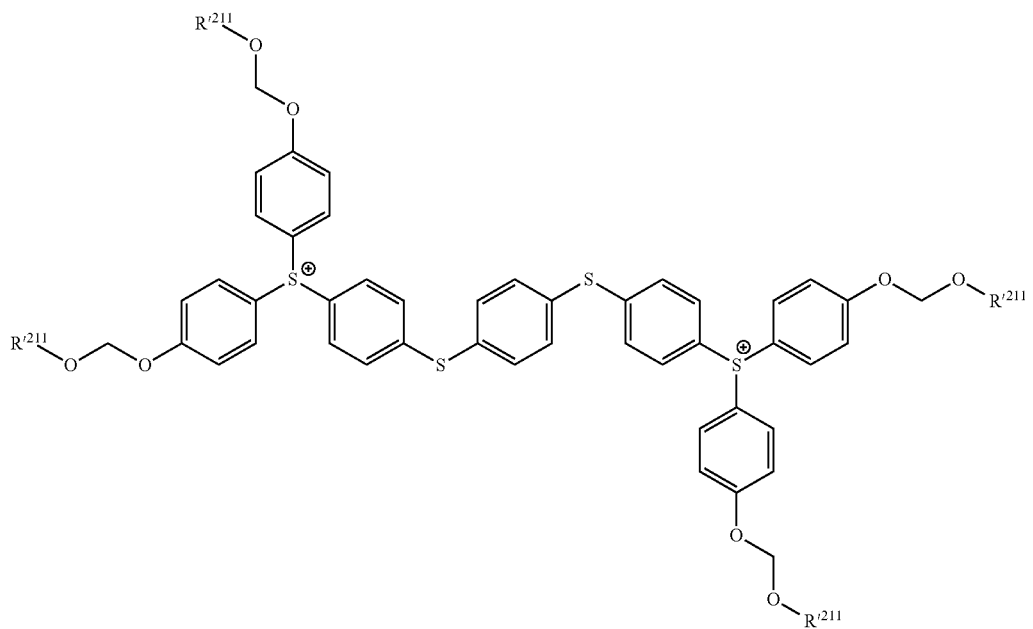
(ca-5-2)
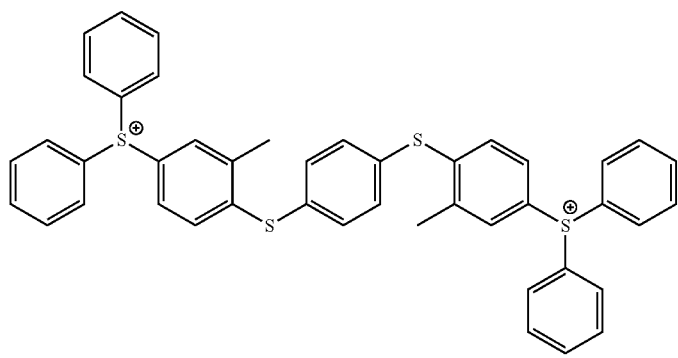
(ca-5-3)

Among the examples, as the cation moiety $[(M^{m+})_{1/m}]$, a cation represented by Formula (ca-1) is preferable, and a cation represented by any of Formulae (ca-1-1) to (ca-1-127) is more preferable.

Preferred examples of the component (B1) include a compound represented by Formula (b1-1).

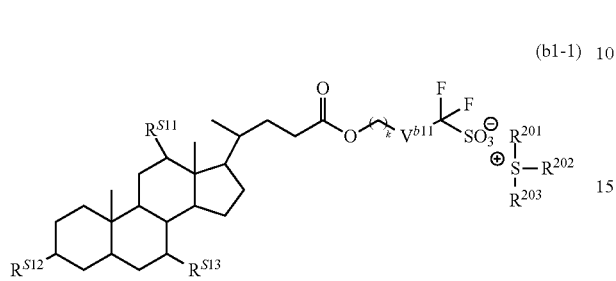
(b1-1)

[In the formula, $R^{S11}$ to $R^{S13}$, $V^{b11}$, k, and $R^{201}$ to $R^{203}$ each have the same definition as described above.]

Specific suitable examples of the component (B1) are shown below.

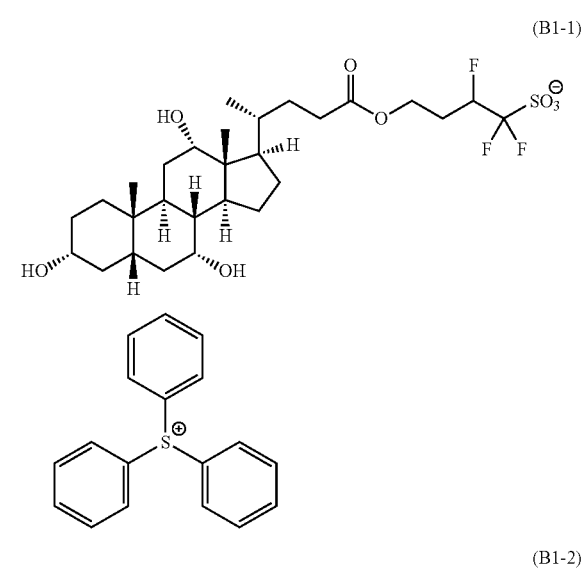
(B1-1)

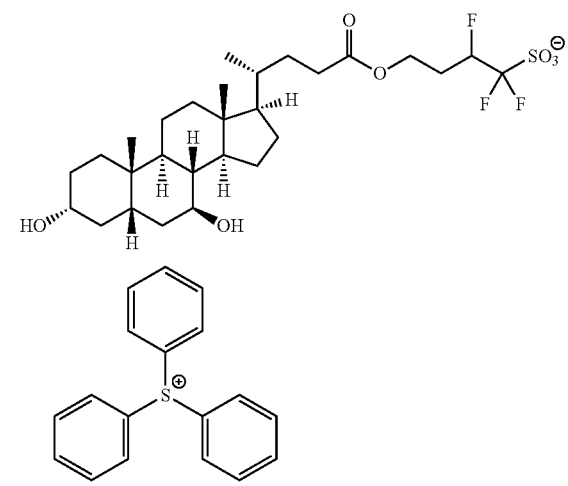
(B1-2)

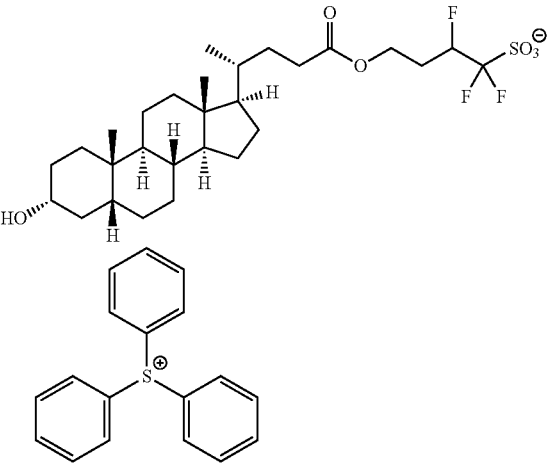
(B1-3)

In the resist composition of the present embodiment, the component (B1) may be used alone or in a combination of two or more kinds thereof.

The content of the component (B1) in the resist composition of the present embodiment is preferably in a range of 10 to 35 parts by mass, more preferably in a range of 10 to 25 parts by mass, and still more preferably in a range of 10 to 20 parts by mass with respect to 100 parts by mass of the component (A).

In a case where the content of the component (B1) is greater than or equal to the lower limit of the above-described preferable range, lithography characteristics such as the sensitivity and CDU are further improved at the time of forming a resist pattern. Meanwhile, in a case where the content thereof is less than or equal to the upper limit of the above-described preferable range, a uniform solution is easily obtained and the storage stability of a resist composition is further increased at the time of dissolving each component of the resist composition in an organic solvent.

The component (B1) can be produced according to a known method.

For example, the component (B1) can be obtained by reacting a fluoro-hydroxyalkyl sulfonate salt with cholic acid, ursodeoxycholic acid, lithocholic acid, or a derivative of these and reacting $Xha \cdot (M^{m+})_{1/m}$ (Xha represents a halogen atom) with the resultant.

«Component (B2)»

The resist composition of the present embodiment may further contain an acid generator component (hereinafter, referred to as a "component (B2)") other than the component (B1) in a range not damaging the effects of the present invention.

The component (B2) is not particularly limited, and those which have been proposed as an acid generator for a chemically amplified resist in the related art can be used.

Examples of these acid generators are numerous and include onium salt acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As the onium salt acid generator, a compound represented by Formula (b-1) (hereinafter, also referred to as "component (b-1)"), a compound represented by Formula (b-2) (hereinafter, also referred to as "component (b-2)") or a compound represented by Formula (b-3) (hereinafter, also referred to as "component (b-3)") can be used. Further, the component (b-1) does not contain a compound corresponding to the above-described component (B1).

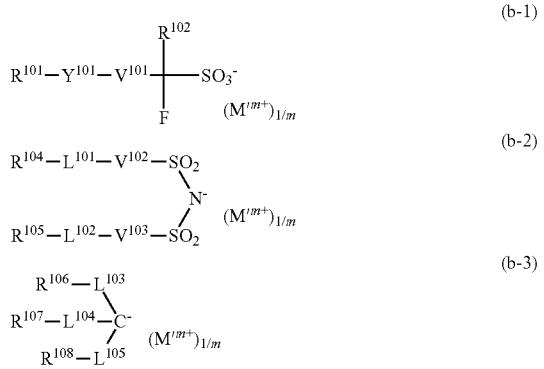

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent, provided that $R^{104}$ and $R^{105}$ may be bonded to each other to form a ring.

$R^{102}$ represents a fluorine atom or a fluorinated alkyl group having 1 to 5 carbon atoms. $Y^{101}$ represents a single bond or a divalent linking group containing an oxygen atom. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO— or —SO$_2$—. m represents an integer of 1 or greater, and $M'^{m+}$ represents an m-valent onium cation.]

[Anion Moiety]

Anion Moiety of Component (b-1)

In Formula (b-1), $R^{101}$ represents a cyclic group which may have a substituent, a chain-like alkyl group which may have a substituent, or a chain-like alkenyl group which may have a substituent. The description for $R^{101}$ is the same as the description for the cyclic group which may have a substituent, the chain-like alkyl group which may have a substituent, or the chain-like alkenyl group which may have a substituent as $R'^{201}$ in formulae (ca-r-1) to (ca-r-7).

Among the examples, as $R^{101}$, a cyclic group which may have a substituent is preferable, and a cyclic hydrocarbon group which may have a substituent is more preferable. More specific preferred examples thereof include a phenyl group, a naphthyl group, a group in which one or more hydrogen atoms have been removed from a polycycloalkane, a lactone-containing cyclic group represented by any of Formulae (a2-r-1) and (a2-r-3) to (a2-r-7), and a —SO$_2$-containing cyclic group represented by any of Formulae (a5-r-1) to (a5-r-4).

In Formula (b-1), $Y^{101}$ represents a single bond or a divalent linking group containing an oxygen atom.

In a case where $Y^{101}$ represents a divalent linking group containing an oxygen atom, $Y^{101}$ may contain an atom other than an oxygen atom. Examples of atoms other than an oxygen atom include a carbon atom, a hydrogen atom, a sulfur atom, and a nitrogen atom.

Examples of the divalent linking group having an oxygen atom include linking groups represented by Formulae (y-a1-1) to (y-a1-8)

$Y^{101}$ preferably represents a divalent linking group containing an ester bond or a divalent linking group containing an ether bond and more preferably linking groups represented by Formulae (y-a1-1) to (y-a1-6).

In Formula (b-1), $V^{101}$ represents a single bond, an alkylene group, or a fluorinated alkylene group. The alkylene group and the fluorinated alkylene group of $V^{101}$ preferably have 1 to 4 carbon atoms. Examples of the fluorinated alkylene group of $V^{101}$ include a group in which some or all hydrogen atoms in the alkylene group of $V^{101}$ have been substituted with fluorine atoms. Among these examples, as $V^{101}$, a single bond or a fluorinated alkylene group having 1 to 4 carbon atoms is preferable.

In Formula (b-1), $R^{102}$ represents a fluorine atom or a fluorinated alkyl group having 1 to 5 carbon atoms. $R^{102}$ preferably represents a fluorine atom or a perfluoroalkyl group having 1 to 5 carbon atoms and more preferably a fluorine atom.

As a specific example of the anion moiety for the component (b-1), in a case where $Y^{101}$ represents a single bond, a fluorinated alkylsulfonate anion such as a trifluoromethanesulfonate anion or a perfluorobutanesulfonate anion can be exemplified; and in a case where $Y^{101}$ represents a divalent linking group containing an oxygen atom, anions represented by Formulae (an-1) to (an-3) shown below can be exemplified.

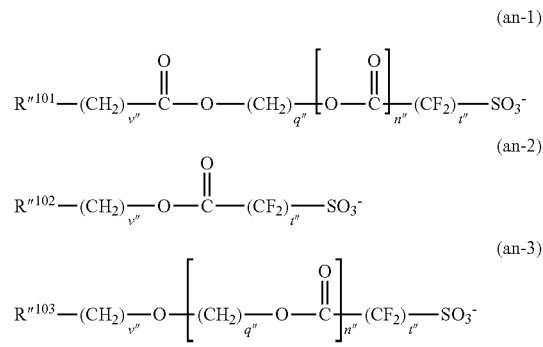

[In the formulae, $R'''^{101}$ represents an aliphatic cyclic group which may have a substituent, a group represented by any of Formulae (r-hr-1) to (r-hr-6), or a chain-like alkyl group which may have a substituent; $R'''^{102}$ represents an aliphatic cyclic group which may have a substituent, a lactone-containing cyclic group represented by any of Formulae (a2-r-1) and (a2-r-3) to (a2-r-7), or a —SO$_2$-containing cyclic group represented by any of Formulae (a5-r-1) to (a5-r-4); $R'''^{103}$ represents an aromatic cyclic group which may have a substituent, an aliphatic cyclic group which may have a substituent, or a chain-like alkenyl group which may have a substituent; each v" independently represents an integer of 0 to 3; each q" independently represents an integer of 1 to 20; t" represents an integer of 1 to 3; and n" represents 0 or 1.]

As the aliphatic cyclic group of $R'''^{101}$, $R'''^{102}$, and $R'''^{103}$ which may have a substituent, the same groups as the cyclic aliphatic hydrocarbon group of $R'^{201}$ described above are preferable. As the substituent, the same groups as the substituents which may substitute the cyclic aliphatic hydrocarbon group of $R'^{201}$ can be exemplified.

As the aromatic cyclic group of $R''^{103}$ which may have a substituent, the same groups as the aromatic hydrocarbon group for the cyclic hydrocarbon group represented by $R'^{201}$ described above are preferable.

As the substituent, the same groups as the substituents which may substitute the aromatic hydrocarbon group of $R'^{201}$ can be exemplified.

As the chain-like alkyl group of $R''^{101}$ which may have a substituent, the same groups exemplified as the chain-like alkyl groups represented by $R'^{201}$ are preferable. As the chain-like alkenyl group of $R''^{103}$ which may have a substituent, the same groups exemplified as the chain-like alkenyl groups represented by $R'^{201}$ are preferable.

Anion Moiety of Component (b-2)

In Formula (b-2), $R^{104}$ and $R^{105}$ each independently represent a cyclic group which may have a substituent, a chain-like alkyl group which may have a substituent or a chain-like alkenyl group which may have a substituent, and have the same definition as that for $R'^{201}$ in Formula (b-1). Here, $R^{104}$ and $R'^{105}$ may be bonded to each other to form a ring.

As $R'^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. It is preferable that the number of carbon atoms in the chain-like alkyl group of $R'^{104}$ and $R'^{105}$ be small because the solubility in a solvent for a resist is also excellent in such a range of the number of carbon atoms. Further, in the chain-like alkyl group of $R'^{104}$ and $R^{105}$, it is preferable that the number of hydrogen atoms substituted with fluorine atoms be as large as possible because the acid strength increases and the transparency to high energy radiation of 200 nm or less or electron beams is improved.

The proportion of fluorine atoms in the chain-like alkyl group, that is, the fluorination ratio, is preferably in a range of 70% to 100% and more preferably in a range of 90% to 100%, and it is most preferable that the chain-like alkyl group be a perfluoroalkyl group in which all hydrogen atoms are substituted with fluorine atoms.

In Formula (b-2), $V^{102}$ and $V^{103}$ each independently represent a single bond, an alkylene group, or a fluorinated alkylene group, and have the same definition as that for $V^{101}$ in Formula (b-1).

In Formula (b-2), $L^{101}$ and $L^{102}$ each independently represent a single bond or an oxygen atom.

Anion Moiety of Component (b-3)

In Formula (b-3), $R^{106}$ to $R^{108}$ each independently represent a cyclic group which may have a substituent, a chain-like alkyl group which may have a substituent, or a chain-like alkenyl group which may have a substituent, and have the same definition as that for $R'^{201}$.

$L^{103}$ to $L^{105}$ each independently represent a single bond, —CO—, or —SO$_2$—.

[Cation Moiety]

In Formulae (b-1), (b-2), and (b-3), m represents an integer of 1 or greater, represents an m-valent onium cation and preferably a sulfonium cation or an iodonium cation. Further, an organic cation represented by any of Formulae (ca-1) to (ca-5) is particularly preferable.

Specific suitable examples of the cation represented by Formula (ca-1) include cations represented by Formulae (ca-1-1) to (ca-1-129).

Specific suitable examples of the cation represented by Formula (ca-2) include a diphenyliodonium cation and a bis(4-tert-butylphenyl)iodonium cation.

Specific suitable examples of the cation represented by Formula (ca-3) include cations represented by Formulae (ca-3-1) to (ca-3-6).

Specific suitable examples of the cation represented by Formula (ca-4) include cations represented by Formulae (ca-4-1) and (ca-4-2).

Specific suitable examples of the cation represented by Formula (ca-5) include cations represented by Formulae (ca-5-1) to (ca-5-3).

Among the examples, as the cation moiety $[(M^{m+})_{1/m}]$, a cation represented by Formula (ca-1) is preferable, and a cation represented by any of Formulae (ca-1-1) to (ca-1-129) is more preferable.

In the resist composition of the present embodiment, the component (B2) may be used alone or in a combination of two or more kinds thereof.

If the resist composition contains the component (B2), the content of the component (B2) in the resist composition is preferably 50 parts by mass or less, more preferably in a range of 1 to 40 parts by mass, and still more preferably in a range of 5 to 30 parts by mass with respect to 100 parts by mass of the component (A).

By setting the content of the component (B2) to be in the above-described range, pattern formation is sufficiently performed. Further, since a uniform solvent is easily obtained and the storage stability of the resist composition becomes excellent at the time of dissolving each component of the resist composition in an organic solvent, it is preferable that the content of the component (B2) be in the above-described range.

<Other Components>

The resist composition of the present embodiment may further contain components in addition to the component (A) or in addition to the component (A) and the component (B).

As other components, a component (D), a component (E), a component (F), and a component (S) described below are exemplified.

《Component (D): Acid Diffusion Control Agent Component》

The resist composition of the present embodiment may further contain an acid diffusion control agent component (hereinafter, referred to as a "component (D)") in addition to the component (A) or the component (A) and the component (B). The component (D) acts as a quencher (an acid diffusion control agent) which traps the acid generated in the resist composition upon exposure.

The component (D) may be a photodecomposable base (D1) (hereinafter, referred to as "component (D1)") which is decomposed upon exposure and then loses the acid diffusion controllability or a nitrogen-containing organic compound (D2) (hereinafter, referred to as "component (D2)") which does not correspond to the component (D1).

In Regard to Component (D1)

In a case where a resist composition containing the component (D1) is obtained, the contrast between exposed portions and unexposed portions of the resist film can be further improved at the time of formation of a resist pattern.

The component (D1) is not particularly limited as long as decomposition occurs upon exposure so that the acid diffusion controllability is lost, and one or more compounds selected from the group consisting of a compound represented by Formula (d1-1) (hereinafter, referred to as a "component (d1-1)"), a compound represented by Formula (d1-2) (hereinafter, referred to as "component (d1-2)"), and a compound represented by Formula (d1-3) (hereinafter, referred to as "component (d1-3)") are preferable.

At exposed portions of the resist film, the components (d1-1) to (d1-3) are decomposed and then lose the acid diffusion controllability (basicity), and therefore the components (d1-1) to (d1-3) cannot act as a quencher, whereas at unexposed portions of the resist film, the components (d1-1) to (d1-3) act as a quencher.

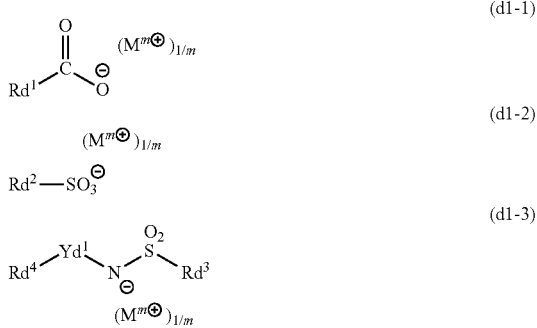

[In the formulae, $Rd^1$ to $Rd^4$ represent a cyclic group which may have a substituent, a chain-like alkyl group which may have a substituent or a chain-like alkenyl group which may have a substituent, provided that the carbon atom adjacent to the sulfur atom in the $Rd^2$ in Formula (d1-2) has no fluorine atom bonded thereto; $Yd^1$ represents a single bond or a divalent linking group; m represents an integer of 1 or greater; and each $M^{m+}$ independently represents an m-valent organic cation.]

{Component (d1-1)}
Anion Moiety

In Formula (d1-1), $Rd^1$ represents a cyclic group which may have a substituent, a chain-like alkyl group which may have a substituent or a chain-like alkenyl group which may have a substituent, and examples thereof are the same as those described above as $R'^{201}$.

Among these, as the group of $Rd^1$, an aromatic hydrocarbon group which may have a substituent, an aliphatic cyclic group which may have a substituent and a chain-like alkyl group which may have a substituent are preferable. Examples of the substituent for these groups include a hydroxyl group, an oxo group, an alkyl group, an aryl group, a fluorine atom, a fluorinated alkyl group, a lactone-containing cyclic group represented by any of Formulae (a2-r-1) to (a2-r-7), an ether bond, an ester bond, and a combination thereof. In a case where an ether bond or an ester bond is included as the substituent, the substituent may be bonded via an alkylene group, and a linking group represented by any of Formulae (y-al-1) to (y-al-5) is preferable as the substituent.

Suitable examples of the aromatic hydrocarbon group include a phenyl group, a naphthyl group, and a polycyclic structure (a polycyclic structure formed of a bicyclooctane skeleton and a ring structure other than the bicyclooctane skeleton) containing a bicyclooctane skeleton.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group of a substituent, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom, and a nitrogen atom.

As $Rd^1$, a fluorinated alkyl group in which some or all hydrogen atoms constituting a linear alkyl group have been substituted with fluorine atoms is preferable, and a fluorinated alkyl group in which all of the hydrogen atoms constituting a linear alkyl group have been substituted with fluorine atoms (a linear perfluoroalkyl group) is particularly preferable.

Specific examples of preferable anion moieties for the component (d1-1) are shown below.

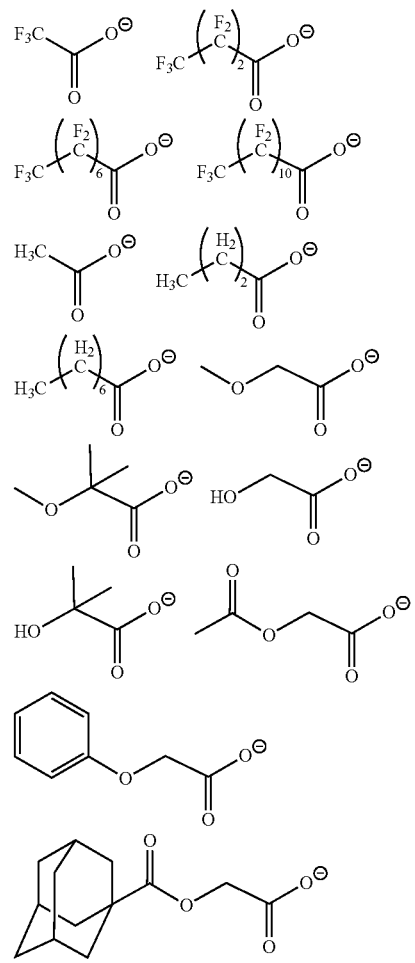

-continued

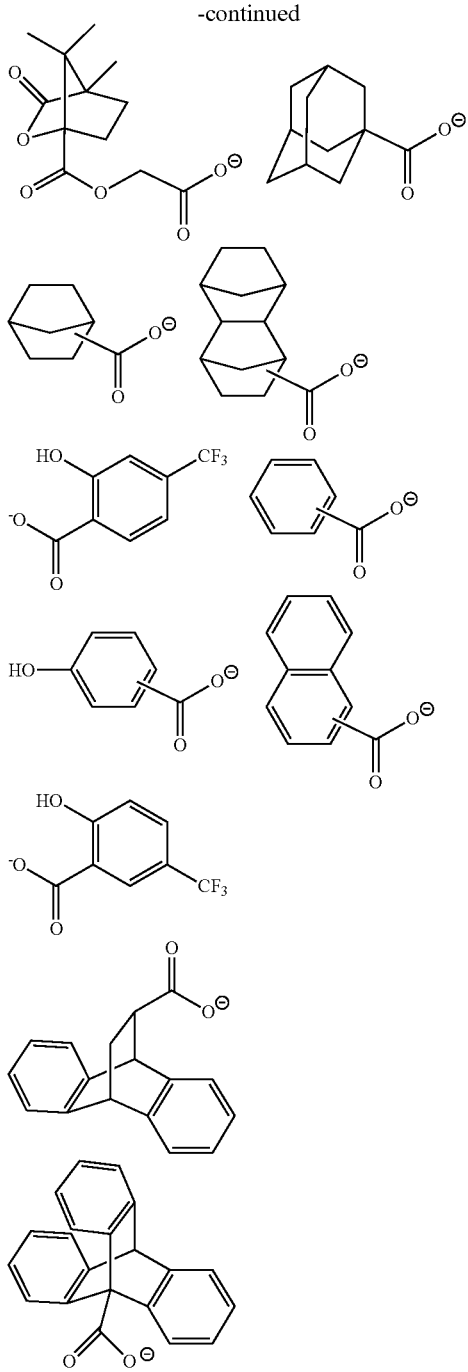

Cation Moiety

In Formula (d1-1), $M^{m+}$ represents an m-valent organic cation.

As the organic cation as $M^{m+}$, the same cations as those represented by Formulae (ca-1) to (ca-5) are suitably exemplified, a cation represented by the above-described Formulae (ca-1) is more preferable, and cations represented Formulae (ca-1-1) to (ca-1-129) are still more preferable.

The component (d1-1) may be used alone or in a combination of two or more kinds thereof.

{Component (d1-2)}

Anion Moiety

In Formula (d1-2), $Rd^2$ represents a cyclic group which may have a substituent, a chain-like alkyl group which may have a substituent, or a chain-like alkenyl group which may have a substituent, and the same groups as those described above as $R'^{201}$ are exemplified.

Here, the carbon atom adjacent to the S atom in $Rd^2$ has no fluorine atom bonded thereto (the carbon atom adjacent to the sulfur atom in $Rd^2$ is not substituted with a fluorine atom). As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group preferably has 1 to 10 carbon atoms and more preferably 3 to 10 carbon atoms. As the aliphatic cyclic group, a group in which one or more hydrogen atoms have been removed from adamantane, norbornane, isobornane, tricyclodecane, or tetracyclododecane (which may have a substituent) and a group in which one or more hydrogen atoms have been removed from camphor are more preferable.

The hydrocarbon group of $Rd^2$ may have a substituent. As the substituent, the same groups as the substituents which may be included in the hydrocarbon group (such as an aromatic hydrocarbon group, an aliphatic cyclic group, or a chain-like alkyl group) of $Rd^1$ in Formula (d1-1) can be exemplified.

Specific examples of preferable anion moieties for the component (d1-2) are shown below.

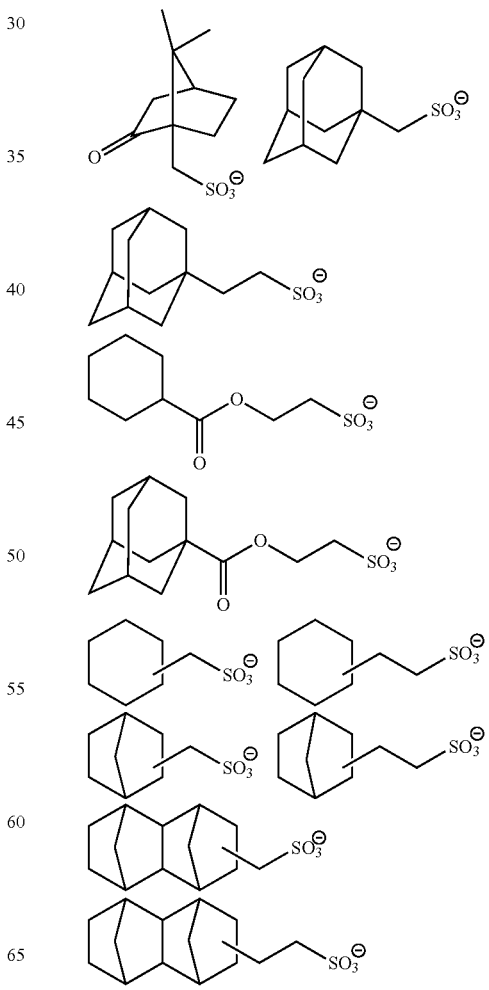

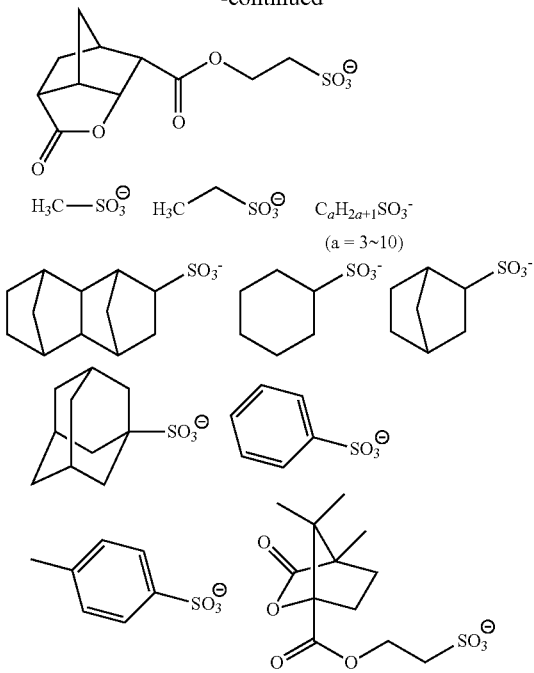

Cation Moiety

In Formula (d1-2), $M^{m+}$ represents an m-valent organic cation, and has the same definition as that for $M^{m+}$ in the above-described Formula (d1-1).

The component (d1-2) may be used alone or in a combination of two or more kinds thereof.

{Component (d1-3)}
Anion Moiety

In Formula (d1-3), $Rd^3$ represents a cyclic group which may have a substituent, a chain-like alkyl group which may have a substituent, or a chain-like alkenyl group which may have a substituent, and the same groups as those described above as $R'^{201}$ are exemplified, and a cyclic group containing a fluorine atom, a chain-like alkyl group, or a chain-like alkenyl group is preferable. Among these, a fluorinated alkyl group is preferable, and the same fluorinated alkyl groups as those described above as $Rd^1$ are more preferable.

In Formula (d1-3), $Rd^4$ represents a cyclic group which may have a substituent, a chain-like alkyl group which may have a substituent or a chain-like alkenyl group which may have a substituent, and the same groups as those described above as $R'^{201}$ are exemplified.

Among these, an alkyl group which may have substituent, an alkoxy group which may have substituent, an alkenyl group which may have substituent, or a cyclic group which may have substituent is preferable.

The alkyl group of $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. Some hydrogen atoms in the alkyl group of $Rd^4$ may be substituted with a hydroxyl group, a cyano group, or the like.

The alkoxy group of $Rd^4$ is preferably an alkoxy group having 1 to 5 carbon atoms, and specific examples thereof include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group of $Rd^4$ are the same groups as those exemplified as the alkenyl group represented by $R'^{201}$, and a vinyl group, a propenyl group (an allyl group), a 1-methylpropenyl group, and a 2-methylpropenyl group are preferable. These groups may have an alkyl group having 1 to 5 carbon atoms or a halogenated alkyl group having 1 to 5 carbon atoms as a substituent.

As the cyclic group of $Rd^4$, the same groups as those described above as $R'^{201}$ can be exemplified. Among these, as the cyclic group, an alicyclic group in which one or more hydrogen atoms have been removed from a cycloalkane such as cyclopentane, cyclohexane, adamantane, norbomane, isobomane, tricyclodecane or tetracyclododecane or an aromatic group such as a phenyl group or a naphthyl group is preferable. In a case where $Rd^4$ represents an alicyclic group, the resist composition can be satisfactorily dissolved in an organic solvent, thereby improving the lithography characteristics. Further, in a case where $Rd^4$ represents an aromatic group, the resist composition exhibits excellent photoabsorption efficiency in a lithography process using EUV or the like as the exposure light source, thereby resulting in the improvement of the sensitivity and the lithography characteristics.

In Formula (d1-3), $Yd^1$ represents a single bond or a divalent linking group.

The divalent linking group of $Yd^1$ is not particularly limited, and examples thereof include a divalent hydrocarbon group (an aliphatic hydrocarbon group or an aromatic hydrocarbon group) which may have a substituent and a divalent linking group containing a hetero atom. The divalent linking groups are the same as described above as the divalent hydrocarbon group which may have a substituent and the divalent linking group containing a hetero atom explained above as the divalent linking group of $Ya^{21}$ in Formula (a2-1).

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Specific examples of preferable anion moieties for the component (d1-3) are shown below.

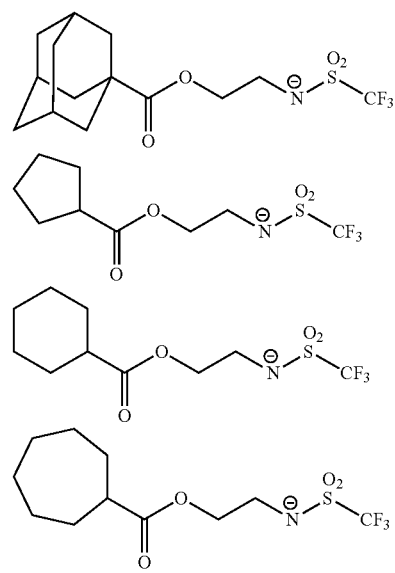

149
-continued
150
-continued
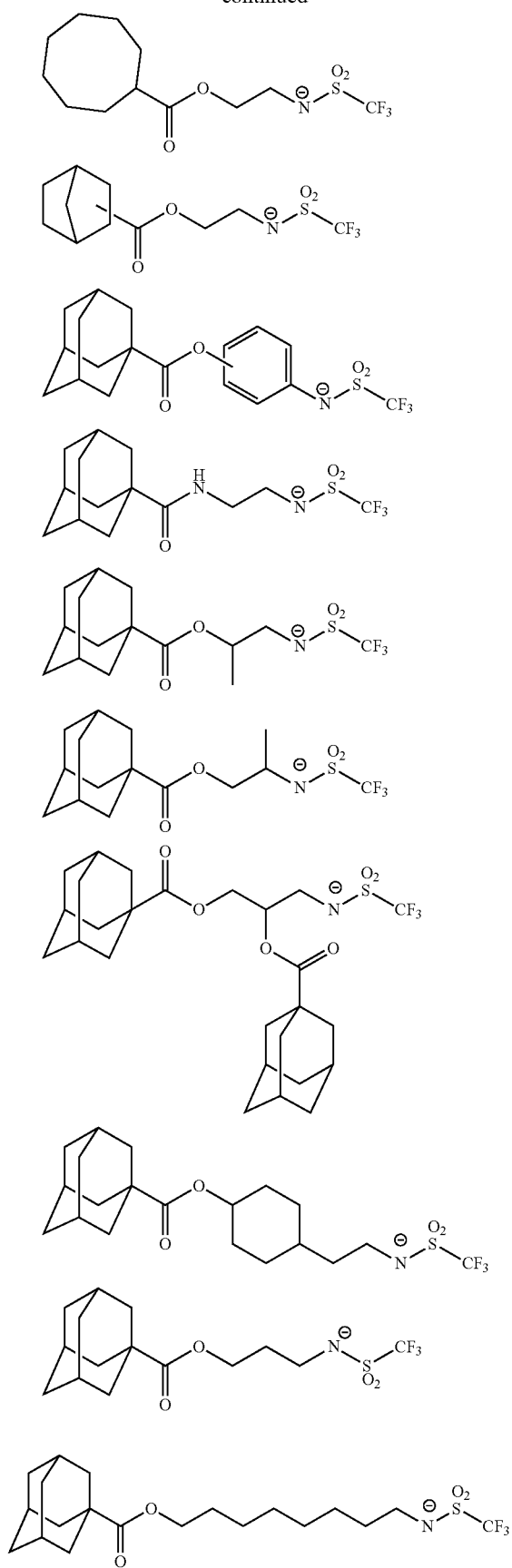
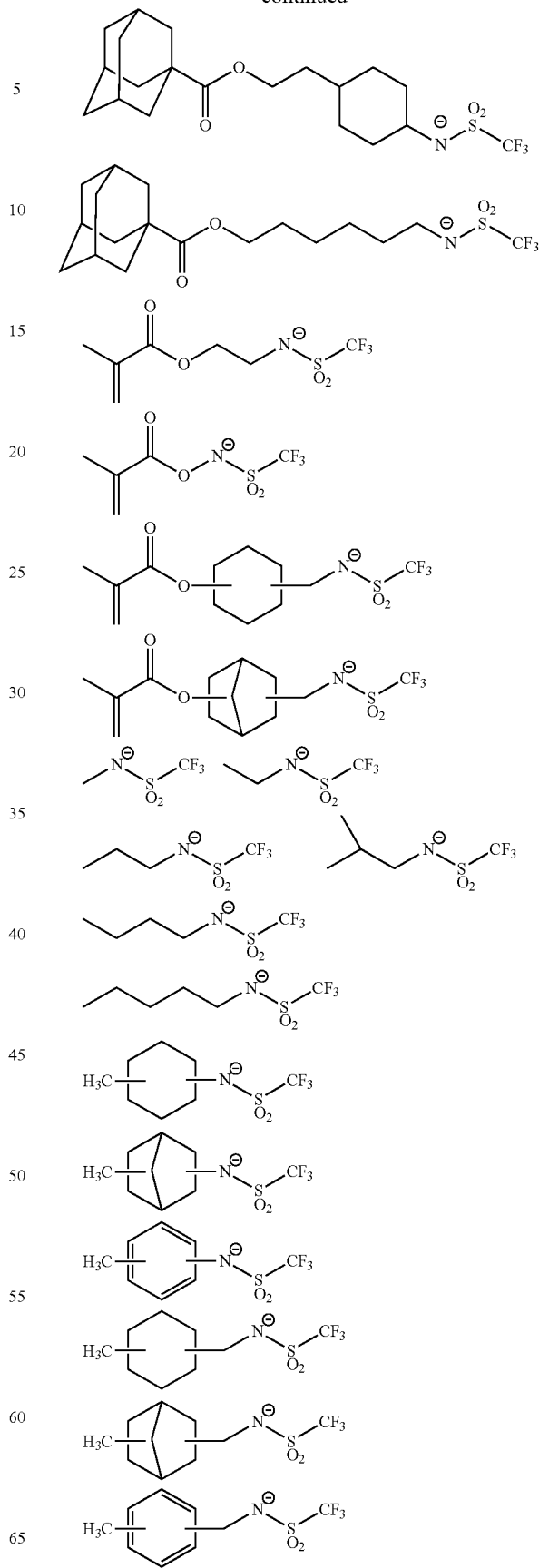

-continued

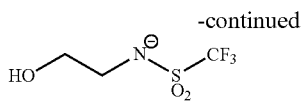

Cation Moiety

In Formula (d1-3), $M^{m+}$ represents an m-valent organic cation, and has the same definition as that for $M^{m+}$ in Formula (d1-1).

The component (d1-3) may be used alone or in a combination of two or more kinds thereof.

As the component (D1), only one of the above-described components (d1-1) to (d1-3) or a combination of two or more kinds thereof may be used. Suitable examples of the component (D1) include a combination of the component (d1-1) and the component (d1-2).

In a case where the resist composition contains the component (D1), the content of the component (D1) in the resist composition is preferably in a range of 0.5 to 20 parts by mass, more preferably in a range of 1 to 15 parts by mass, and still more preferably in a range of 5 to 10 parts by mass with respect to 100 parts by mass of the component (A).

In a case where the content of the component (D1) is greater than or equal to the preferable lower limit, excellent lithography characteristics and an excellent resist pattern shape can be more reliably obtained. Further, in a case where the content thereof is less than or equal to the upper limit thereof, the sensitivity can be maintained satisfactorily, and through-put also becomes excellent.

Method of Producing Component (D1):

The production methods of the components (d1-1) and (d1-2) are not particularly limited, and the components (d1-1) and (d1-2) can be produced by known methods.

Further, the method of producing the component (d1-3) is not particularly limited, and the component (d1-3) can be produced in the same manner as disclosed in United States Patent Application, Publication No. 2012-0149916.

Component (D2)

The resist composition may contain a nitrogen-containing organic compound component (hereinafter, referred to as a "component (D2)") that does not correspond to the component (D1) as the acid diffusion control agent component.

The component (D2) is not particularly limited, as long as it acts as an acid diffusion control agent and does not correspond to the component (D1). As the component (D2), any of the conventionally known compounds may be optionally used. Among these, an aliphatic amine is preferable, and a secondary aliphatic amine or tertiary aliphatic amine is particularly preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group having 12 or fewer carbon atoms (alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof as well as tribenzylamine, 2,6-diisopropylaniline and N-tert-butoxycarbonylpyrrolidine.

The component (D2) may be used alone or in a combination of two or more kinds thereof.

In a case where the resist composition contains the component (D2), the content of the component (D2) in the resist composition is typically in a range of 0.01 to 5 parts by mass with respect to 100 parts by mass of the component (A). In a case where the content thereof is in the above-described range, the shape of the resist pattern and the post exposure temporal stability are improved.

«Compound (E): At Least One Compound Selected from Group Consisting of Organic Carboxylic Acids, Phosphorus Oxo Acids, and Derivatives Thereof»

For the purpose of preventing any deterioration in sensitivity, and improving the resist pattern shape and the post exposure temporal stability, the resist composition of the present embodiment may contain at least one compound (E) (hereinafter referred to as the component (E)) selected from the group consisting of an organic carboxylic acid, or a phosphorus oxo acid and a derivative thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid, and phosphinic acid. Among these, phosphonic acid is particularly preferable.

Examples of phosphorus oxo acid derivatives include esters in which a hydrogen atom in the above-described oxo acids is substituted with a hydrocarbon group. Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate, and dibenzyl phosphonate.

Examples of phosphinic acid derivatives include phosphinic acid esters and phenylphosphinic acid.

In the resist composition of the present embodiment, the component (E) may be used alone or in a combination of two or more kinds thereof.

In a case where the resist composition contains the component (E), the content of the component (E) is typically in a range of 0.01 to 5 parts by mass, with respect to 100 parts by mass of the component (A).

《Component (F): Fluorine Additive Component》

In the present embodiment, the resist composition may further include a fluorine additive (hereinafter, referred to as "component (F)") for imparting water repellency to the resist film.

As the component (F), fluorine-containing polymeric compounds described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be exemplified.

Specific examples of the component (F) include polymers having a constitutional unit (f1) represented by Formula (f1-1) shown below. As the polymer, a polymer (homopolymer) formed of only a constitutional unit (f1) represented by Formula (f1-1) shown below; a copolymer of the constitutional unit (f1) and the constitutional unit (a1); and a copolymer of the constitutional unit (f1), a constitutional unit derived from acrylic acid or methacrylic acid and the above-described constitutional unit (a1) are preferable. Examples of the constitutional unit (a1) to be copolymerized with the constitutional unit (f1) include a constitutional unit derived from 1-ethyl-1-cyclooctyl (meth)acrylate and a constitutional unit derived from 1-methyl-1-adamantyl (meth)acrylate.

Further, specific examples of the component (F) include a polymer having a constitutional unit represented by Formula (f1-2). As the polymer, a polymer (homopolymer) formed of only a constitutional unit (f2) represented by Formula (f1-2); or a copolymer of the constitutional unit (f2) and the constitutional unit (a4) is preferable. Here, as the constitutional unit (a4) to be copolymerized with the constitutional unit (f2), any of constitutional units represented by Formulae (a4-1) to (a4-7) is preferable, and a constitutional unit represented by Formula (a4-2) is more preferable.

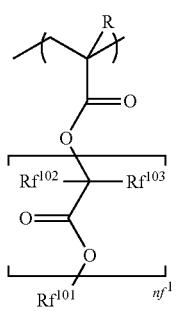

(f1-1)

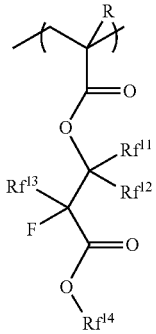

(f1-2)

[In the formulae, R has the same definition as described above. $Rf^{102}$ and $Rf^{103}$ each independently represent a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other. $nf^1$ represents an integer of 0 to 5, and $Rf^{101}$ represents an organic group containing a fluorine atom. $R^{f11}$ and $R^{f12}$ each independently represent a hydrogen atom, an alkyl group having 1 to 4 carbon atoms, or a fluorinated alkyl group having 1 to 4 carbon atoms. $R^{f13}$ represents a fluorine atom or a fluorinated alkyl group having 1 to 4 carbon atoms. $R^{f14}$ represents a linear or branched alkyl group having 1 to 4 carbon atoms or a linear fluorinated alkyl group having 1 to 4 carbon atoms.

In Formula (f1-1), R bonded to the carbon atom at the α-position has the same definition as described above. As R, a hydrogen atom or a methyl group is preferable.

In Formula (f1-1), examples of the halogen atom of $Rf^{102}$ and $RF^{103}$ include a fluorine atom, a chlorine atom, a bromine atom, and an iodine atom, and a fluorine atom is particularly preferable. Examples of the alkyl group having 1 to 5 carbon atoms of $Rf^{102}$ and $Rf^{103}$ include those described above as the alkyl group having 1 to 5 carbon atoms of R, and a methyl group or an ethyl group is preferable. Specific examples of the halogenated alkyl group having 1 to 5 carbon atoms of $Rf^{102}$ and $RF^{103}$ include groups in which some or all hydrogen atoms of the above-described alkyl groups of 1 to 5 carbon atoms have been substituted with halogen atoms.

Examples of the halogen atom include a fluorine atom, a chlorine atom, a bromine atom, and an iodine atom, and a fluorine atom is particularly preferable. Among these examples, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In Formula (f1-1), $nf^1$ represents an integer of 1 to 5, preferably an integer of 1 to 3, and more preferably an integer of 1 or 2.

In Formula (f1-1), $Rf^{101}$ represents an organic group containing a fluorine atom, and is preferably a hydrocarbon group containing a fluorine atom.

The hydrocarbon group containing a fluorine atom may be linear, branched, or cyclic, and preferably has 1 to 20 carbon atoms, more preferably 1 to 15 carbon atoms, and particularly preferably 1 to 10 carbon atoms.

It is preferable that the hydrocarbon group having a fluorine atom have 25% or more of the hydrogen atoms in the hydrocarbon group fluorinated, more preferably 50% or greater, and particularly preferably 60% or greater from the viewpoint of improving the hydrophobicity of the resist film during immersion exposure.

Among these, as $Rf^{101}$, a fluorinated hydrocarbon group having 1 to 6 carbon atoms is preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are most preferable.

In Formula (f1-2), R bonded to the carbon atom at the α-position has the same definition as described above. It is preferable that R represent a hydrogen atom or a methyl group.

In Formula (f1-2), $Rf^{11}$ and $Rf^{12}$ each independently represent a hydrogen atom, an alkyl group having 1 to 4 carbon atoms, or a fluorinated alkyl group having 1 to 4 carbon atoms.

The alkyl group having 1 to 4 carbon atoms of $Rf^{11}$ and $Rf^{12}$ may be linear, branched, or cyclic, and a linear or branched alkyl group is preferable. Specific examples thereof include a methyl group and an ethyl group. Among these, an ethyl group is particularly preferable.

The fluorinated alkyl group having 1 to 4 carbon atoms of $Rf^{11}$ and $Rf^{12}$ is a group in which some or all hydrogen atoms in the alkyl group having 1 to 4 carbon atoms have been substituted with fluorine atoms. In the fluorinated alkyl group, the alkyl group in which the substitution with fluorine atoms has not been performed may be linear, branched, or cyclic, and examples thereof are those exemplified as the "alkyl group having 1 to 4 carbon atoms of $Rf^{11}$ and $Rf^{12}$".

Among these, it is preferable that $Rf^{11}$ and $Rf^{12}$ represent a hydrogen atom or an alkyl group having 1 to 4 carbon atoms and particularly preferable that one of $Rf^{11}$ and $Rf^{12}$ represent a hydrogen atom and the other represent an alkyl group having 1 to 4 carbon atoms.

In Formula (f1-2), $Rf^{13}$ represents a fluorine atom or a fluorinated alkyl group having 1 to 4 carbon atoms.

Examples of the fluorinated alkyl group having 1 to 4 carbon atoms of $Rf^{13}$ are those exemplified as the "fluorinated alkyl group having 1 to 4 carbon atoms of $Rf^{11}$ and $Rf^{12}$", and the number of carbon atoms thereof is preferably in a range of 1 to 3 and more preferably 1 or 2.

In the fluorinated alkyl group of $Rf^{13}$, the ratio (fluorination ratio (%)) of the number of fluorine atoms to the total number of fluorine atoms and hydrogen atoms contained in the fluorinated alkyl group is preferably in a range of 30% to 100% and more preferably in a range of 50% to 100%. As the fluorination ratio is increased, the hydrophobicity of the resist film is increased.

In Formula (f1-2), $Rf^{14}$ represents a linear or branched alkyl group having 1 to 4 carbon atoms or a linear fluorinated alkyl group having 1 to 4 carbon atoms and preferably a linear alkyl group having 1 to 4 carbon atoms or a linear fluorinated alkyl group having 1 to 4 carbon atoms.

Specific examples of the alkyl group of $Rf^{14}$ include a methyl group, an ethyl group, a propyl group, an isopropyl group, an n-butyl group, an isobutyl group, and a tert-butyl group. Among these, a methyl group or an ethyl group is preferable, and a methyl group is most preferable.

Specific suitable examples of the fluorinated alkyl group of $Rf^{14}$ include $-CH_2-CF_3$, $-CH_2-CH_2-CF_3$, $-CH_2-CF_2-CF_3$, and $-CH_2-CF_2-CF_2-CF_3$. Among these, $-CH_2-CH_2-CF_3$ or $-CH_2-CF_3$ is particularly preferable.

The weight average molecular weight (Mw) (in terms of polystyrene determined by gel permeation chromatography) of the component (F) is preferably in a range of 1,000 to 50,000, more preferably in a range of 5,000 to 40,000, and most preferably in a range of 10,000 to 30,000. In a case where the weight average molecular weight is less than or equal to the upper limit of the above-described range, the resist composition exhibits satisfactory solubility in a solvent for a resist to be used as a resist. On the other hand, in a case where the weight average molecular weight is greater than or equal to the lower limit of the above-described range, dry etching resistance and the cross-sectional shape of the resist pattern become excellent.

Further, the dispersity (Mw/Mn) of the component (F) is preferably in a range of 1.0 to 5.0, more preferably in a range of 1.0 to 4.0, and most preferably in a range of 1.0 to 2.5.

In the resist composition of the present embodiment, the component (F) may be used alone or in a combination of two or more kinds thereof.

In a case where the resist composition contains the component (F), the content of the component (F) is typically in a range of 0.5 to 10 parts by mass, with respect to 100 parts by mass of the component (A).

《Component (S): Organic Solvent Component》

The resist composition of the present embodiment may be produced by dissolving the resist materials in an organic solvent (hereinafter, referred to as a "component (S)").

The component (S) may be any organic solvent which can dissolve the respective components to be used to obtain a uniform solution, and an optional organic solvent can be appropriately selected from those which are conventionally known as solvents for a chemically amplified resist composition and then used.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (such as monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

In the resist composition of the present embodiment, the component (S) may be used alone or in the form of a mixed solvent of two or more kinds thereof.

Among these, PGMEA, PGME, γ-butyrolactone, EL and cyclohexanone are preferable.

Further, among the mixed solvents, a mixed solvent obtained by mixing PGMEA with a polar solvent is preferable. The mixing ratio (mass ratio) of the mixed solvent can be appropriately determined in consideration of the compatibility of the PGMEA with the polar solvent, but is preferably in a range of 1:9 to 9:1 and more preferably in a range of 2:8 to 8:2.

More specifically, in a case where EL or cyclohexanone is mixed as the polar solvent, the PGMEA:EL or cyclohexanone mass ratio is preferably in a range of 1:9 to 9:1 and more preferably in a range of 2:8 to 8:2. Alternatively, in a case where PGME is mixed as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mass ratio (former:latter) of such a mixed solvent is preferably in a range of 70:30 to 95:5.

The amount of the component (S) is not particularly limited, and is appropriately adjusted to a concentration which enables coating of a coating solution on a substrate. In general, the component (S) is used in an amount such that the solid content of the resist composition comes within a range of 1% to 20% by mass and preferably within a range of 2% to 15% by mass.

As desired, other miscible additives can also be added to the resist composition of the present invention. The resist composition may contain miscible additives such as additive resins, dissolution inhibitors, plasticizers, stabilizers, colorants, halation prevention agents, and dyes for improving the performance of the resist film, as appropriate.

The resist composition of the present embodiment has excellent lithography characteristics such as the sensitivity and CDU. The reason why such effects are obtained is not clear, but can be assumed as follows.

In the resist composition of the present embodiment, the component (A) contains a polymer compound (A1) having a constitutional unit (a0). The constitutional unit (a0) is formed such that the quaternary carbon atom $Ya^0$ is adjacent to the tertiary carbon atom (the carbon atom to which $Ra^{01}$ and $Ra^{02}$ are bonded) bonded to a carbonyloxy group (C(=O)—O—) in an acid dissociable group represented by Formula (a0-r1-1). Therefore, a carbocation generated at the time of dissociation of the acid dissociable group represented by Formula (a0-0-1) has excellent stability compared to the acid dissociable group in which the secondary carbon atom or the tertiary carbon atom is bonded to the position of the quaternary carbon atom $Ya^0$. Accordingly, it is assumed that the acid dissociation property of the constitutional unit (a0) is improved.

Further, in the resist composition of the present embodiment, the component (B) contains a component (B1) formed of a compound represented by Formula (b1). The component (B1) is formed such that a group (Rb1) at the terminal of an anion moiety contains a hydroxy group. Accordingly, it is assumed that the diffusion length of an acid becomes short in the component (B1) compared to an acid generator in which a group at the terminal of an anion moiety does not contain a hydroxy group.

It is assumed that the lithography characteristics such as the sensitivity and CDU become excellent because of the combined effects of the component (A) and the component (B).

(Method of Forming a Resist Pattern)

The method of forming a resist pattern according to the present embodiment includes a step of forming a resist film on a support using the resist composition of the embodiment; a step of exposing the resist film; and a step of developing the exposed resist film to form a resist pattern.

According to the embodiment of the method of forming a resist pattern, a method for forming a resist pattern by performing the processes described below is exemplified.

First, a resist composition of the according to the embodiment is applied to a support using a spinner or the like, and a bake treatment (post applied bake (PAB)) is conducted at a temperature of 80 to 150° C. for 40 to 120 seconds and preferably 60 to 90 seconds, to form a resist film.

Following selective exposure of the thus formed resist film, by exposure through a mask having a predetermined pattern formed thereon (mask pattern) using an exposure apparatus such as an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in a case of an alkali developing process, and a developing solution containing an organic solvent (organic developing solution) in a case of a solvent developing process. The method of forming a resist pattern of the present embodiment is particularly useful in a case of the solvent developing process.

After the developing treatment, it is preferable to conduct a rinse treatment. The rinse treatment is preferably conducted using pure water in a case of an alkali developing process, and a rinse solution containing an organic solvent in a case of a solvent developing process.

In a case of a solvent developing process, after the developing treatment or the rinsing, the developing solution or the rinse liquid remaining on the pattern can be removed by a treatment using a supercritical fluid.

After the developing treatment or the rinse treatment, drying is conducted. As desired, bake treatment (post bake) can be conducted following the developing.

In this manner, a resist pattern can be formed.

The support is not specifically limited and a conventionally known support can be used. For example, substrates for electronic components, and such substrates having wiring patterns formed thereon can be used. Specific examples of the material of the substrate include metals such as a silicon wafer, copper, chromium, iron and aluminum; and glass. Suitable materials for the wiring pattern include copper, aluminum, nickel, and gold.

Further, as the support, any one of the above-described supports provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is a method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered to enable a pattern to be formed with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film is formed (triple-layer resist method).

The wavelength to be used for exposure is not particularly limited and the exposure can be conducted using radiation such as an ArF excimer laser, a KrF excimer laser, an $F_2$ excimer laser, extreme ultraviolet rays (EUV), vacuum ultraviolet rays (VUV), electron beams (EB), X-rays, and soft X-rays. The resist composition of the present invention is useful for a KrF excimer laser, an ArF excimer laser, EB, and EUV and more useful for an ArF excimer laser, EB, and EUV.

The exposure of the resist film can be general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a refractive index larger than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-described requirements.

Examples of this immersion medium which exhibits a refractive index that is larger than the refractive index of air but smaller than the refractive index of the resist film include water, fluorine-based inert liquids, silicon-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, and the boiling point is preferably in a range of 70° C. to 180° C. and more preferably in a range of 80° C. to 160° C. A fluorine-based inert liquid having a boiling point in the above-described range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly preferable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point of 102° C.), and an example of a suitable perfluoroalkylamine compound is perfluorotributylamine (boiling point of 174° C.).

As the immersion medium, water is preferable in terms of cost, safety, environment and versatility.

As an example of the alkali developing solution used in an alkali developing process, a 0.1 to 10 mass % aqueous solution of tetramethylammonium hydroxide (TMAH) can be exemplified.

As the organic solvent contained in the organic developing solution used in a solvent developing process, any of the conventional organic solvents which are capable of dissolving the component (A) (prior to exposure) can be used. Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C (=O)—C in the structure thereof An ester solvent is an organic solvent containing C—C(=O)—O—C in the structure thereof An alcohol solvent is an organic solvent containing an alcoholic hydroxyl group in the structure thereof. An "alcoholic hydroxyl group" indicates a hydroxyl group bonded to a carbon atom of an aliphatic hydrocarbon group. A nitrile solvent is an organic solvent containing a nitrile group in the structure thereof. An amide solvent is an organic solvent containing an amide group in the structure thereof. An ether solvent is an organic solvent containing C—O—C in the structure thereof.

Some organic solvents have a plurality of the functional groups which characterize the above-described solvents in the structure thereof. In such a case, the organic solvent can be classified as any type of solvent having the characteristic functional group. For example, diethylene glycol monomethylether can be classified as an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents, and nitrile solvents are preferable.

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these examples, as a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3- methoxypropionate, ethyl-3-ethoxypropionate, and propyl-3-methoxypropionate. Among these examples, as an ester solvent, butyl acetate is preferable.

Examples of nitrile solvents include acetonitrile, propionitrile, valeronitrile, butyronitrile and the like.

As desired, the organic developing solution may have a conventional additive blended. Examples of the additive include surfactants. The surfactant is not particularly limited, and for example, an ionic or non-ionic fluorine and/or silicon surfactant can be used.

As the surfactant, a non-ionic surfactant is preferable, and a non-ionic fluorine surfactant or a non-ionic silicon surfactant is more preferable.

In a case where a surfactant is added, the amount thereof based on the total amount of the organic developing solution is generally 0.001% to 5% by mass, preferably 0.005% to 2% by mass, and more preferably 0.01% to 0.5% by mass.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in a case of a solvent developing process, any of the above-described organic solvents contained in the organic developing solution that does not easily dissolve the resist pattern can be used. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, at least one solvent selected from the group consisting of alcohol solvents and ester solvents is more preferable, and an alcohol solvent is particularly preferable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol and 2-hexanol are preferable, and 1-hexanol and 2-hexanol are more preferable.

As the organic solvent, one kind of solvent may be used alone, or two or more kinds of solvents may be used in combination. Further, an organic solvent other than the above-described examples or water may be mixed together. However, in consideration of the development characteristics, the amount of water in the rinse liquid based on the total amount of the rinse liquid is preferably 30% by mass or less, more preferably 10% by mass or less, still more preferably 5% by mass or less, and most preferably 3% by mass or less.

As desired, the rinse solution may have a conventional additive blended. Examples of the additive include surfactants. Examples of the additive include surfactants. As the surfactant, the same surfactants as those described above can be exemplified, a non-ionic surfactant is preferable, and a non-ionic fluorine surfactant or a non-ionic silicon surfactant is more preferable.

In a case where a surfactant is added, the amount thereof based on the total amount of the rinse liquid is generally 0.001% to 5% by mass, preferably 0.005% to 2% by mass, and more preferably 0.01% to 0.5% by mass.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

EXAMPLES

Hereinafter, the present invention will be described in detail based on the following examples, but the present invention is not limited to these examples.

Production Examples of Compound B1

Production Example 1

Production Example of Compound B1-1

Cholic acid (5.0 g, 12.3 mmol), a 43% acetonitrile solution of benzyltrimethylammonium 1,1,2-trifluoro-4-hydroxybutanesulfonate (compound represented by Formula (A); 9.6 g, 26.9 mmol), and dichloromethane (75 g) were mixed, and the solution was stirred at room temperature for 10 minutes in a nitrogen atmosphere. Thereafter, the solution was stirred in an ice bath (internal temperature of 5° C.) for 20 minutes. Further, WSC·HCl (3.1 g, 15.9 mmol) and DMAP (0.15 g, 1.2 mmol) were added to the solution, and the solution was stirred for 24 hours. Water (100 g) was added to the reaction solution, the solution was stirred at room temperature for 10 minutes, and liquid separation was carried out to recover an organic phase. The same washing operation was performed one more time.

Triphenylsulfonium bromide (compound represented by Formula (B); 4.8 g, 14.1 mmol) was added to the recovered organic layer, and the resultant was stirred for 10 minutes and washed with 1% $NH_3$ water (100 g). Next, the resultant was washed with 1% HCl water (100 g), and the washing operation was repeatedly performed three times using water (100 g). The recovered organic phase was concentrated, thereby obtaining a salt (10.2 g) of a compound (B1-1).

NMR measurement was performed on the obtained compound (B1-1), and the structure was identified based on the following results.

$^1$H-NMR (400 MHz, DMSO-d6):δ (ppm)=0.6 (s,3H), 0.8-2.5 (32H), 3.2 (m, 1H), 3.6 (brs, 1H), 3.8 (brs, 1H), 4.0 (brs, 1H), 4.1-4.2 (m brs m, 3H), 4.3 (brs, 1H), 4.9-5.1 (m, m, 1H), 7.8-7.9 (m, 15H)

$^{19}$F-NMR (376 MHz, DMSO-d6):δ (ppm)=−203, −122, −112

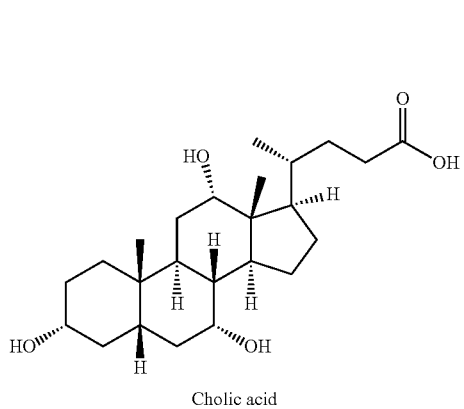

Cholic acid

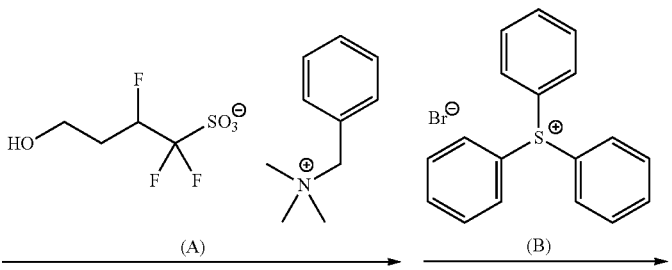

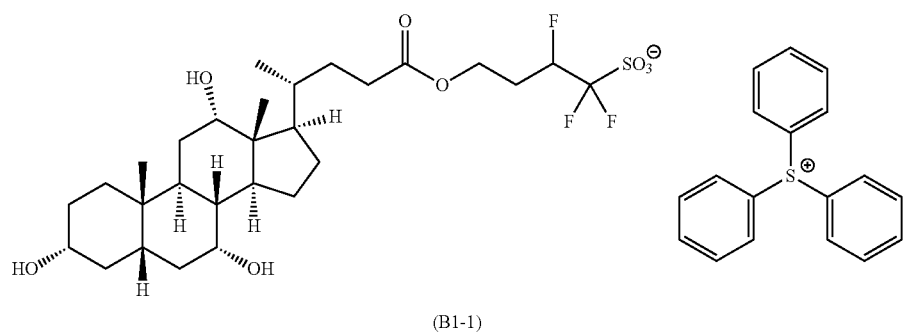

(B1-1)

Production Example 2

Production Example of Compound B1-2

Ursodeoxycholic acid (5.0 g, 12.7 mmol), a 43% acetonitrile solution of benzyltrimethylammonium 1,1,2-trifluoro-4-hydroxybutanesulfonate (compound represented by Formula (A); 10.0 g, 28.0 mmol), and dichloromethane (50 g) were mixed, and the solution was stirred at room temperature for 5 minutes in a nitrogen atmosphere. Thereafter, the solution was stirred in an ice bath (internal temperature of 5° C.) for 15 minutes. Further, WSC·HCl (3.7 g, 19.1 mmol) and DMAP (0.16 g, 1.3 mmol) were added to the solution, and the solution was stirred for 1 hour. Thereafter, the solution was stirred at room temperature for 16 hours. Water (100 g) was added to the reaction solution, the solution was stirred at room temperature for 10 minutes, and liquid separation was carried out to recover an organic phase. The same washing operation was performed using 1% $NH_3$ water (100 g), 1% HCl water (100 g), and water (100 g).

Triphenylsulfonium bromide (compound represented by Formula (B); 6.6 g, 19.1 mmol) was added to the recovered organic layer, and the resultant was stirred for 10 minutes and subjected to the washing operation 5 times using water (100 g). The recovered organic phase was concentrated, thereby obtaining a salt (8.1 g) of a compound (B1-2).

NMR measurement was performed on the obtained compound (B1-2), and the structure was identified based on the following results.

$^1$H-NMR (400 MHz, DMSO-d6):δ (ppm)=0.6 (s, 3H), 0.8-2.5 (34H), 3.3-3.4 (2H), 3.9 (d, 1H), 4.0-4.2 (m m, 2H), 4.4 (d, 1H), 4.9-5.1 (m, m, 1H), 7.8-7.9 (m, 15H)

$^{19}$F-NMR (376 MHz, DMSO-d6):δ (ppm)=−203, −122, −112

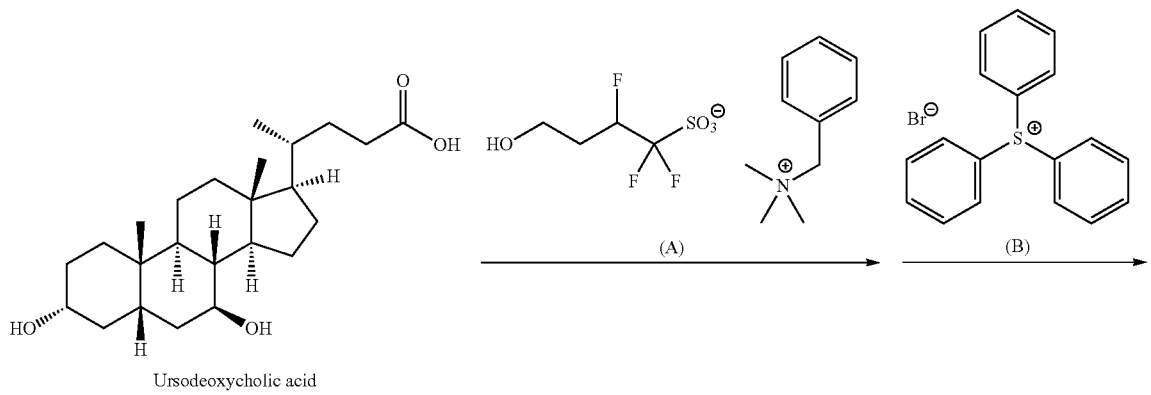

Ursodeoxycholic acid

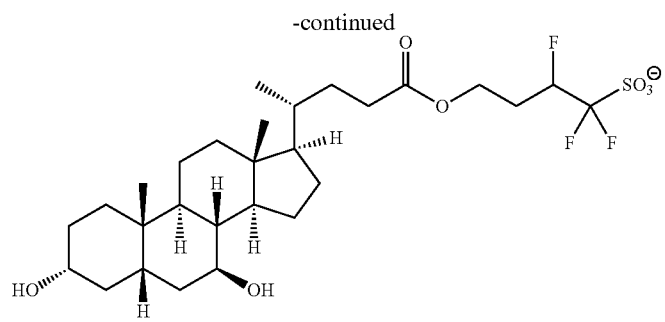

(B1-2)

Production Example 3

Production Example of Compound B1-3

Lithocholic acid (5.0 g, 13.3 mmol), a 43% acetonitrile solution of benzyltrimethylammonium 1,1,2-trifluoro-4-hydroxybutanesulfonate (compound represented by Formula (A); 10.4 g, 29.2 mmol), and dichloromethane (75 g) were mixed, and the solution was stirred at room temperature for 10 minutes in a nitrogen atmosphere. Thereafter, the solution was stirred in an ice bath (internal temperature of 5° C.) for 20 minutes. Further, WSC·HCl (3.3 g, 17.3 mmol) and DMAP (0.17 g, 1.3 mmol) were added to the solution, and the solution was stirred for 24 hours. Thereafter, the solution was stirred at room temperature for 60 hours. The reaction solution was filtered so that the insoluble matter was removed. Dichloromethane (100 g) and water (200 g) were added to the filtrate, the resulting solution was stirred at room temperature for 10 minutes, and liquid separation was carried out to recover an organic phase. The same washing operation was performed one more time.

Triphenylsulfonium bromide (compound represented by Formula (B); 6.03 g, 17.8 mmol) was added to the recovered organic layer, and the resultant was stirred for 10 minutes and washed with 1% $NH_3$ water (200 g). Next, the resultant was washed with 1% HCl water (200 g), and the washing operation was repeatedly performed three times using water (200 g). The recovered organic phase was concentrated, thereby obtaining a salt (9.9 g) of a compound (B-3).

NMR measurement was performed on the obtained compound (B1-3), and the structure was identified based on the following results.

$^1$H-NMR (400 MHz, DMSO-d6):δ (ppm)=0.6 (s, 3H), 0.8-2.5 (36H), 3.3-3.4 (m, 1H) 4.0-4.2 (m m, 2H), 4.4 (brs, 1H), 4.9-5.1 (m m, 1H), 7.8-7.9 (m, 15H)

$^{19}$F-NMR (376 MHz, DMSO-d6):δ (ppm)=−203, −122, −112

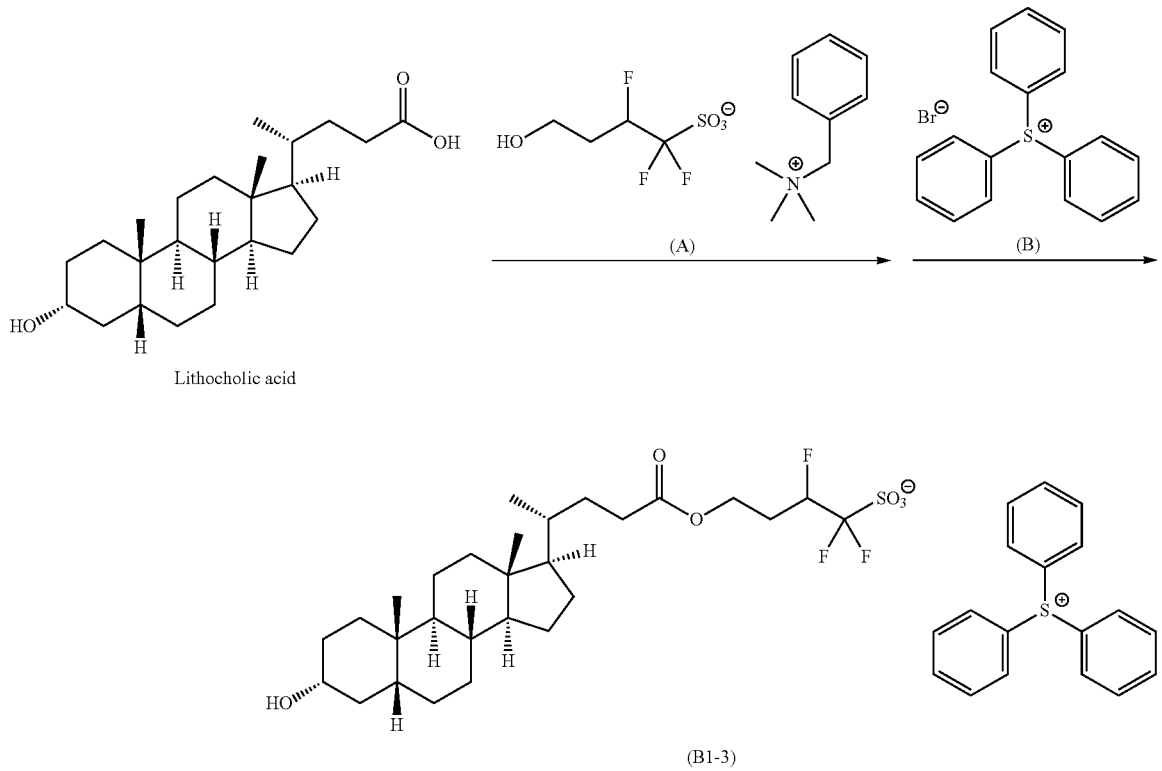

(B1-3)

Examples 1 to 3 and Comparative Example 1

<Synthesis of Polymer Compound>
A polymer compound (A)-1 represented by Formula (A)-1 was synthesized according to a known method. The weight average molecular weight (Mw) in terms of standard polystyrene acquired by performing GPC measurement was 8,900, and the molecular weight dispersity (Mw/Mn) was 1.53. The copolymerization compositional ratio (the ratio (molar ratio) of each constitutional unit in the structural formula) (l/m) acquired by $^{13}$C-NMR was 50:50.

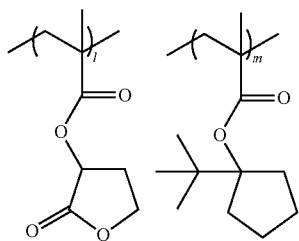

(A)-1

<Preparation of Resist Composition>
Respective components listed in Table 1 were mixed so as to be dissolved, thereby preparing resist compositions of each example.

TABLE 1

|  | Component (A) | Component (B) | Component (D) | | Component (F) | Component (S) |
|---|---|---|---|---|---|---|
| Example 1 | (A)-1 [100] | (B)-1 [10.4] | (D)-1 [5.6] | (D)-2 [3.4] | (F)-1 [3.0] | (S)-1 [3650] |
| Example 2 | (A)-1 [100] | (B)-2 [10.2] | (D)-1 [5.6] | (D)-2 [3.4] | (F)-1 [3.0] | (S)-1 [3650] |
| Example 3 | (A)-1 [100] | (B)-3 [10.0] | (D)-1 [5.6] | (D)-2 [3.4] | (F)-1 [3.0] | (S)-1 [3650] |
| Comparative Example 1 | (A)-1 [100] | (B)-4 [10.3] | (D)-1 [5.6] | (D)-2 [3.4] | (F)-1 [3.0] | (S)-1 [3650] |

The abbreviations in Table 1 have the following meanings. The numerical values in the parentheses are blending amounts (parts by mass).

(A)-1: polymer compound (A)-1 described above (B)-1: acid generator formed of compound (B1-1) described above (B)-2: acid generator formed of compound (B1-2) described above (B)-3: acid generator formed of compound (B1-3) described above (B)-4: acid generator formed of compound (B2-1) described above

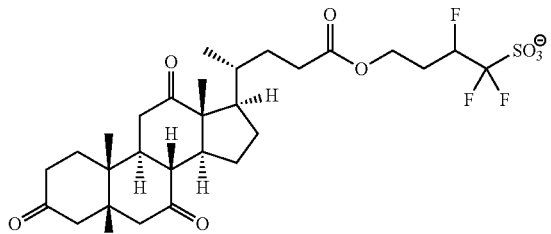

(B2-1)

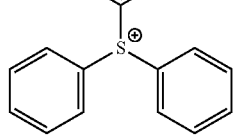

(D)-1: acid diffusion control agent formed of compound (D-1) described below
(D)-2: acid diffusion control agent formed of compound (D-2) described below
(F)-1: fluorine-containing polymer compound represented by Chemical Formula (F-1). The weight average molecular weight (Mw) in terms of standard polystyrene acquired by performing GPC measurement was 15,600, and the molecular weight dispersity (Mw/Mn) was 1.66. The copolymerization compositional ratio (the ratio (molar ratio) of each constitutional unit in the structural formula) (Um) acquired by $^{13}$C-NMR was 50:50.

(S)-1: mixed solution obtained by mixing propylene glycol monomethyl ether acetate, propylene glycol monomethyl ether, and cyclohexanone at mass ratio of 45:30:25

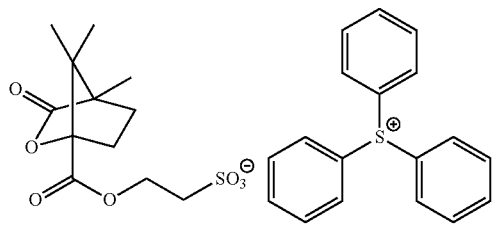

(D-1)

(D-2)

(F-1)

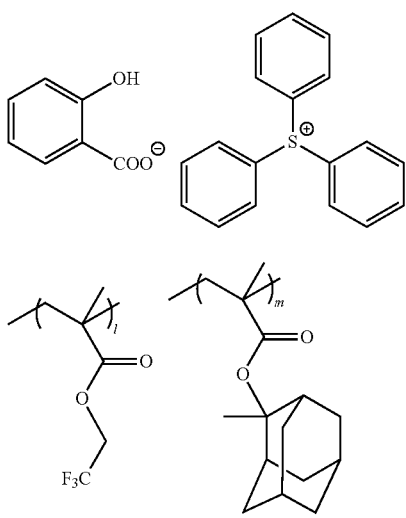

<Formation of Resist Pattern (Solvent Developing Process)>

A silicon substrate was coated with each resist composition of Examples 1 to 3 and Comparative Example 1 using a spinner, and a prebake (PAB) treatment was performed thereon on a hot plate at a temperature of 110° C. for 60 seconds so that the composition was dried to form a resist film having a film thickness of 85 nm.

Next, the resist film was selectively irradiated with an ArF excimer laser (193 nm) using an ArF liquid immersion exposure device NSR-S610C (manufactured by Nikon Corporation; NA 1.30, Crosspole, 0.98/0.78).

Thereafter, the resist film was subjected to a post exposure bake (PEB) treatment at 95° C. for 60 seconds.

Next, solvent development was performed using butyl acetate at 23° C. for 30 seconds, and then a rinse treatment was performed.

As the result, a contact hole pattern (hereinafter, referred to as a "CH pattern") having a hole diameter of 43 nm and a pitch of 90 nm (mask size of 63 nm) was formed.

[Evaluation of Optimum Exposure Amount (Eop)]

An optimum exposure amount Eop (mJ/cm$^2$) at which a target resist pattern was formed was acquired by forming the CH pattern described above. The results are listed in Table 2 in the columns of "Eop (mJ/cm$^2$)".

[Evaluation of In-Plane Uniformity of Pattern Dimension (CDU)]

The CH pattern was observed from above using a length measurement SEM (scanning electron microscope, acceleration voltage of 300 V, trade name: S-9380, manufactured by Hitachi High-Technologies Corporation), and hole diameters (nm) of 100 holes in the CH pattern were measured.

Three times (3σ) (unit: nm) the standard deviation (a) calculated from the measurement results was acquired. The results thereof are listed in Table 2 in the columns of "CDU (nm)".

TABLE 2

| | Eop (mJ/cm$^2$) | CDU (nm) |
|---|---|---|
| Example 1 | 43.3 | 4.9 |
| Example 2 | 41.9 | 4.9 |

TABLE 2-continued

| | Eop (mJ/cm$^2$) | CDU (nm) |
|---|---|---|
| Example 3 | 40.1 | 5.0 |
| Comparative Example 1 | 38.7 | 5.5 |

Based on the results listed in Table 2, it was confirmed that the resist compositions of Examples 1 to 3 to which the present invention had been applied had excellent lithography characteristics compared to the resist compositions of Comparative Example 1.

Examples 4 to 9 and Comparative Examples 2 to 8

<Synthesis of Polymer Compound>

Polymer compounds (A)-2 to (A)-14 represented by Formulae (A)-2 to (A)-14 were synthesized according to a known method. The weight average molecular weights (Mw) in terms of standard polystyrene acquired by performing GPC measurement, the molecular weight dispersities (Mw/Mn), and the copolymerization compositional ratio (the ratio (molar ratio) of each constitutional unit in the structural formula) acquired by $^{13}$C-NMR are listed in Table 3.

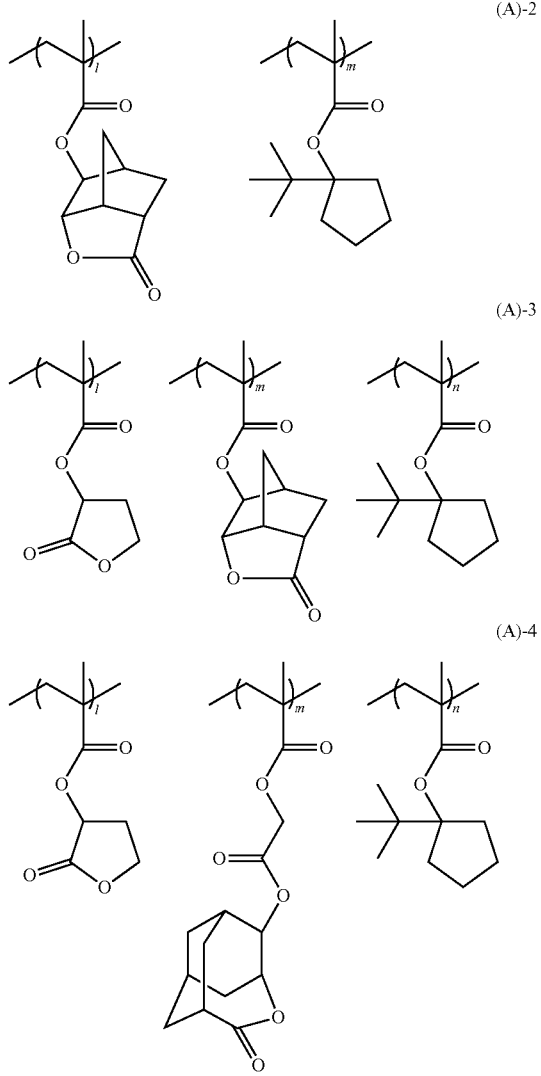

(A)-2

(A)-3

(A)-4

-continued

-continued (A)-12

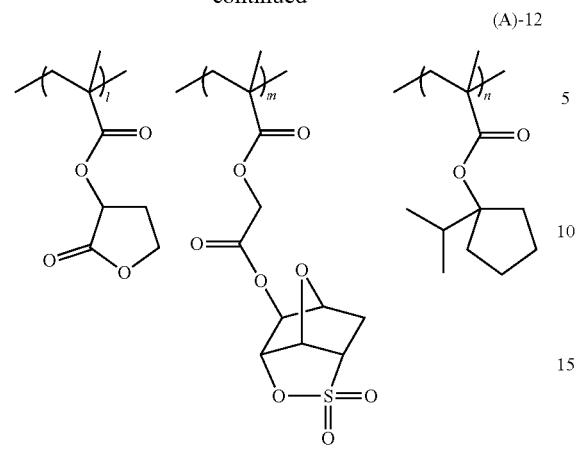
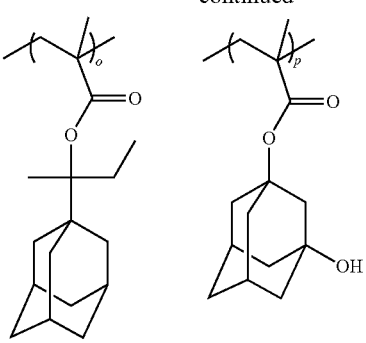

(A)-13

(A)-14

TABLE 3

| Polymer compound | Compositional ratio | Mw | Mw/Mn |
|---|---|---|---|
| (A)-2 | l/m = 50/50 | 8,700 | 1.69 |
| (A)-3 | l/m/n = 30/20/50 | 8,300 | 1.59 |
| (A)-4 | l/m/n = 30/20/50 | 8,200 | 1.62 |
| (A)-5 | l/m/n = 30/20/50 | 8,100 | 1.59 |
| (A)-6 | l/m/n/o/p = 20/20/20/30/10 | 8,400 | 1.65 |
| (A)-7 | l/m/n/o/p = 20/20/20/30/10 | 8,200 | 1.50 |
| (A)-8 | l/m = 50/50 | 9,100 | 1.85 |
| (A)-9 | l/m = 50/50 | 7,200 | 1.58 |
| (A)-10 | l/m/n = 30/20/50 | 8,700 | 1.63 |
| (A)-11 | l/m/n = 30/20/50 | 11,000 | 1.54 |
| (A)-12 | l/m/n = 30/20/50 | 8,500 | 1.77 |
| (A)-13 | l/m/n/o/p = 20/20/20/30/10 | 8,000 | 1.62 |
| (A)-14 | l/m/n/o/p = 20/20/20/30/10 | 9,400 | 1.56 |

<Preparation of Resist Composition>

Respective components listed in Tables 4 and 5 were mixed so as to be dissolved, thereby preparing resist compositions of each example.

TABLE 4

| | Component (A) | Component (B) | Component (D) | | Component (F) | Component (S) |
|---|---|---|---|---|---|---|
| Example 4 | (A)-2 [100] | (B)-1 [10.4] | (D)-1 [5.6] | (D)-2 [3.4] | (F)-1 [3.0] | (S)-1 [3650] |
| Example 5 | (A)-3 [100] | (B)-1 [10.4] | (D)-1 [5.6] | (D)-2 [3.4] | (F)-1 [3.0] | (S)-1 [3650] |

TABLE 4-continued

|  | Component (A) | Component (B) | Component (D) | | Component (F) | Component (S) |
|---|---|---|---|---|---|---|
| Example 6 | (A)-4 [100] | (B)-1 [10.4] | (D)-1 [5.6] | (D)-2 [314] | (F)-1 [3.0] | (S)-1 [3650] |
| Example 7 | (A)-5 [100] | (B)-1 [10.4] | (D)-1 [5.6] | (D)-2 [3.4] | (F)-1 [3.0] | (S)-1 [3650] |
| Example 8 | (A)-6 [100] | (B)-1 [10.4] | (D)-1 [5.6] | (D)-2 [3.4] | (F)-1 [3.0] | (S)-1 [3650] |
| Example 9 | (A)-7 [100] | (B)-1 [10.4] | (D)-1 [5.6] | (D)-2 [3.4] | (F)-1 [3.0] | (S)-1 [3650] |

TABLE 5

|  | Component (A) | Component (B) | Component (D) | | Component (F) | Component (S) |
|---|---|---|---|---|---|---|
| Comparative Example 2 | (A)-8 [100] | (B)-1 [10.4] | (D)-1 [5.6] | (D)-2 [3.4] | (F)-1 [3.0] | (S)-1 [3650] |
| Comparative Example 3 | (A)-9 [100] | (B)-1 [10.4] | (D)-1 [5.6] | (D)-2 [3.4] | (F)-1 [3.0] | (S)-1 [3650] |
| Comparative Example 4 | (A)-10 [100] | (B)-1 [10.4] | (D)-1 [5.6] | (D)-2 [3.4] | (F)-1 [3.0] | (S)-1 [3650] |
| Comparative Example 5 | (A)-11 [100] | (B)-1 [10.4] | (D)-1 [5.6] | (D)-2 [3.4] | (F)-1 [3.0] | (S)-1 [3650] |
| Comparative Example 6 | (A)-12 [100] | (B)-1 [10.4] | (D)-1 [5.6] | (D)-2 [3.4] | (F)-1 [3.0] | (S)-1 [3650] |
| Comparative Example 7 | (A)-13 [100] | (B)-1 [10.4] | (D)-1 [5.6] | (D)-2 [3.4] | (F)-1 [3.0] | (S)-1 [3650] |
| Comparative Example 8 | (A)-14 [100] | (B)-1 [10.4] | (D)-1 [5.6] | (D)-2 [3.4] | (F)-1 [3.0] | (S)-1 [3650] |

The abbreviations in Tables 4 and 5 have the following meanings. The numerical values in the parentheses are blending amounts (parts by mass).

(A)-2 to (A)-14: polymer compounds (A)-2 to (A)-14 described above (B)-1: acid generator formed of compound (B-1) described above (D)-1: acid diffusion control agent formed of compound (D-1) described below (D)-2: acid diffusion control agent formed of compound (D-2) described below (F)-1: fluorine-containing polymer compound represented by Chemical Formula (F-1)

(S)-1: mixed solution described above

<Formation of Resist Pattern>

A resin pattern was formed in the same manner as in Examples 1 to 3 and Comparative Example 1.

[Evaluation of Optimum Exposure Amount (Eop) and Evaluation of In-Plane Uniformity of Pattern Dimension (CDU)]

The optimum exposure amounts (Eop) and the in-plane uniformities (CDU) of the pattern dimensions were acquired in the same manner as in Examples 1 to 3 and Comparative Example 1. The results thereof are listed in Table 6 respectively in the columns of "Eop (mJ/cm$^2$)" and "CDU (nm)".

TABLE 6

|  | Eop (mJ/cm$^2$) | CDU (nm) |
|---|---|---|
| Example 4 | 44.1 | 4.7 |
| Example 5 | 39.7 | 4.7 |
| Example 6 | 38.3 | 5.0 |
| Example 7 | 38.4 | 5.1 |

TABLE 6-continued

|  | Eop (mJ/cm$^2$) | CDU (nm) |
|---|---|---|
| Example 8 | 44.9 | 5.6 |
| Example 9 | 49.4 | 5.5 |
| Comparative Example 2 | 53.9 | 5.9 |
| Comparative Example 3 | 52.6 | 5.7 |
| Comparative Example 4 | 52.6 | 5.7 |
| Comparative Example 5 | 62.0 | 6.8 |
| Comparative Example 6 | 60.6 | 6.6 |
| Comparative Example 7 | 55.2 | 6.0 |
| Comparative Example 8 | 56.6 | 6.2 |

Based on the results listed in Table 6, it was confirmed that the resist compositions of Examples 4 to 9 to which the present invention had been applied had excellent lithography characteristics such as the sensitivity and CDU compared to the resist compositions of Comparative Examples 2 to 8.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates an acid upon exposure and whose solubility in a developing solution is changed due to an action of the acid, the resist composition comprising:
a base material component (A) whose solubility in a developing solution is changed due to the action of an acid; and
an acid generator component (B) which generates an acid upon exposure,
wherein the base material component (A) contains a polymer compound (A1) having a constitutional unit (a0) represented by Formula (a0-1), and
wherein the acid generator component (B) contains a compound (B1) represented by Formula (b 1):

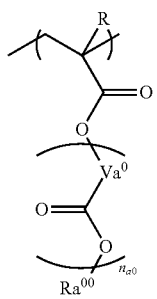   (a0-1)

wherein, R represents a hydrogen atom, an alkyl group having 1 to 5 carbon atoms, or a halogenated alkyl group having 1 to 5 carbon atoms; $Va^0$ represents a divalent hydrocarbon group which may have a substituent; $n_{a0}$ represents an integer of 0 to 2; and $Ra^{00}$ represents an acid dissociable group represented by Formula (a0-r1-1):

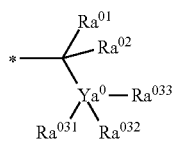   (a0-r1-1)

wherein $Ra^{01}$ and $Ra^{02}$ each independently represent a hydrocarbon group which may have a substituent; $Ra^{01}$ and $Ra^{02}$ may be bonded to each other to form a ring structure; $Ya^0$, represents a quaternary carbon atom; and $Ra^{031}$, $Ra^{032}$, and $Ra^{033}$ each independently represent a hydrocarbon group which may have a substituent, and two or more of $Ra^{031}$, $Ra^{032}$, and $Ra^{033}$ may be bonded to one another to form a ring structure,

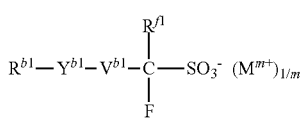   (b1)

wherein $R^{f1}$ represents a monovalent hydrocarbon group represented by any one of Formula ($R^{b1}$-1) to ($R^{b1}$-3); $Y^{b1}$ represents a divalent linking group having a hetero atom or a single bond; $V^{b1}$ represents an alkylene group, a fluorinated alkylene group, or a single bond; $R^{f1}$ represents a hydrogen atom, a fluorine atom, or a fluorinated alkyl group having 1 to 5 carbon atoms, m represents an integer of 1 or greater, and $M^{m+}$ represents an m-valent organic cation,

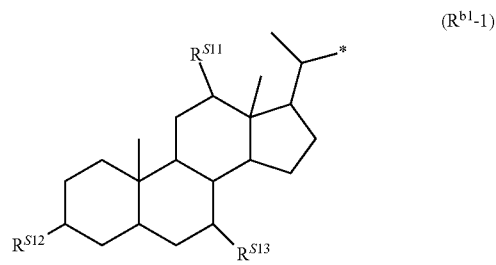

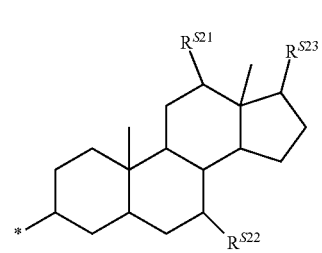

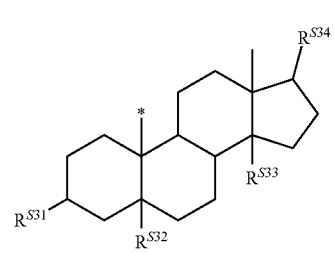

wherein in Formula ($R^{b1}$-1), $R^{S11}$, $R^{S12}$, and $R^{S13}$ each independently represent a hydrogen atom, a hydroxyl group, or a substituent having a hetero atom other than a hydroxyl group, provided that at least one of $R^{S11}$, $R^{S12}$, and $R^{S13}$ represents a hydroxyl group;

in Formula ($R^{b1}$-2), $R^{S21}$ and $R^{S22}$ each independently represent a hydrogen atom, a hydroxyl group, or a substituent having a hetero atom other than a hydroxyl group, provided that at least one of $R^{S21}$ and $R^{S22}$ represents a hydroxyl group; $R^{S23}$ represents an alkyl group which may have a hetero atom;

in Formula ($R^{b1}$-3), $R^{S31}$, $R^{S32}$, and $R^{S33}$ each represent a hydrogen atom, a hydroxyl group, or a substituent having a hetero atom other than a hydroxyl group, provided that at least one of $R^{S31}$, $R^{S32}$, and $R^{S33}$ represents a hydroxyl group; $R^{S34}$ represents a lactone-containing cyclic group; and in Formulae, the symbol "*" represents a bonding site to be bonded to $Y^{b1}$ in Formula (b1).

2. The resist composition according to claim 1, wherein a polymer compound (A1) has a constitutional unit (a2) containing a lactone-containing cyclic group, a —SO₂— containing cyclic group, or a carbonate-containing cyclic group.

3. The resist composition according to claim 1, wherein $Ra^{00}$ in Formula (a0-1) represents an acid dissociable group represented by Formula (a0-r1-1-1) or (a0-r1-1-2):

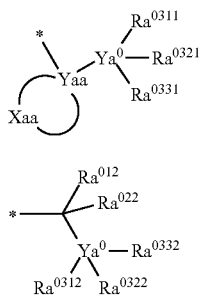

(a0-r1-1-1)

(a0-r1-1-2)

wherein in Formula (a0-r1-1-1), Yaa represents a carbon atom; Xaa represents a group that forms an aliphatic cyclic group together with Yaa; $Ya^0$ represents a quaternary carbon atom; and $Ra^{0311}$, $Ra^{0321}$, and $Ra^{0331}$ each independently represent a chain-like alkyl group having 1 to 5 carbon atoms; and in Formula (a0-r1-1-2), $Ra^{012}$ and $Ra^{022}$ each independently represent a chain-like alkyl group having 1 to 5 carbon atoms; $Ra^{0312}$, $Ra^{0322}$, and $Ra^{0332}$ each independently represent a hydrocarbon group which may have a substituent, and two or more of $Ra^{0312}$, $Ra^{0322}$, and $Ra^{0332}$ are bonded to each other to form a ring structure.

4. A method of forming a resist pattern, comprising:
forming a resist film on a support using the resist composition according to claim 1;
exposing the resist film; and
developing the exposed resist film to form a resist pattern.

* * * * *

UNITED STATES PATENT AND TRADEMARK OFFICE
CERTIFICATE OF CORRECTION

PATENT NO. : 11,067,888 B2
APPLICATION NO. : 16/225332
DATED : July 20, 2021
INVENTOR(S) : Takashi Nagamine, Emi Uchida and Tsuyoshi Nakamura It is certified that error appears in the above-identified patent and that said Letters Patent is hereby corrected as shown below:

In the Specification

In Column 1, Line 40, delete "X rays." and insert --X-rays.--.

In Column 3, Line 48 (Approx.), delete "na⁰" and insert --$n_{a0}$--.

In Column 5, Lines 33-37, delete ""Constitutional unit derived from.......hydroxystyrene derivative." and insert the same in Column 5, Line 34, as a new paragraph.

In Column 10, Line 54 (Approx.), delete "na⁰" and insert --$n_{a0}$--.

In Column 11, Line 51, delete "isobomane," and insert --isobornane,--.

In Column 13, Line 7, delete "norbomane," and insert --norbornane,--.

In Column 13, Line 17, delete "the" and insert --The--.

In Column 14, Line 51, delete "Rα" and insert --$R^{\alpha}$--.

In Column 70, Line 40, delete "(r-cr3-4)" and insert --(r-cr-3-4)--.

In Column 74, Line 6, delete "(=O)₂—O—," and insert --(=O)—O—,--.

In Column 77, Line 20, delete "1" and insert --l--.

In Column 77, Line 34, delete "norbomyl" and insert --norbornyl--.

In Column 77, Line 35, delete "1" and insert --l--.

In Column 77, Line 40, delete "norbomyl" and insert --norbornyl--.

Signed and Sealed this
Fourteenth Day of December, 2021

Drew Hirshfeld
*Performing the Functions and Duties of the*
*Under Secretary of Commerce for Intellectual Property and*
*Director of the United States Patent and Trademark Office*

In Column 79, Line 46, delete "R$^a$'" and insert --R$^\alpha$--.

In Column 91, Line 53, delete "Ya$^1$'" and insert --Ya$^{21}$--.

In Column 93, Line 14, delete "Vb1" and insert --V$^{b1}$--.

In Column 99, Line 33 (Approx.), delete "(Rb1-1). Vb11" and insert --(R$^{b1}$-1). V$^{b11}$--.

In Column 99, Line 47, delete "M$^{m+}$'" and insert --M$^{m+}$,--.

In Column 106, Line 2, delete "—SO2-containing" and insert -- —SO$_2$-containing--.

In Column 125, Lines 40-54 (Approx.), delete " 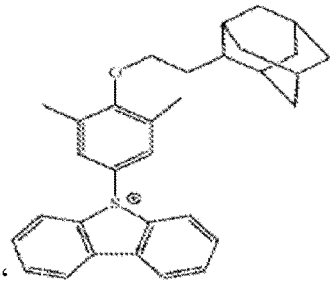 " and insert 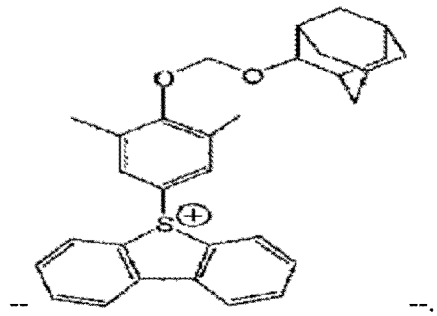 --.

In Column 133, Line 16, delete "dihphenyliodonium" and insert --diphenyliodonium--.

In Column 140, Line 3, delete "(y-al-8)" and insert --(y-al-8).--.

In Column 141, Line 21, delete "R$'^{105}$'" and insert --R$^{105}$--.

In Column 141, Line 23, delete "R$'^{104}$'" and insert --R$^{104}$--.

In Column 141, Line 31, delete "R$'^{104}$ and R$'^{105}$'" and insert --R$^{104}$ and R$^{105}$--.

In Column 141, Line 33, delete "R$'^{104}$'" and insert --R$^{104}$--.

In Column 141, Line 61, after "greater," insert --M$'^{m+}$--.

In Column 143, Lines 1-4, delete "Formula (d1-2).......are preferable." and
insert and insert the same in Column 142, Line 67, as a continuation of the same paragraph.

CERTIFICATE OF CORRECTION (continued)
U.S. Pat. No. 11,067,888 B2

In Column 148, Lines 12-13 (Approx.), delete "norbomane, isobomane," and insert --norbornane, isobornane,--.

In Column 154, Line 24 (Approx.), delete "$R^{fl1}$ and $R^{fl2}$" and insert --$Rf^{11}$ and $Rf^{12}$--.

In Column 154, Line 26 (Approx.), delete "$R^{fl3}$" and insert --$Rf^{13}$--.

In Column 154, Line 28 (Approx.), delete "$R^{fl4}$" and insert --$Rf^{14}$--.

In Column 154, Line 35 (Approx.), delete "$RF^{103}$" and insert --$Rf^{103}$--.

In Column 154, Line 43, delete "$RF^{103}$" and insert --$Rf^{103}$--.

In Column 155, Line 10, delete "a-position" and insert --α-position--.

In Column 155, Line 29, delete "$Rf^{12}$." and insert --$Rf^{12}$"--.

In Column 156, Line 30, delete "y" and insert --γ--.

In Column 157, Line 40, delete "(a0-0-1)" and insert --(a0-r1-1)--.

In Column 157, Line 49, delete "(Rb1)" and insert --($R^{b1}$)--.

In Column 160, Line 2, delete "thereof Δn" and insert --thereof. An--.

In Column 160, Line 4, delete "thereof Δn" and insert --thereof. An--.

In Column 160, Line 66, delete "methyl 2" and insert --methyl-2--.

In Column 160, Line 66, delete "ethyl 2" and insert --ethyl-2--.

In Column 162, Line 61 (Approx.), delete "(s,3H)," and insert --(s, 3H),--.

In Column 162, Line 63 (Approx.), delete "(m brs," and insert --(m, brs,--.

In Column 164, Line 46 (Approx.), delete "(m" and insert --(m,--.

In Column 166, Line 31 (Approx.), delete "(m" and insert --(m,--.

In Column 166, Line 32 (Approx.), delete "(m" and insert --(m,--.

In Column 168, Line 51 (Approx.), delete "(Um)" and insert --(l/m)--.

In Column 169, Line 56 (Approx.), delete "(a)" and insert --(σ)--.

In Column 174, Line 25, table 3, delete "l|/m/n" and insert --l/m/n--.

In the Claims

In Column 177, Claim 1, Line 15, delete "(b 1):" and insert --(b1):--.

In Column 177, Claim 1, Line 51, delete "$Ya^0$," and insert --$Ya^0$--.

In Column 178, Claim 1, Line 54, after "each" insert --independently--.